(12) United States Patent
Sasada et al.

(10) Patent No.: US 11,424,410 B2
(45) Date of Patent: Aug. 23, 2022

(54) LIGHT EMITTING DEVICE

(71) Applicant: Sumitomo Chemical Company, Limited, Tokyo (JP)

(72) Inventors: Toshiaki Sasada, Tsukuba (JP); Ryuji Matsumoto, Tsukuba (JP); Tomoyasu Yoshida, Tokyo (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 520 days.

(21) Appl. No.: 16/333,782

(22) PCT Filed: Sep. 27, 2017

(86) PCT No.: PCT/JP2017/034964
§ 371 (c)(1),
(2) Date: Mar. 15, 2019

(87) PCT Pub. No.: WO2018/062276
PCT Pub. Date: Apr. 5, 2018

(65) Prior Publication Data
US 2019/0259952 A1 Aug. 22, 2019

(30) Foreign Application Priority Data
Sep. 29, 2016 (JP) .............................. JP2016-190837

(51) Int. Cl.
*H01L 51/00* (2006.01)
*C08G 61/12* (2006.01)
*C09K 11/06* (2006.01)
*H01L 51/50* (2006.01)

(52) U.S. Cl.
CPC .......... *H01L 51/0039* (2013.01); *C08G 61/12* (2013.01); *C08G 61/122* (2013.01); *C09K 11/06* (2013.01); *H01L 51/006* (2013.01); *H01L 51/007* (2013.01); *H01L 51/0043* (2013.01); *H01L 51/0061* (2013.01); *H01L 51/0067* (2013.01); *H01L 51/0071* (2013.01); *H01L 51/0072* (2013.01); *H01L 51/0073* (2013.01); *H01L 51/0074* (2013.01); *H01L 51/50* (2013.01); *C08G 2261/124* (2013.01); *C08G 2261/148* (2013.01); *C08G 2261/149* (2013.01); *C08G 2261/1412* (2013.01); *C08G 2261/1414* (2013.01); *C08G 2261/18* (2013.01); *C08G 2261/228* (2013.01); *C08G 2261/3142* (2013.01); *C08G 2261/3162* (2013.01); *C08G 2261/3221* (2013.01); *C08G 2261/512* (2013.01); *C08G 2261/95* (2013.01); *C09K 2211/1018* (2013.01); *H01L 51/0058* (2013.01); *H01L 51/5012* (2013.01); *H01L 51/5016* (2013.01); *H01L 51/5056* (2013.01); *H01L 51/5072* (2013.01); *H01L 51/5088* (2013.01); *H01L 51/5092* (2013.01)

(58) Field of Classification Search
CPC .......... C08G 61/122; C08G 2261/1412; C08G 2261/148; C08G 2261/124; C08G 2261/18; C08G 2261/228; C08G 2261/312; C08G 2261/3142; C08G 2261/3221; C08G 2261/512; C08G 2261/3162; C08G 2261/76; C08G 2261/95; H01L 51/0043; H01L 51/0039; H01L 51/5012; H01L 51/5056; G01N 24/087; C08L 79/02
See application file for complete search history.

(56) References Cited

U.S. PATENT DOCUMENTS

| | | | |
|---|---|---|---|
| 2011/0108814 A1* | 5/2011 | Iida | C08G 73/02 257/40 |
| 2012/0199825 A1 | 8/2012 | Soga et al. | |
| 2012/0241732 A1 | 9/2012 | Endo et al. | |
| 2016/0056393 A1 | 2/2016 | Oikawa et al. | |
| 2016/0181535 A1 | 6/2016 | Tsuji et al. | |
| 2017/0084844 A1 | 3/2017 | Parham et al. | |
| 2017/0250353 A1 | 8/2017 | Koenen et al. | |
| 2018/0269406 A1 | 9/2018 | Stoessel et al. | |

FOREIGN PATENT DOCUMENTS

| | | | | |
|---|---|---|---|---|
| EP | 2858135 A1 | 4/2015 | | |
| EP | 3115395 A1 | 1/2017 | | |
| EP | 3297978 A1 | 3/2018 | | |
| EP | 3428989 A1 | 1/2019 | | |
| JP | 2009196982 | * | 1/2008 | ............ C07C 211/54 |
| JP | 2009212510 | * | 2/2008 | ............ H01L 51/50 |
| JP | 2014001399 | * | 1/2014 | ............ C09B 69/109 |
| JP | 5560592 B2 | 7/2014 | | |
| JP | 2016092280 A | 5/2016 | | |
| JP | 2016119340 A | 6/2016 | | |
| WO | 2011070963 A1 | 6/2011 | | |
| WO | 2014126076 A1 | 8/2014 | | |
| WO | 2014163083 A1 | 10/2014 | | |

(Continued)

OTHER PUBLICATIONS

Lee et al. J. Mater. Chem. C, 2014, 2, 1472.*

(Continued)

*Primary Examiner* — Shane Fang
(74) *Attorney, Agent, or Firm* — Panitch Schwarze Belisario & Nadel LLP

(57) ABSTRACT

A light emitting device having an anode, a cathode, a first organic layer and a second organic layer disposed between the anode and the cathode is provided. The first organic layer is a layer containing a light emitting material represented by the formula (T) and the second organic layer is a layer containing a crosslinked body of a polymer compound containing a crosslink constitutional unit wherein the variable groups are as defined in the specification:

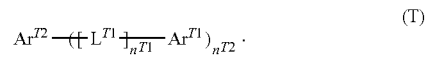

9 Claims, No Drawings

(56) References Cited

FOREIGN PATENT DOCUMENTS

| WO | 2015135625 A1 | 9/2015 |
| WO | 2016015815 A1 | 2/2016 |
| WO | 2016091351 A1 | 6/2016 |
| WO | 2014154883 A1 | 9/2017 |
| WO | 2017154882 A1 | 9/2017 |
| WO | 2017154884 A1 | 9/2017 |

OTHER PUBLICATIONS

Office Action dated Jan. 14, 2021 in JP Application No. 2018542646.
Office Action dated Mar. 29, 2021 in KR Application No. 1020197011472.
Office Action dated Jul. 13, 2021 in JP Application No. 2018542646.
International Search Report dated Dec. 26, 2017 in International Application No. PCT/JP2017/034964.
Written Opinion dated Dec. 26, 2017 in International Application No. PCT/JP2017/034964.
Extended European Search Report dated Apr. 3, 2020 in EP Application No. 17856225,2.

\* cited by examiner

LIGHT EMITTING DEVICE

CROSS-REFERENCE TO RELATED APPLICATION

This application is a Section 371 of International Application No. PCT/JP2017/034964, filed Sep. 27, 2017, which was published in the Japanese language on Apr. 5, 2018, under International Publication No. WO 2018/062276 A1, which claims priority under 35 U.S.C. § 119(b) to Japanese Application No. 2016-190837, filed Sep. 29, 2016, the disclosures of which are incorporated herein by reference in their entirety.

TECHNICAL FIELD

The present invention relates to a light emitting device.

BACKGROUND ART

Organic electroluminescent devices (hereinafter, referred to also as light emitting device) can be used suitably for applications of display and illumination, and have been researched and developed. For example, Patent Document 1 describes a light emitting device having an organic layer containing a polymer compound (HT-1) represented by the following formula and a light emitting layer containing a light emitting material having a triazine skeleton and a carbazole skeleton. The polymer compound (HT-1) represented by the following formula is a polymer compound not containing a crosslink constitutional unit.

[Chemical Formula 1]

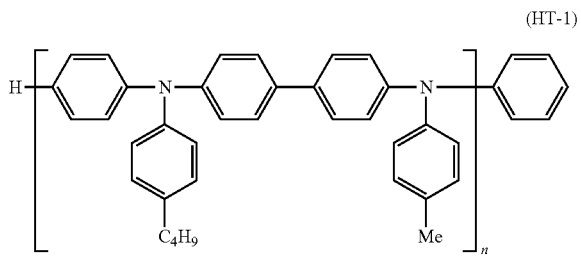

(HT-1)

PRIOR ART DOCUMENT

Patent Document

Patent Document 1: International Publication WO2014/163083

SUMMARY OF THE INVENTION

Problem to be Solved by the Invention

However, the above-described light emitting device has a problem of high driving voltage.

Then, the present invention has an object of providing a light emitting device showing low driving voltage.

Means for Solving the Problem

The present invention provides the following [1] to [11].
[1] A light emitting device having an anode, a cathode, a first organic layer disposed between the anode and the cathode and a second organic layer disposed between the anode and the cathode, wherein,
the above-described first organic layer is a layer containing a light emitting material represented by the formula (T), and
the above-described second organic layer is a layer containing a crosslinked body of a polymer compound containing a crosslink constitutional unit:

[Chemical Formula 2]

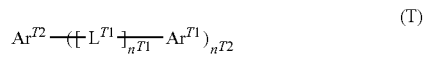

(T)

[wherein,
$n^{T1}$ represents an integer of 0 or more and 5 or less. When a plurality of $n^{T1}$ are present, they may be the same or different.
$n^{T2}$ represents an integer of 1 or more and 10 or less.
$Ar^{T1}$ is a single-ring or condensed-ring monovalent hetero ring group containing a nitrogen atom having no double bond as a ring constituent atom and not containing a nitrogen atom having a double bond as a ring constituent atom, and the group optionally has a substituent. When a plurality of such substituents are present, they may be combined together to form a ring together with atoms to which they are attached. When a plurality of $Ar^{T1}$ are present, they may be the same or different.
$L^{T1}$ represents an alkylene group, a cycloalkylene group, an arylene group, a divalent hetero ring group, a group represented by $—N(R^{T1'})—$, an oxygen atom or a sulfur atom, and these groups optionally have a substituent. $R^{T1'}$ represents a hydrogen atom, an alkyl group, a cycloalkyl group, an aryl group or a monovalent hetero ring group, and these groups optionally have a substituent. When a plurality of $L^{T1}$ are present, they may be the same or different.
$Ar^{T2}$ is a single-ring or condensed-ring hetero ring group containing a nitrogen atom having a double bond as a ring constituent atom, and the group optionally has a substituent. When a plurality of such substituents are present, they may be combined together to form a ring together with atoms to which they are attached.].
[2] The light emitting device according to [1], wherein the above-described crosslink constitutional unit is a constitutional unit having at least one crosslink group selected from Group A of crosslink group:
(Group a of Crosslink Group)

[Chemical Formula 3]

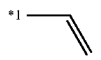

(XL-1)

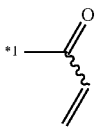

(XL-2)

(XL-3)

-continued

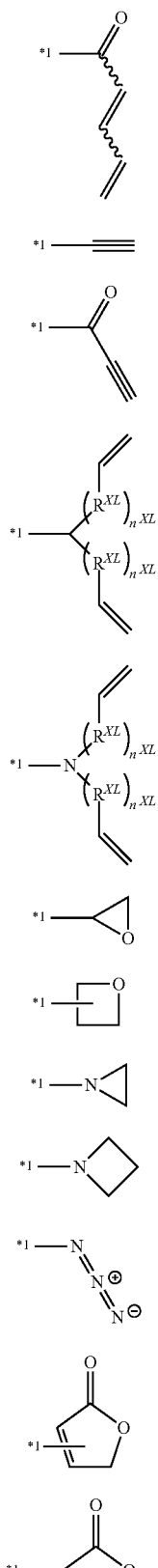

(XL-4)
(XL-5)
(XL-6)
(XL-7)
(XL-8)
(XL-9)
(XL-10)
(XL-11)
(XL-12)
(XL-13)
(XL-14)
(XL-15)

-continued

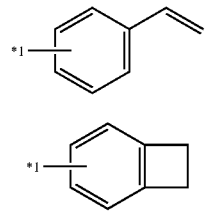

(XL-16)

(XL-17)

[wherein, $R^{XL}$ represents a methylene group, an oxygen atom or a sulfur atom, $n^{XL}$ represents an integer of 0 to 5. When a plurality of $R^{XL}$ are present, they may be the same or different and when a plurality of $n^{XL}$ are present, they may be the same or different. *1 represents a binding position. These crosslink groups optionally have a substituent.].

[3] The light emitting device according to [2], wherein the above-described crosslink constitutional unit is a constitutional unit represented by the formula (2) or a constitutional unit represented by the formula (2'):

[Chemical Formula 4]

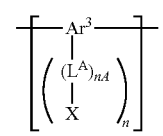

(2)

[wherein, nA represents an integer of 0 to 5, and n represents 1 or 2. When a plurality of nA are present, they may be the same or different.

$Ar^3$ represents an aromatic hydrocarbon group or a hetero ring group, and these groups optionally have a substituent.

$L^A$ represents an alkylene group, a cycloalkylene group, an arylene group, a divalent hetero ring group, a group represented by —N(R')—, an oxygen atom or a sulfur atom, and these groups optionally have a substituent. R' represents a hydrogen atom, an alkyl group, a cycloalkyl group, an aryl group or a monovalent hetero ring group, and these groups optionally have a substituent. When a plurality of $L^A$ are present, they may be the same or different.

X represents a crosslink group selected from the above-described Group A of crosslink group. When a plurality of X are present, they may be the same or different.]

[Chemical Formula 5]

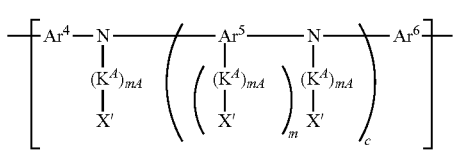

(2')

[wherein, mA represents an integer of 0 to 5, m represents an integer of 1 to 4, and c represents an integer of 0 or 1. When a plurality of mA are present, they may be the same or different.

$Ar^5$ represents an aromatic hydrocarbon group, a hetero ring group or a group in which at least one aromatic hydrocarbon ring and at least one hetero ring are bonded directly, and these groups optionally have a substituent.

$Ar^4$ and $Ar^6$ each independently represent an arylene group or a divalent hetero ring group, and these groups optionally have a substituent.

$Ar^4$, $Ar^5$ and $Ar^6$ each may be bonded directly or bonded via an oxygen atom or a sulfur atom to a group other than this group, bonded to a nitrogen atom to which the group is attached, to form a ring.

$K^A$ represents an alkylene group, a cycloalkylene group, an arylene group, a divalent hetero ring group, a group represented by —N(R')—, an oxygen atom or a sulfur atom, and these groups optionally have a substituent. R' represents a hydrogen atom, an alkyl group, a cycloalkyl group, an aryl group or a monovalent hetero ring group, and these groups optionally have a substituent. When a plurality of $K^A$ are present, they may be the same or different.

X' represents a crosslink group selected from the above-described Group A of crosslink group, a hydrogen atom, an alkyl group, a cycloalkyl group, an aryl group or a monovalent hetero ring group, and these groups optionally have a substituent. When a plurality of X' are present, they may be the same or different. However, at least one X' is a crosslink group selected from the above-described Group A of crosslink group.].

[4] The light emitting device according to any one of [1] to [3], wherein the above-described $Ar^{T1}$ is a group represented by the formula (T1-1):

[Chemical formula 6]

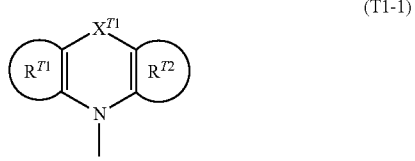

(T1-1)

[wherein, the ring $R^{T1}$ and the ring $R^{T2}$ each independently represent an aromatic hydrocarbon ring or a hetero ring not containing a nitrogen atom having a double bond as a ring constituent atom, and these rings optionally have a substituent. When a plurality of such substituents are present, they may be combined together to form a ring together with atoms to which they are attached.

$X^{T1}$ represents a single bond, an oxygen atom, a sulfur atom, a group represented by —N($R^{XT1}$)— or a group represented by —C($R^{XT1'}$)$_2$—. $R^{XT1}$ and $R^{XT1'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent. A plurality of $R^{XT1'}$ may be the same or different and may be combined together to form a ring together with carbon atoms to which they are attached.

$R^{XT1}$ and a substituent which the ring $R^{T1}$ optionally has, $R^{XT1}$ and a substituent which the ring $R^{T2}$ optionally has, $R^{XT1'}$ and a substituent which the ring $R^{T1}$ optionally has, and $R^{XT1'}$ and a substituent which the ring $R^{T2}$ optionally has each may be combined together to form a ring together with atoms to which they are attached.].

[5] The light emitting device according to [4], wherein the above-described group represented by the formula (T1-1) is a group represented by the formula (T1-1A), a group represented by the formula (T1-1B), a group represented by the formula (T1-1C) or a group represented by the formula (T1-1D):

[Chemical Formula 7]

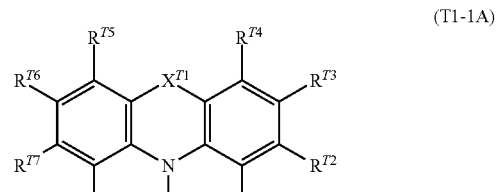

(T1-1A)

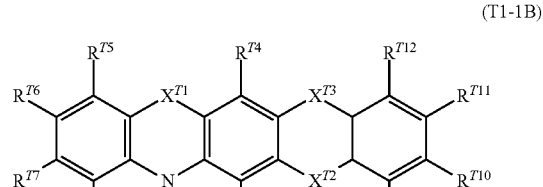

(T1-1B)

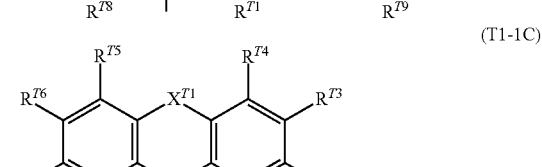

(T1-1C)

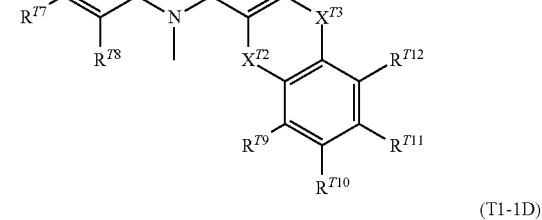

(T1-1D)

[wherein, $X^{T1}$ represents the same meaning as described above.

$X^{T2}$ and $X^{T3}$ each independently represent a single bond, an oxygen atom, a sulfur atom, a group represented by —N($R^{XT2}$)— or a group represented by —C($R^{XT2'}$)$_2$—. $R^{XT2}$ and $R^{XT2'}$ each independently represent a hydrogen atom, an alkyl group, a cycloalkyl group, an alkoxy group, a cycloalkoxy group, aryl group, an aryloxy group, a monovalent hetero ring group, a substituted amino group, a halogen atom or a cyano group, and these groups optionally have a substituent. A plurality of $R^{XT2'}$ may be the same or different and may be combined together to form a ring together with carbon atoms to which they are attached.

$R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent.

$R^{T1}$ and $R^{T2}$, $R^{T2}$ and $R^{T3}$, $R^{T3}$ and $R^{T4}$, $R^{T5}$ and $R^{T6}$, $R^{T6}$ and $R^{T7}$, $R^{T7}$ and $R^{T8}$, $R^{T9}$ and $R^{T10}$, $R^{T10}$ and $R^{T11}$, and $R^{T11}$ and $R^{T12}$ each may be combined together to form a ring together with carbon atoms to which they are attached.].

[6] The light emitting device according to any one of [1] to [5], wherein the above-described $Ar^{T2}$ is a group obtained by removing from a diazole ring, a triazole ring, an oxadiazole ring, a thiadiazole ring, a thiazole ring, an oxazole ring, an isothiazole ring, an isooxazole ring, a benzodiazole ring, a benzotriazole ring, a benzooxadiazole ring, a benzothiadiazole ring, a benzothiazole ring, a benzooxazole ring, an azacarbazole ring, a diazacarbazole ring, a pyridine ring, a diazabenzene ring, a triazine ring, an azanaphthalene ring, a diazanaphthalene ring, a triazanaphthalene ring, a tetraazanaphthalene ring, an azaanthracene ring, a diazaanthracene ring, a triazaanthracene ring, a tetraazaanthracene ring, an azaphenanthrene ring, a diazaphenanthrene ring, a triazaphenanthrene ring or a tetraazaphenanthrene ring at least one hydrogen atom bonding directly to a carbon atom or a hetero atom constituting the ring (the group optionally has a substituent).

[7] The light emitting device according to any one of [1] to [6], wherein the absolute value of the difference between the energy level at the lowest triplet excited state and the energy level at the lowest singlet excited state in the above-described light emitting material represented by the formula (T) is 0.20 eV or less.

[8] The light emitting device according to any one of [1] to [7], wherein the above-described first organic layer is a layer not containing a phosphorescent metal complex.

[9] The light emitting device according to any one of [1] to [8], wherein the above-described first organic layer further contains at least one selected from the group consisting of a host material, a hole transporting material, a hole injection material, an electron transporting material, an electron injection material, a light emitting material and an antioxidant.

[10] The light emitting device according to any one of [1] to [9], wherein the above-described first organic layer and the above-described second organic layer are adjacent.

[11] The light emitting device according to any one of [1] to [10], wherein the above-described second organic layer is a layer disposed between the above-described anode and the above-described first organic layer.

EFFECT OF THE INVENTION

According to the present invention, it is possible to provide a light emitting device showing low driving voltage.

MODES FOR CARRYING OUT THE INVENTION

Suitable embodiments of the present invention will be illustrated in detail below.

Explanation of Common Terms

Terms commonly used in the present specification have the following meanings unless otherwise stated.

Me represents a methyl group, Et represents an ethyl group, Bu represents a butyl group, i-Pr represents an isopropyl group and t-Bu represents a tert-butyl group.

A hydrogen atom may be a heavy hydrogen atom or a light hydrogen atom.

In the formula representing a metal complex, the solid line representing a bond with the central metal means a covalent bond or a coordination bond.

"Polymer compound" means a polymer having molecular weight distribution and having a polystyrene-equivalent number-average molecular weight of $1 \times 10^3$ to $1 \times 10^8$.

The polymer compound may be any of a block copolymer, a random copolymer, an alternating copolymer and a graft copolymer, and may also be another form.

The end group of the polymer compound is preferably a stable group since if a polymerization active group remains intact there, there is a possibility of a decrease in a light emitting property or luminance life when the polymer compound is used for fabrication of a light emitting device. The end group of the polymer compound is preferably a group conjugatively bonded to the main chain and includes, for example, an aryl group bonding to the main chain of the polymer compound via a carbon-carbon bond or a group bonded to a monovalent hetero ring group.

"Low molecular compound" means a compound having no molecular weight distribution and having a molecular weight of $1 \times 10^4$ or less.

"Constitutional unit" means a unit occurring once or more times in the polymer compound.

"Alkyl group" may be any of linear and branched. The number of carbon atoms of the linear alkyl group is, not including the number of carbon atoms of the substituent, usually 1 to 50, preferably 3 to 30, more preferably 4 to 20. The number of carbon atoms of the branched alkyl group is, not including the number of carbon atoms of the substituent, usually 3 to 50, preferably 3 to 30, more preferably 4 to 20.

The alkyl group optionally has a substituent and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom and the like (for example, a trifluoromethyl group, a pentafluoroethyl group, a perfluorobutyl group, a perfluorohexyl group, a perfluorooctyl group, a 3-phenylpropyl group, a 3 (4-methylphenyl)propyl group, a 3 (3,5-di-hexylphenyl)propyl group, a 6-ethyloxyhexyl group).

The number of carbon atoms of "cycloalkyl group" is, not including the number of carbon atoms of the substituent, usually 3 to 50, preferably 3 to 30, more preferably 4 to 20.

The cycloalkyl group optionally has a substituent and examples thereof include a cyclohexyl group, a cyclohexylmethyl group and a cyclohexylethyl group.

"Aryl group" means an atomic group remaining after removing from an aromatic hydrocarbon one hydrogen atom bonding directly to a carbon atom constituting the ring. The number of carbon atoms of the aryl group is, not including the number of carbon atoms of the substituent, usually 6 to 60, preferably 6 to 20, more preferably 6 to 10.

The aryl group optionally has a substituent and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group, and groups obtained by substituting a hydrogen atom in these groups with an alkyl group, a cycloalkyl group, an alkoxy group, a cycloalkoxy group, an aryl group, a fluorine atom and the like.

"Alkoxy group" may be any of linear and branched. The number of carbon atoms of the linear alkoxy group is, not including the number of carbon atoms of the substituent, usually 1 to 40, preferably 4 to 10. The number of carbon atoms of the branched alkoxy group is, not including the number of carbon atoms of the substituent, usually 3 to 40, preferably 4 to 10.

The alkoxy group optionally has a substituent and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of the "cycloalkoxy group" is, not including the number of carbon atoms of the substituent, usually 3 to 40, preferably 4 to 10.

The cycloalkoxy group optionally has a substituent and examples thereof include a cyclohexyloxy group.

The number of carbon atoms of the "aryloxy group" is, not including the number of carbon atoms of the substituent, usually 6 to 60, preferably 6 to 48.

The aryloxy group optionally has a substituent and examples thereof include a phenoxy group, a 1-naphthyloxy group, a 2-naphthyloxy group, a 1-anthracenyloxy group, a 9-anthracenyloxy group and a 1-pyrenyloxy group, and groups obtained by substituting a hydrogen atom in these groups with an alkyl group, a cycloalkyl group, an alkoxy group, a cycloalkoxy group, a fluorine atom or the like.

"p-valent hetero ring group" (p represents an integer of 1 or more) means an atomic group remaining after removing from a heterocyclic compound p hydrogen atoms among hydrogen atoms bonding directly to carbon atoms or hetero atoms constituting the ring. Of the p-valent hetero ring groups, "p-valent aromatic hetero ring group" as an atomic group remaining after removing from an aromatic heterocyclic compound p hydrogen atoms among hydrogen atoms bonding directly to carbon atoms or hetero atoms constituting the ring is preferable.

"Aromatic heterocyclic compound" means a compound in which the hetero ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole and the like, and a compound in which an aromatic ring is condensed to the hetero ring even if the hetero ring itself shows no aromaticity such as phenoxazine, phenothiazine, dibenzoborole, dibenzosilole, benzopyran and the like.

The number of carbon atoms of the monovalent hetero ring group is, not including the number of carbon atoms of the substituent, usually 2 to 60, preferably 4 to 20.

The monovalent hetero ring group optionally has a substituent and examples thereof include a thienyl group, a pyrrolyl group, a furyl group, a pyridinyl group, a piperidinyl group, a quinolinyl group, an isoquinolinyl group, a pyrimidinyl group and a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferred. The substituent which the amino group has is preferably an alkyl group, a cycloalkyl group, an aryl group or a monovalent hetero ring group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"Alkenyl group" may be any of linear and branched. The number of carbon atoms of the linear alkenyl group is, not including the number of carbon atoms of the substituent, usually 2 to 30, preferably 3 to 20. The number of carbon atoms of the branched alkenyl group is, not including the number of carbon atoms of the substituent, usually 3 to 30, preferably 4 to 20.

The number of carbon atoms of the "cycloalkenyl group" is, not including the number of carbon atoms of the substituent, usually 3 to 30, preferably 4 to 20.

The alkenyl group and the cycloalkenyl group optionally have a substituent and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

"Alkynyl group" may be any of linear and branched. The number of carbon atoms of the alkynyl group is, not including the number of carbon atoms of the substituent, usually 2 to 20, preferably 3 to 20. The number of carbon atoms of the branched alkynyl group is, not including the number of carbon atoms of the substituent, usually 4 to 30, preferably 4 to 20.

The number of carbon atoms of the "cycloalkynyl group" is, not including the number of carbon atoms of the substituent, usually 4 to 30, preferably 4 to 20.

The alkynyl group and the cycloalkynyl group optionally have a substituent and examples thereof include an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

"Arylene group" means an atomic group remaining after removing from an aromatic hydrocarbon two hydrogen atoms bonding directly to carbon atoms constituting the ring. The number of carbon atoms of the arylene group is, not including the number of carbon atoms of the substituent, usually 6 to 60, preferably 6 to 30, more preferably 6 to 18.

The arylene group optionally has a substituent and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group and a chrysenediyl group, and these groups having a substituent, and groups represented by the formula (A-1) to the formula (A-20) are preferable. The arylene group includes groups obtained by bonding a plurality of these groups.

[Chemical Formula 8]
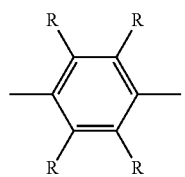 (A-1)
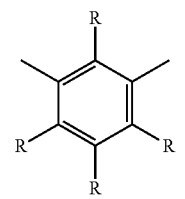 (A-2)
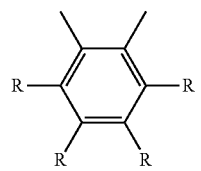 (A-3)
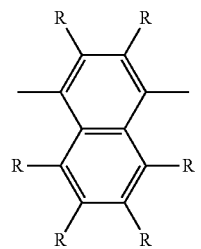 (A-4)
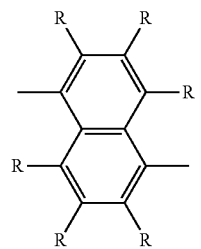 (A-5)
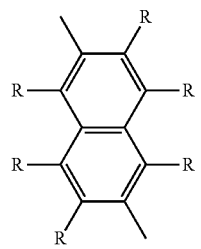 (A-6)
[Chemical Formula 9]
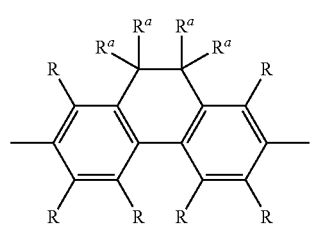 (A-7)
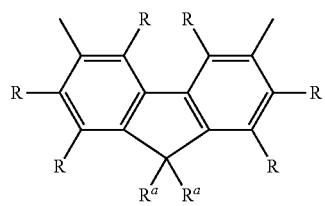 (A-8)
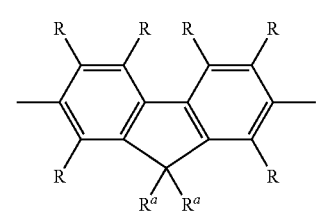 (A-9)
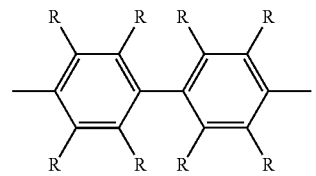 (A-10)
[Chemical Formula 10]
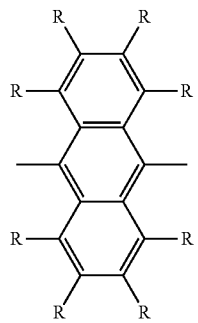 (A-11)
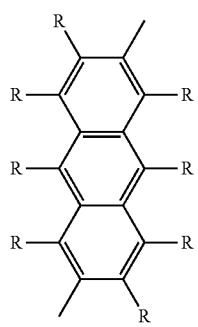 (A-12)
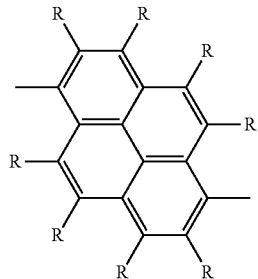 (A-13)

-continued

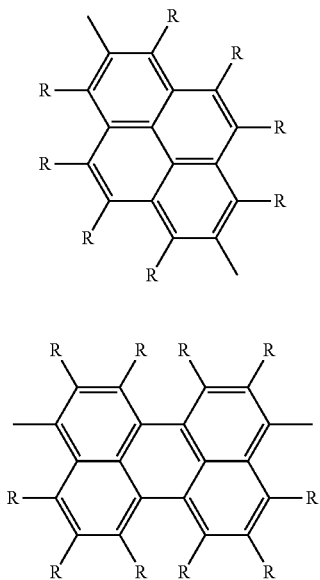
(A-14)

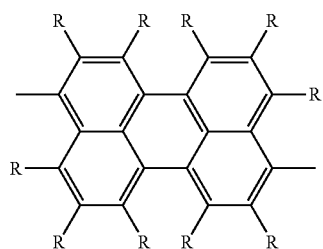
(A-15)

[Chemical Formula 11]

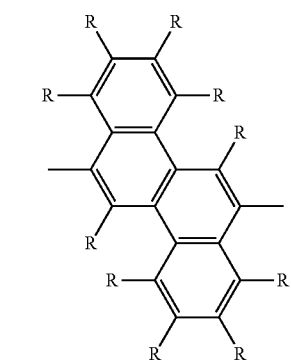
(A-16)

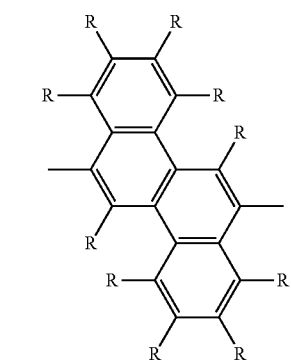
(A-17)

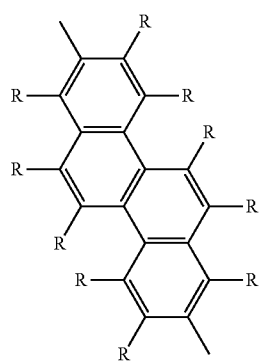
(A-18)

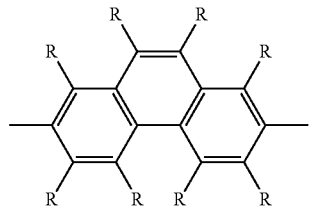
(A-19)

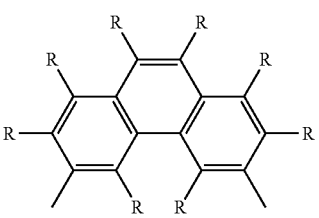
(A-20)

[wherein, R and $R^a$ each independently represent a hydrogen atom, an alkyl group, a cycloalkyl group, an aryl group or a monovalent hetero ring group. A plurality of R and $R^a$ may be the same or different at each occurrence, and groups $R^a$ may be combined together to form a ring together with atoms to which they are attached.]

The number of carbon atoms of the divalent hetero ring group is, not including the number of carbon atoms of the substituent, usually 2 to 60, preferably 3 to 20, more preferably 4 to 15.

The divalent hetero ring group optionally has a substituent and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms bonding directly to carbon atoms or hetero atoms constituting the ring, preferably groups represented by the formula (AA-1) to the formula (AA-34). The divalent hetero ring group includes groups obtained by bonding a plurality of these groups.

[Chemical Formula 12]

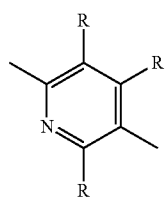
(AA-1)

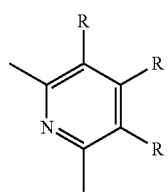
(AA-2)

-continued
(AA-3) 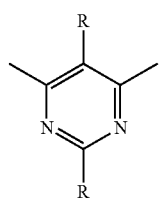
(AA-4) 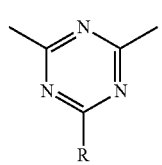
(AA-5) 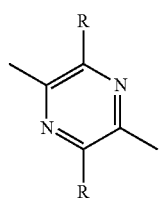
(AA-6) 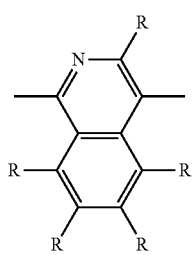
[Chemical Formula 13]
(AA-7) 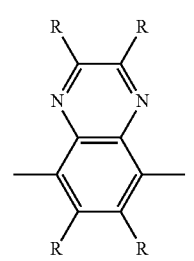
(AA-8)
(AA-9)
(AA-10) 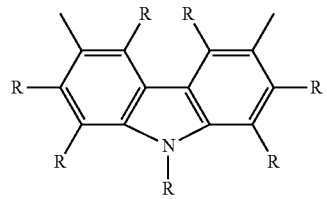
(AA-11) 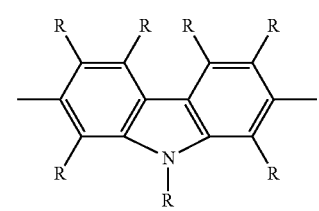
(AA-12) 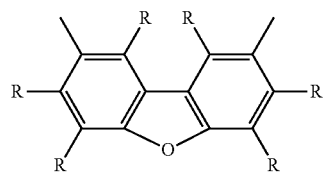
[Chemical Formula 14]
(AA-13) 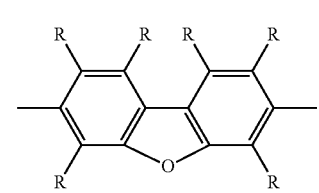
(AA-14) 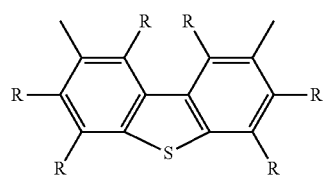
(AA-15) 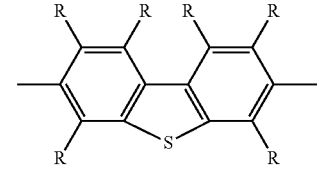
(AA-16) 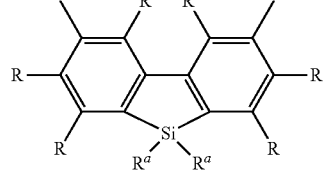
[Chemical Formula 15]
(AA-17) 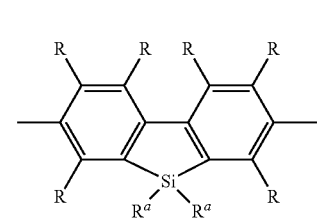

-continued
(AA-18)
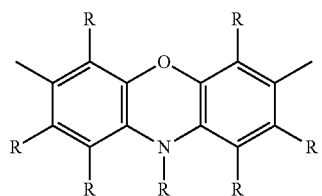
(AA-19)
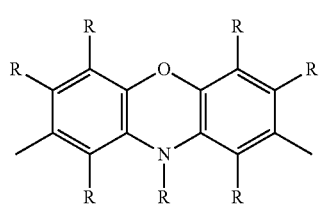
(AA-20)
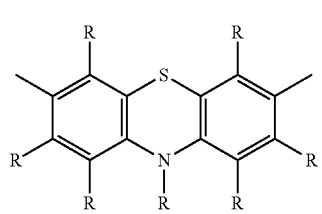
[Chemical Formula 16]
(AA-21)
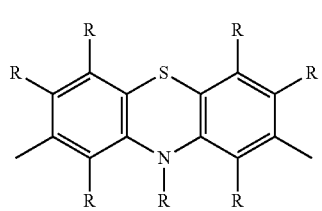
(AA-22)
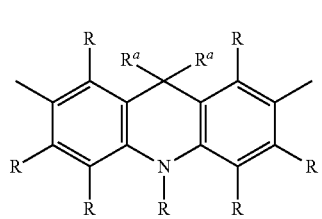
(AA-23)
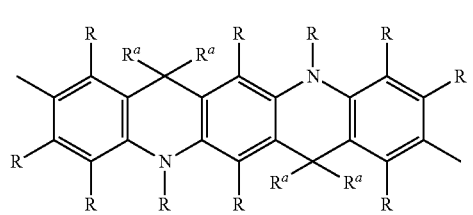
(AA-24)
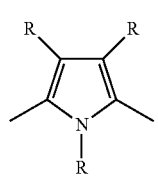
-continued
(AA-25)
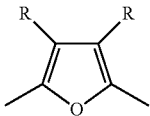
[Chemical Formula 17]
(AA-26)
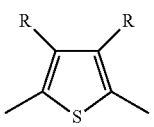
(AA-27)
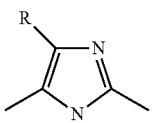
(AA-28)
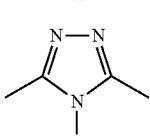
(AA-29)
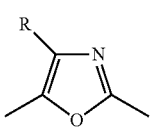
(AA-30)
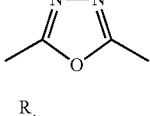
(AA-31)
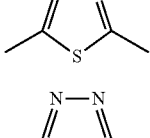
(AA-32)
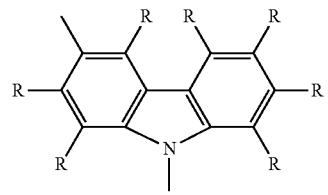
[Chemical Formula 18]
(AA-33)
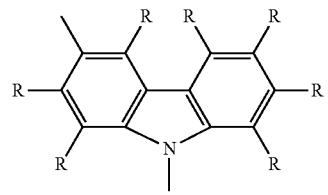
(AA-34)
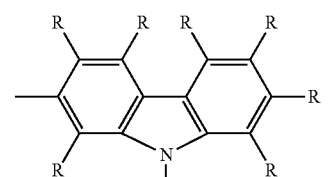
[wherein, R and $R^a$ represent the same meaning as described above.]
"Crosslink group" refers to a group capable of generating a new bond by being subjected to a heating treatment, an ultraviolet irradiation treatment, a near-ultraviolet irradiation treatment, a visible light irradiation treatment, an infrared irradiation treatment, a radical reaction and the like, preferably includes crosslink groups represented by the formula (XL-1) to the formula (XL-17) in Group A of crosslink group.

"Substituent" denotes a halogen atom, a cyano group, an alkyl group, a cycloalkyl group, an aryl group, a monovalent hetero ring group, an alkoxy group, a cycloalkoxy group, an aryloxy group, an amino group, a substituted amino group, an alkenyl group, a cycloalkenyl group, an alkynyl group or a cycloalkynyl group. The substituent may also be a crosslink group.

<Light Emitting Device>

The light emitting device of the present invention is a light emitting device having an anode, a cathode, a first organic layer disposed between the anode and the cathode and a second organic layer disposed between the anode and the cathode, wherein the above-described first organic layer is a layer containing a light emitting material represented by the formula (T) and the above-described second organic layer is a layer containing a crosslinked body of a polymer compound containing a crosslink constitutional unit (namely, a constitutional unit having a crosslink group).

The method for forming the first organic layer and the second organic layer includes, for example, dry methods such as a vacuum vapor deposition method and the like and wet methods such as a spin coat method, an inkjet printing method and the like, and wet methods are preferable.

When the first organic layer is formed by a wet method, it is preferable to use a first ink described later.

When the second organic layer is formed by a wet method, it is preferable to use a second ink described later. After formation of the second organic layer, a polymer compound containing a crosslink constitutional unit contained in the second organic layer can be crosslinked by heating or light irradiation, and it is preferable that a polymer compound containing a crosslink constitutional unit contained in the second organic layer is crosslinked by heating. Since the second organic layer contains a polymer compound containing a crosslink constitutional unit in cross-linked state (crosslinked body of a polymer compound containing a crosslink constitutional unit), the second organic layer is substantially insolubilized with respect to a solvent. Hence, the second organic layer can be suitably used for lamination of a light emitting device.

The temperature of heating for causing crosslinking is usually 25° C. to 300° C., preferably 50° C. to 260° C., more preferably 130° C. to 230° C., further preferably 180° C. to 210° C. The time of heating is usually 0.1 minutes to 1000 minutes, preferably 0.5 minutes to 500 minutes, more preferably 1 minute to 120 minutes, further preferably 10 minutes to 60 minutes.

The kind of the light used for irradiation includes, for example, ultraviolet, near-ultraviolet and visible light.

The method for analyzing components contained in the first organic layer and the second organic layer includes, for example, chemical separation and analysis methods such as extraction and the like, instrumental analysis methods such as infrared spectroscopy (IR), nuclear magnetic resonance spectroscopy (NMR), mass spectrometry (MS) and the like, and analysis methods combining chemical separation and analysis methods with instrumental analysis methods.

By performing solid-liquid extraction on the first organic layer and the second organic layer using an organic solvent such as toluene, xylene, chloroform, tetrahydrofuran and the like, the components can be separated into components substantially insoluble in an organic solvent (insoluble component) and components soluble in an organic solvent (soluble component). The insoluble component can be analyzed by infrared spectroscopy or nuclear magnetic resonance spectroscopy and the soluble component can be analyzed by nuclear magnetic resonance spectroscopy or mass spectrometry.

<First Organic Layer>

[Light Emitting Material Represented by the Formula (T)]

The light emitting material represented by the formula (T) is preferably a thermally activated delayed fluorescence (TADF) material.

The absolute value of the difference between the energy level at the lowest triplet excited state and the energy level at the lowest singlet excited state ($\Delta E_{ST}$) of the light emitting material represented by the formula (T) is usually 0.50 eV or less, preferably 0.40 eV or less, more preferably 0.30 eV or less, further preferably 0.20 eV or less, particularly preferably 0.13 eV or less. $\Delta E_{ST}$ of the light emitting material represented by the formula (T) is preferably 0.0001 eV or more, more preferably 0.001 eV or more, further preferably 0.01 eV or more. $\Delta E_{ST}$ of the light emitting material represented by the formula (T) is 0.0001 eV or more and 0.40 eV or less, more preferably 0.001 eV or more and 0.20 eV or less, further preferably 0.01 eV or more and 0.13 eV or less, since the driving voltage of the light emitting device of the present invention lowers.

The oscillator strength of the light emitting material represented by the formula (T) is preferably 0.0001 or more, more preferably 0.001 or more, further preferably 0.01 or more, particularly preferably 0.1 or more. The oscillator strength of the light emitting material represented by the formula (T) is preferably 1 or less, more preferably 0.8 or less, further preferably 0.6 or less, particularly preferably 0.3 or less. The oscillator strength of the light emitting material represented by the formula (T) is preferably 0.0001 or more and 1 or less, more preferably 0.001 or more and 0.3 or less, further preferably 0.01 or more and 0.3 or less, particularly preferably 0.1 or more and 0.3 or less, since the driving voltage of the light emitting device of the present invention lowers.

For calculation of $\Delta E_{ST}$ and oscillator strength value of a compound, the structure of the ground state of the compound is optimized by the B3LYP level density functional method, and 6-31G* is used as the basis function in this operation. Using Gaussian09 as a quantum chemical calculation program, $\Delta E_{ST}$ and oscillator strength of a compound are calculated by the B3LYP level time-dependent density functional method. However, when an atom for which 6-31G* cannot be used is contained, LANL2DZ is used for the atom.

The molecular weight of the light emitting material represented by the formula (T) is preferably $1 \times 10^2$ to $1 \times 10^4$, more preferably $2 \times 10^2$ to $5 \times 10^3$, further preferably $3 \times 10^2$ to $3 \times 10^3$, particularly preferably $5 \times 10^2$ to $1.5 \times 10^3$.

$n^{T1}$ is preferably an integer of 0 or more and 3 or less, more preferably an integer of 0 or more and 2 or less, further preferably 0 or 1, particularly preferably 1, since the driving voltage of the light emitting device of the present invention lowers.

$n^{T2}$ is preferably an integer of 1 or more and 7 or less, more preferably an integer of 1 or more and 5 or less, further preferably an integer of 1 or more and 3 or less, particularly preferably 1 or 2, especially preferably 1, since the driving voltage of the light emitting device of the present invention lowers.

$Ar^{T1}$ is a single-ring or condensed-ring monovalent hetero ring group containing a nitrogen atom having no double bond as a ring constituent atom and not containing a nitrogen atom having a double bond as a ring constituent atom. This monovalent hetero ring group optionally has a substituent.

"Nitrogen atom having no double bond" denotes a nitrogen atom having only a single bond between the nitrogen atom and all atoms bonded to the nitrogen atom.

"Containing a nitrogen atom having no double bond as a ring constituent atom" means that a group represented by —N(—$R^N$)— (in the formula, $R^N$ represents a hydrogen atom or a substituent.)- or a group represented by the formula:

[Chemical Formula 19]

is contained in the ring.

"Nitrogen atom having a double bond" denotes a nitrogen atom having a double bond between the nitrogen atom and an atom bonded to the nitrogen atom.

"Containing a nitrogen atom having a double bond as a ring constituent atom" means that a group represented by —N= is contained in the ring.

In the single-ring or condensed-ring monovalent hetero ring group containing a nitrogen atom having no double bond as a ring constituent atom and not containing a nitrogen atom having a double bond as a ring constituent atom, the number of the nitrogen atom having no double bond constituting the ring is usually 1 to 10, preferably 1 to 5, more preferably 1 to 3, further preferably 1 or 2, particularly preferably 1.

In the single-ring or condensed-ring monovalent hetero ring group containing a nitrogen atom having no double bond as a ring constituent atom and not containing a nitrogen atom having a double bond as a ring constituent atom, the number of carbon atoms constituting the ring is usually 2 to 60, preferably 5 to 40, more preferably 10 to 25.

The single-ring monovalent hetero ring group containing a nitrogen atom having no double bond as a ring constituent atom and not containing a nitrogen atom having a double bond as a ring constituent atom includes, for example, groups obtained by removing from a pyrrole ring one hydrogen atom bonding directly to a carbon atom or a hetero atom constituting the ring, and these groups optionally have a substituent.

The condensed-ring monovalent hetero ring group containing a nitrogen atom having no double bond as a ring constituent atom and not containing a nitrogen atom having a double bond as a ring constituent atom includes, for example, groups obtained by removing from an indole ring, an isoindole ring, a carbazole ring, a 9,10-dihydroacridine ring, a 5,10-dihydrophenazine ring, an acridone ring, a quinacridone ring, a phenoxazine ring, a phenothiazine ring, an indolocarbazole ring, an indenocarbazole ring or rings obtained by condensing an aromatic hydrocarbon ring and/or a hetero ring not containing a nitrogen atom having a double bond as a ring constituent atom to these hetero rings one hydrogen atom bonding directly to a carbon atom or a hetero atom constituting the ring, and these groups optionally have a substituent. The examples and the preferable range of the aromatic hydrocarbon ring which may be condensed to a hetero ring are the same as the examples and the preferable range of the aromatic hydrocarbon ring represented by the ring $R^{T1}$ and the ring $R^{T2}$ described later. The examples and the preferable range of the hetero ring not containing a nitrogen atom having a double bond as a ring constituent atom which may be condensed to a hetero ring are the same as the examples and the preferable range of the hetero ring not containing a nitrogen atom having a double bond as a ring constituent atom represented by the ring $R^{T1}$ and the ring $R^{T2}$ described later.

The condensed-ring monovalent hetero ring group containing a nitrogen atom having no double bond as a ring constituent atom and not containing a nitrogen atom having a double bond as a ring constituent atom is preferably a group obtained by removing from a carbazole ring, a 9,10-dihydroacridine ring, a 5,10-dihydrophenazine ring, a phenoxazine ring, a phenothiazine ring, an indolocarbazole ring, an indenocarbazole ring or rings obtained by condensing an aromatic hydrocarbon ring and/or a hetero ring not containing a nitrogen atom having a double bond as a ring constituent atom to these hetero rings one hydrogen atom bonding directly to a carbon atom or a hetero atom constituting the ring, more preferably a group obtained by removing from a carbazole ring, a 9,10-dihydroacridine ring, a 5,10-dihydrophenazine ring, a phenoxazine ring, a phenothiazine ring, an indolocarbazole ring or an indenocarbazole ring one hydrogen atom bonding directly to a carbon atom or a hetero atom constituting the ring, further preferably a group obtained by removing from a carbazole ring, an indolocarbazole ring or an indenocarbazole ring one hydrogen atom bonding directly to a carbon atom or a hetero atom constituting the ring, and these groups optionally have a substituent.

As the substituent which $Ar^{T1}$ optionally has, an alkyl group, a cycloalkyl group, an alkoxy group, a cycloalkoxy group, an aryl group, an aryloxy group, a monovalent hetero ring group, a substituted amino group, a halogen atom or a cyano group is preferable, an alkyl group, a cycloalkyl group, an alkoxy group, a cycloalkoxy group, an aryl group, a monovalent hetero ring group, a substituted amino group or a cyano group is more preferable, an alkyl group, a cycloalkyl group, an aryl group, a monovalent hetero ring group or a substituted amino group is further preferable, an alkyl group, an aryl group or a substituted amino group is particularly preferable, and these groups optionally further have a substituent.

The aryl group as the substituent which $Ar^{T1}$ optionally has includes, for example, groups obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring or a ring obtained by condensing these rings one hydrogen atom bonding directly to a carbon atom constituting the ring, and is preferably a group obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring or a chrysene ring one hydrogen atom bonding directly to a carbon atom constituting the ring, more preferably a phenyl group, a naphthyl group, an anthracenyl group, a phenanthrenyl group, a dihydrophenanthrenyl group, a fluorenyl group or a spirobifluorenyl group, further preferably a phenyl group, a naphthyl group, a fluorenyl group or a spirobifluorenyl group, particularly preferably a phenyl group, and these groups optionally have a substituent.

The monovalent hetero ring group as the substituent which $Ar^{T1}$ optionally has includes, for example, groups obtained by removing from a pyrrole ring, a diazole ring, a triazole ring, a furan ring, a thiophene ring, an oxadiazole ring, a thiadiazole ring, a pyridine ring, a diazabenzene ring, a triazine ring, an azanaphthalene ring, a diazanaphthalene ring, a triazanaphthalene ring, an azaanthracene ring, a diazaanthracene ring, a triazaanthracene ring, an azaphenanthrene ring, a diazaphenanthrene ring, a triazaphenanthrene ring, a dibenzofuran ring, a dibenzothiophene ring, a dibenzosilole ring, a dibenzophosphole ring, a carbazole ring, an azacarbazole ring, a diazacarbazole ring, a phenoxazine ring, a phenothiazine ring or rings obtained by condensing an aromatic ring to these rings one hydrogen atom bonding directly to a carbon atom or a hetero atom constituting the ring, preferably is a group obtained by removing from a pyrrole ring, a diazole ring, a triazole ring, an oxadiazole ring, a thiadiazole ring, a pyridine ring, a diazabenzene ring, a triazine ring, an azanaphthalene ring, a diazanaphthalene ring, a triazanaphthalene ring, an azaanthracene ring, a diazaanthracene ring, a triazaanthracene ring, an azaphenanthrene ring, a diazaphenanthrene ring, a triazaphenanthrene ring, a dibenzofuran ring, a dibenzothiophene ring, a carbazole ring, an azacarbazole ring or a diazacarbazole ring one hydrogen atom bonding directly to a carbon atom or a hetero atom constituting the ring, more preferably a group obtained by removing from a pyridine ring, a diazabenzene ring, a triazine ring, an azanaphthalene ring, a diazanaphthalene ring, an azaanthracene ring, a diazaanthracene ring, an azaphenanthrene ring, a diazaphenanthrene ring, a dibenzofuran ring, a dibenzothiophene ring, a carbazole ring, an azacarbazole ring or a diazacarbazole ring at least one hydrogen atom bonding directly to a carbon atom or a hetero atom constituting the ring, further preferably a group obtained by removing from a pyridine ring, a diazabenzene ring, a triazine ring, a dibenzofuran ring, a dibenzothiophene ring or a carbazole ring at least one hydrogen atom bonding directly to a carbon atom or a hetero atom constituting the ring, particularly preferably a group obtained by removing from a dibenzofuran ring, a dibenzothiophene ring or a carbazole ring at least one hydrogen atom bonding directly to a carbon atom or a hetero atom constituting the ring, and these groups optionally have a substituent.

In the substituted amino group as the substituent which $Ar^{T1}$ optionally has, the substituent which the amino group has is preferably an aryl group or a monovalent hetero ring group, more preferably an aryl group, and these groups optionally further have a substituent. The examples and the preferable range of the aryl group as the substituent which the amino group has are the same as the examples and the preferable range of the aryl group as the substituent which $Ar^{T1}$ optionally has. The examples and the preferable range of the monovalent hetero ring group as the substituent which the amino group has are the same as the examples and the preferable range of the monovalent hetero ring group as the substituent which $Ar^{T1}$ optionally has.

When a plurality of such substituents which $Ar^{T1}$ optionally has are present, it is preferable that they are not combined together to form a ring together with atoms to which they are attached.

The substituent which the substituent which $Ar^{T1}$ optionally has optionally further has is preferably an alkyl group, a cycloalkyl group, an alkoxy group, a cycloalkoxy group, an aryl group, an aryloxy group, a monovalent hetero ring group, a substituted amino group, a halogen atom or a cyano group, more preferably an alkyl group, a cycloalkyl group, an alkoxy group, a cycloalkoxy group, an aryl group, a monovalent hetero ring group or a substituted amino group, further preferably an alkyl group, a cycloalkyl group, an aryl group, a monovalent hetero ring group or a substituted amino group, particularly preferably an alkyl group or a cycloalkyl group, and these groups optionally further have a substituent.

The examples and the preferable range of the aryl group, the monovalent hetero ring group and the substituted amino group as the substituent which the substituent which $Ar^{T1}$ optionally has optionally further has are the same as the examples and the preferable range of the aryl group, the monovalent hetero ring group and the substituted amino group as the substituent which $Ar^{T1}$ optionally has, respectively.

$Ar^{T1}$ is preferably a condensed-ring monovalent hetero ring group containing a nitrogen atom having no double bond as a ring constituent atom, more preferably a group represented by the formula (T1-1), and these groups optionally have a substituent.

Group represented by the formula (T1-1)

The number of carbon atoms of the aromatic hydrocarbon ring represented by the ring $R^{T1}$ and the ring $R^{T2}$ is, not including the number of carbon atoms of the substituent, usually 6 to 60, preferably 6 to 30, more preferably 6 to 18.

The aromatic hydrocarbon ring represented by the ring RT 1 and the ring $R^{T2}$ includes, for example, a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring and a ring obtained by condensing these rings, and is preferably a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring or a chrysene ring, more preferably a benzene ring, a naphthalene ring, an anthracene ring, a phenanthrene ring, a dihydrophenanthrene ring, a fluorene ring or a spirobifluorene ring, further preferably a benzene ring, a naphthalene ring, a fluorene ring or a spirobifluorene ring, particularly preferably a benzene ring or a fluorene ring, especially preferably a benzene ring, and these rings optionally have a substituent.

The number of carbon atoms of the hetero ring not containing a nitrogen atom having a double bond as a ring constituent atom represented by the ring $R^{T1}$ and the ring $R^{T2}$ is, not including the number of carbon atoms of the substituent, usually 2 to 60, preferably 3 to 30, more preferably 4 to 15.

The hetero ring not containing a nitrogen atom having a double bond as a ring constituent atom represented by the ring $R^{T1}$ and the ring $R^{T2}$ includes, for example, a pyrrole ring, a furan ring, a thiophene ring, a silole ring, a phosphole ring, an indole ring, a benzofuran ring, a benzothiophene ring, a benzosilole ring, a benzophosphole ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring, an acridone ring, a phenazine ring, a 5,10-dihydrophenazine ring, a ring obtained by condensing these rings and a ring obtained by condensing an aromatic hydrocarbon ring to these rings, and is preferably a pyrrole ring, a furan ring, a thiophene ring, a silole ring, a phosphole ring, an indole ring, a benzofuran ring, a benzothiophene ring, a benzosilole ring, a benzophosphole ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring, an acridone ring, a phenazine ring or a 5,10-dihydrophenazine ring, more preferably an indole ring, a benzofuran ring, a benzothiophene ring, a carbazole ring, a dibenzofuran ring, a dibenzothiophene ring, a phenoxazine ring, a phenothiazine ring, a 9,10-dihydroacridine ring or a 5,10-dihydrophenazine ring, further preferably a carbazole ring, a dibenzofuran ring, a dibenzothiophene ring, a phenoxazine ring, a phenothiazine ring, a 9,10-dihydroacridine ring or a 5,10-dihydrophenazine ring, particularly preferably a carbazole ring, a dibenzofuran ring or a dibenzothiophene ring, especially preferably a carbazole ring, and these rings optionally have a substituent.

The examples and the preferable range of the substituent which the ring $R^{T1}$ and the ring $R^{T2}$ optionally have are the same as the examples and the preferable range of the substituent which $Ar^{T1}$ optionally has.

The examples and the preferable range of the substituent which the substituent which the ring $R^{T1}$ and the ring $R^{T2}$ optionally have optionally further has are the same as the examples and the preferable range of the substituent which the substituent which $Ar^{T1}$ optionally has optionally further has.

At least one of the ring $R^{T1}$ and the ring $R^{T2}$ is preferably an aromatic hydrocarbon ring, more preferably a benzene ring, and these rings optionally have a substituent.

The ring $R^{T1}$ and the ring $R^{T2}$ are each preferably an aromatic hydrocarbon ring, more preferably a benzene ring or a fluorene ring, further preferably a benzene ring, and these rings optionally have a substituent.

$X^{T1}$ is preferably a single bond, an oxygen atom, a sulfur atom or a group represented by $-C(R^{XT1'})_2-$, more preferably a single bond, an oxygen atom or a sulfur atom, further preferably a single bond.

$R^{XT1}$ is preferably an alkyl group, a cycloalkyl group, an aryl group, a monovalent hetero ring group or a substituted amino group, more preferably an aryl group or a monovalent hetero ring group, further preferably an aryl group, and these groups optionally have a substituent.

$R^{XT1'}$ is preferably an alkyl group, a cycloalkyl group, an aryl group or a monovalent hetero ring group, more preferably an alkyl group, a cycloalkyl group or an aryl group, further preferably an alkyl group or a cycloalkyl group, and these groups optionally have a substituent.

A plurality of $R^{XT1'}$ may be the same or different and may be combined together to form a ring together with carbon atoms to which they are attached, however, it is preferable that they do not form a ring.

The examples and the preferable range of the aryl group, the monovalent hetero ring group and the substituted amino group represented by $R^{XT1}$ and $R^{XT1'}$ are the same as the examples and the preferable range of the aryl group, the monovalent hetero ring group and the substituted amino group as the substituent which $Ar^{T1}$ optionally has, respectively.

The examples and the preferable range of the substituent which $R^{XT1}$ and $R^{XT1'}$ optionally have are the same as the examples and the preferable range of the substituent which the substituent which $Ar^{T1}$ optionally has optionally further has.

$R^{XT1}$ and a substituent which the ring $R^{T1}$ optionally has, $R^{XT1}$ and a substituent which the ring $R^{T2}$ optionally has, $R^{XT1'}$ and a substituent which the ring $R^{T1}$ optionally has, and $R^{XT1'}$ and a substituent which the ring $R^{T2}$ optionally has are each preferably not combined together to form a ring together with atoms to which they are attached.

The group represented by the formula (T1-1) is preferably a group represented by the formula (T1-1A), a group represented by the formula (T1-1B), a group represented by the formula (T1-1C) or a group represented by the formula (T1-1D), more preferably a group represented by the formula (T1-1A), a group represented by the formula (T1-1B) or a group represented by the formula (T1-1C), further preferably a group represented by the formula (T1-1A) or a group represented by the formula (T1-1B), particularly preferably a group represented by the formula (T1-1A).

$X^{T2}$ and $X^{T3}$ are each preferably a single bond, a group represented by $-N(R^{XT2})-$ or a group represented by $-C(R^{XT2'})_2-$, more preferably a single bond or a group represented by $-C(R^{XT2'})_2-$.

It is preferable that at least one of $X^{T2}$ and $X^{T3}$ is a single bond, it is more preferable that $X^{T3}$ is a single bond.

When at least one of $X^{T2}$ and $X^{T3}$ is a single bond, the other is preferably an oxygen atom, a sulfur atom, a group represented by $-N(R^{XT2})-$ or a group represented by $-C(R^{XT2'})_2-$, more preferably a group represented by $-N(R^{XT2})-$ or a group represented by $-C(R^{XT2'})_2-$, further preferably a group represented by $-C(R^{XT2'})_2-$.

The examples and the preferable range of $R^{XT2}$ are the same as the examples and the preferable range of $R^{XT1}$.

The examples and the preferable range of $R^{XT2'}$ are the same as the examples and the preferable range of $R^{XT1'}$.

The examples and the preferable range of the substituent which $R^{XT2}$ and $R^{XT2'}$ optionally have are the same as the examples and the preferable range of the substituent which $R^{XT1}$ and $R^{XT1'}$ optionally have.

$R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ are each preferably a hydrogen atom, an alkyl group, a cycloalkyl group, an alkoxy group, a cycloalkoxy group, an aryl group, a monovalent hetero ring group, a substituted amino group or a cyano group, more preferably a hydrogen atom, an alkyl group, a cycloalkyl group, an aryl group, a monovalent hetero ring group or a substituted amino group, and these groups optionally further have a substituent.

In the group represented by the formula (T1-1A), $R^{T1}$, $R^{T2}$, $R^{T4}$, $R^{T5}$, $R^{T7}$ and $R^{T8}$ are each preferably a hydrogen atom, an alkyl group, an aryl group, a monovalent hetero ring group or a substituted amino group, more preferably a hydrogen atom or an alkyl group, further preferably a hydrogen atom, and these groups optionally further have a substituent.

In the group represented by the formula (T1-1A), $R^{T3}$ and $R^{T6}$ are each preferably an alkyl group, an aryl group, a monovalent hetero ring group or a substituted amino group, more preferably an aryl group, a monovalent hetero ring group or a substituted amino group, further preferably a substituted amino group, and these groups optionally further have a substituent.

In the groups represented by the formula (T1-1B), the formula (T1-1C) and the formula (T1-1D), $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ are each preferably a hydrogen atom, an alkyl group, an aryl group, a monovalent hetero ring group or a substituted amino group, more preferably a hydrogen atom or an alkyl group, further preferably a hydrogen atom, and these groups optionally further have a substituent.

The examples and the preferable range of the aryl group, the monovalent hetero ring group and the substituted amino group represented by $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ are the same as the examples and the preferable range of the aryl group, the monovalent hetero ring group and the substituted amino group as the substituent which $Ar^{T1}$ optionally has, respectively.

The examples and the preferable range of the substituent which $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ optionally have are the same as the examples and the preferable range of the substituent which the substituent which $Ar^{T1}$ optionally has optionally further has.

$R^{T1}$ and $R^{T2}$, $R^{T2}$ and $R^{T3}$, $R^{T3}$ and $R^{T4}$, $R^{T5}$ and $R^{T6}$, $R^{T6}$ and $R^{T7}$, $R^{T7}$ and $R^{T8}$, $R^{T9}$ and $R^{T10}$, $R^{T10}$ and $R^{T11}$, and $R^{T11}$ and $R^{T12}$ are each preferably not combined together to form a ring together with carbon atoms to which they are attached.

$L^{T1}$ represents an alkylene group, a cycloalkylene group, an arylene group, a divalent hetero ring group, a group represented by $-N(R^{XT'})-$, an oxygen atom or a sulfur atom, and these groups optionally have a substituent.

$L^{T1}$ is preferably an alkylene group, a cycloalkylene group, an arylene group or a divalent hetero ring group, more preferably an arylene group or a divalent hetero ring group, further preferably an arylene group, and these groups optionally have a substituent.

The arylene group represented by $L^{T1}$ is preferably a phenylene group, a naphthalenediyl group, a fluorenediyl group, a phenanthrenediyl group or a dihydrophenanthrenediyl group, more preferably a group represented by the formula (A-1) to the formula (A-9), the formula (A-19) or the formula (A-20), further preferably a group represented by the formula (A-1) to the formula (A-3), particularly preferably a group represented by the formula (A-1) or (A-2), especially preferably a group represented by the formula (A-1), and these groups optionally have a substituent.

The divalent hetero ring group represented by $L^{T1}$ is preferably a group represented by the formula (AA-1) to the formula (AA-34), more preferably a group represented by the formula (AA-1) to the formula (AA-6), the formula (AA-10) to the formula (AA-21) or the formula (AA-24) to the formula (AA-34), further preferably a group represented by the formula (AA-1) to the formula (AA-4), the formula (AA-10) to the formula (AA-15) or the formula (AA-29) to the formula (AA-34), particularly preferably a group represented by the formula (AA-2), the formula (AA-4), the formula (AA-10), the formula (AA-12) or the formula (AA-14).

The examples and the preferable range of the substituent which $L^{T1}$ optionally has are the same as the examples and the preferable range of the substituent which $Ar^{T1}$ optionally has.

The examples and the preferable range of the substituent which the substituent which $L^{T1}$ optionally has optionally further has are the same as the examples and the preferable range of the substituent which the substituent which $Ar^{T1}$ optionally has optionally further has.

$R^{T1'}$ is preferably an aryl group or a monovalent hetero ring group, more preferably an aryl group, and these groups optionally have a substituent.

The examples and the preferable range of the aryl group and the monovalent hetero ring group represented by $R^{T1'}$ are the same as the examples and the preferable range of the aryl group and the monovalent hetero ring group as the substituent which $Ar^{T1}$ optionally has, respectively.

The examples and the preferable range of the substituent which $R^{T1'}$ optionally has are the same as the examples and the preferable range of the substituent which the substituent which $Ar^{T1}$ optionally has optionally further has.

$Ar^{T2}$ is a single-ring or condensed-ring hetero ring group containing a nitrogen atom having a double bond as a ring constituent atom. This hetero ring group optionally has a substituent.

In the single-ring or condensed-ring hetero ring group containing a nitrogen atom having a double bond as a ring constituent atom, the number of the nitrogen atom having a double bond constituting the ring is usually 1 to 10, preferably 1 to 7, more preferably 1 to 5, further preferably 1 to 3, particularly preferably 3.

In the single-ring or condensed-ring hetero ring group containing a nitrogen atom having a double bond as a ring constituent atom, the number of carbon atoms constituting the ring is usually 1 to 60, preferably 2 to 30, more preferably 3 to 10, particularly preferably 3 to 5.

The single-ring or condensed-ring hetero ring group containing a nitrogen atom having a double bond as a ring constituent atom includes groups obtained by removing from a diazole ring, a triazole ring, an oxadiazole ring, a thiadiazole ring, a thiazole ring, an oxazole ring, an isothiazole ring, an isooxazole ring, a benzodiazole ring, a benzotriazole ring, a benzooxadiazole ring, a benzothiadiazole ring, a benzothiazole ring, a benzooxazole ring, an azacarbazole ring, a diazacarbazole ring, a pyridine ring, a diazabenzene ring, a triazine ring, an azanaphthalene ring, a diazanaphthalene ring, a triazanaphthalene ring, a tetraazanaphthalene ring, an azaanthracene ring, a diazaanthracene ring, a triazaanthracene ring, a tetraazaanthracene ring, an azaphenanthrene ring, a diazaphenanthrene ring, a triazaphenanthrene ring, a tetraazaphenanthrene ring or rings obtained by condensing an aromatic ring to these hetero rings at least one hydrogen atom bonding directly to a carbon atom or a hetero atom constituting the ring, and is preferably a group obtained by removing from a diazole ring, a triazole ring, an oxadiazole ring, a thiadiazole ring, a thiazole ring, an oxazole ring, an isothiazole ring, an isooxazole ring, a benzodiazole ring, a benzotriazole ring, a benzooxadiazole ring, a benzothiadiazole ring, a benzothiazole ring, a benzooxazole ring, an azacarbazole ring, a diazacarbazole ring, a pyridine ring, a diazabenzene ring, a triazine ring, an azanaphthalene ring, a diazanaphthalene ring, a triazanaphthalene ring, a tetraazanaphthalene ring, an azaanthracene ring, a diazaanthracene ring, a triazaanthracene ring, a tetraazaanthracene ring, an azaphenanthrene ring, a diazaphenanthrene ring, a triazaphenanthrene ring or a tetraazaphenanthrene ring at least one hydrogen atom bonding directly to a carbon atom or a hetero atom constituting the ring, more preferably a group obtained by removing from a triazole ring, an oxadiazole ring, a thiadiazole ring, an azacarbazole ring, a diazacarbazole ring, a pyridine ring, a diazabenzene ring, a triazine ring, an azanaphthalene ring, a diazanaphthalene ring, a triazanaphthalene ring, a tetraazanaphthalene ring, an azaanthracene ring, a diazaanthracene ring, a triazaanthracene ring, a tetraazaanthracene ring, an azaphenanthrene ring, a diazaphenanthrene ring, a triazaphenanthrene ring or a tetraazaphenanthrene ring at least one hydrogen atom bonding directly to a carbon atom or a hetero atom constituting the ring, further preferably a group obtained by removing from a triazole ring, an oxadiazole ring, a thiadiazole ring, a pyridine ring, a diazabenzene ring, a triazine ring, an azanaphthalene ring, a diazanaphthalene ring, an azaanthracene ring, a diazaanthracene ring, an azaphenanthrene ring or a diazaphenanthrene ring at least one hydrogen atom bonding directly to a carbon atom or a hetero atom constituting the ring, particularly preferably a group obtained by removing from a pyridine ring, a diazabenzene ring or a triazine ring at least one hydrogen atom bonding directly to a carbon atom constituting the ring, especially preferably a group obtained by removing from a triazine ring at least one hydrogen atom bonding directly to a carbon atom constituting the ring, and these groups optionally have a substituent.

The substituent which $Ar^{T2}$ optionally has (different from a group represented by the formula (1T') described later, the same shall apply hereinafter) is preferably a monovalent hetero ring group other than a single-ring or condensed-ring monovalent hetero ring group containing a nitrogen atom having no double bond as a ring constituent atom and not containing a nitrogen atom having a double bond as a ring constituent atom (hereinafter, referred to also as "monovalent hetero ring group other than a donor type hetero ring group"), an alkyl group, a cycloalkyl group, an alkoxy group, a cycloalkoxy group, an aryl group, an aryloxy group, a substituted amino group, a halogen atom or a cyano group, more preferably an alkyl group, a cycloalkyl group, an alkoxy group, a cycloalkoxy group, an aryl group, a monovalent hetero ring group other than a donor type hetero ring group, a substituted amino group or a cyano group, further preferably an alkyl group, a cycloalkyl group, an aryl group, a monovalent hetero ring group other than a donor type hetero ring group or a substituted amino group, particularly preferably an alkyl group or an aryl group, especially preferably an aryl group, and these groups optionally further have a substituent.

The examples and the preferable range of the aryl group as the substituent which $Ar^{T2}$ optionally has are the same as the examples and the preferable range of the aryl group as the substituent which $Ar^{T1}$ optionally has.

In the monovalent hetero ring group other than a donor type hetero ring group as the substituent which $Ar^{T2}$ optionally has, the number of carbon atoms constituting the ring is, not including the number of carbon atoms of the substituent, usually 2 to 60, preferably 3 to 20.

The monovalent hetero ring group other than a donor type hetero ring group as the substituent which $Ar^{T2}$ optionally has includes, for example, groups obtained by removing from a diazole ring, a triazole ring, a furan ring, a thiophene ring, an oxadiazole ring, a thiadiazole ring, a pyridine ring, a diazabenzene ring, a triazine ring, an azanaphthalene ring, a diazanaphthalene ring, a triazanaphthalene ring, an azaanthracene ring, a diazaanthracene ring, a triazaanthracene ring, an azaphenanthrene ring, a diazaphenanthrene ring, a triazaphenanthrene ring, a dibenzofuran ring, a dibenzothiophene ring, a dibenzosilole ring, a dibenzophosphole ring, an azacarbazole ring, a diazacarbazole ring, a ring obtained by condensing these hetero rings and a ring obtained by condensing an aromatic hydrocarbon ring to these hetero rings one hydrogen atom bonding directly to a carbon atom or a hetero atom constituting the ring, and is preferably a group obtained by removing from a diazole ring, a triazole ring, a furan ring, a thiophene ring, an oxadiazole ring, a thiadiazole ring, a pyridine ring, a diazabenzene ring, a triazine ring, an azanaphthalene ring, a diazanaphthalene ring, a triazanaphthalene ring, an azaanthracene ring, a diazaanthracene ring, a triazaanthracene ring, an azaphenanthrene ring, a diazaphenanthrene ring, a triazaphenanthrene ring, a dibenzofuran ring, a dibenzothiophene ring, a dibenzosilole ring, a dibenzophosphole ring, an azacarbazole ring or a diazacarbazole ring one hydrogen atom bonding directly to a carbon atom or a hetero atom constituting the ring, more preferably a group obtained by removing from a pyridine ring, a diazabenzene ring, a triazine ring, an azanaphthalene ring, a diazanaphthalene ring, an azaanthracene ring, a diazaanthracene ring, an azaphenanthrene ring, a diazaphenanthrene ring, a dibenzofuran ring, a dibenzothiophene ring, an azacarbazole ring or a diazacarbazole ring at least one hydrogen atom bonding directly to a carbon atom or a hetero atom constituting the ring, further preferably a group obtained by removing from a pyridine ring, a diazabenzene ring, a triazine ring, a dibenzofuran ring or a dibenzothiophene ring one hydrogen atom bonding directly to a carbon atom constituting the ring, particularly preferably a group obtained by removing from a dibenzofuran ring or a dibenzothiophene ring one hydrogen atom bonding directly to a carbon atom constituting the ring, and these groups optionally have a substituent.

In the substituted amino group as the substituent which $Ar^{T2}$ optionally has, the substituent which the amino group has is preferably an aryl group or a monovalent hetero ring group other than a donor type hetero ring group, more preferably an aryl group, and these groups optionally further have a substituent. The examples and the preferable range of the aryl group as the substituent which the amino group has are the same as the examples and the preferable range of the aryl group as the substituent which $Ar^{T1}$ optionally has. The examples and the preferable range of the monovalent hetero ring group other than a donor type hetero ring group as the substituent which the amino group has are the same as the examples and the preferable range of the monovalent hetero ring group other than a donor type hetero ring group as the substituent which $Ar^{T2}$ optionally has.

The substituent which the substituent which $Ar^{T2}$ optionally has optionally further has is preferably an alkyl group, a cycloalkyl group, an alkoxy group, a cycloalkoxy group, an aryl group, an aryloxy group, a monovalent hetero ring group other than a donor type hetero ring group, a substituted amino group, a halogen atom or a cyano group, more preferably an alkyl group, a cycloalkyl group, an alkoxy group, a cycloalkoxy group, an aryl group, a monovalent hetero ring group other than a donor type hetero ring group or a substituted amino group, further preferably an alkyl group, a cycloalkyl group, an aryl group, a monovalent hetero ring group other than a donor type hetero ring group or a substituted amino group, particularly preferably an alkyl group or an aryl group, and these groups optionally further have a substituent.

The light emitting material represented by the formula (T) is preferably a compound represented by the formula (T'-1) to the formula (T'-14), more preferably a compound represented by the formula (T'-1) to the formula (T'-11), further preferably a compound represented by the formula (T'-1) to the formula (T'-8), particularly preferably a compound represented by the formula (T'-1) to the formula (T'-4), especially preferably a compound represented by the formula (T'-4), since the driving voltage of the light emitting device of the present invention lowers.

[Chemical Formula 20]

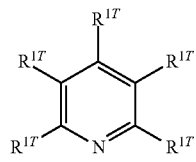

(T'-1)

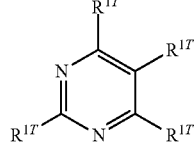

(T'-2)

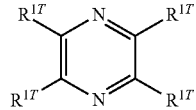

(T'-3)

(T'-4) 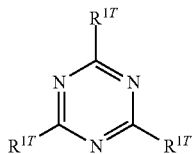

[Chemical Formula 21]

(T'-5) 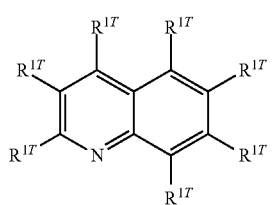

(T'-6) 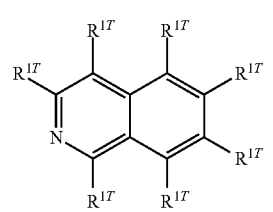

(T'-7) 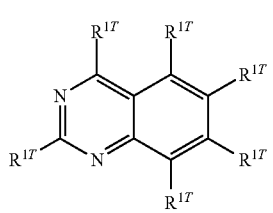

(T'-8) 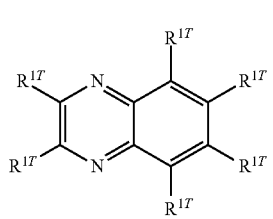

[Chemical Formula 22]

(T'-9) 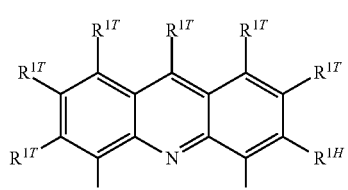

(T'-10) 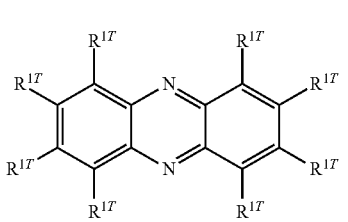

(T'-11) 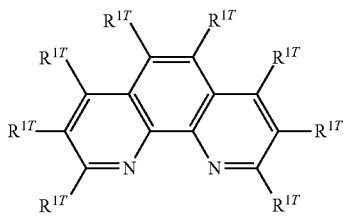

[Chemical Formula 23]

(T'-12) 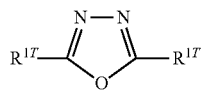

(T'-13) 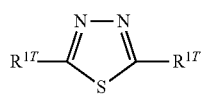

(T'-14) 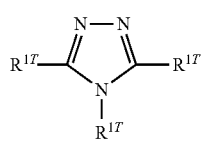

[wherein, $R^{1T}$ represents a hydrogen atom, an alkyl group, a cycloalkyl group, an alkoxy group, a cycloalkoxy group, an aryl group, an aryloxy group, a monovalent hetero ring group other than a donor type hetero ring group, a substituted amino group, a halogen atom, a cyano group or a group represented by the formula (1T'), and these groups optionally have a substituent. A plurality of $R^{1T}$ may be the same or different. However, at least one of a plurality of $R^{1T}$ is a group represented by the formula (1T').]

It is preferable that one or two groups $R^{1T}$ of a plurality of $R^{1T}$ are each a group represented by the formula (1T').

[Chemical Formula 24]

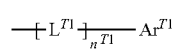 (1T')

[wherein, $L^{T1}$, $n^{T1}$ and $Ar^{T1}$ represent the same meaning as described above.]

$R^{1T}$ is preferably a hydrogen atom, an alkyl group, a cycloalkyl group, an alkoxy group, a cycloalkoxy group, an aryl group, a monovalent hetero ring group other than a donor type hetero ring group, a substituted amino group, a cyano group or a group represented by the formula (1T'), more preferably a hydrogen atom, an alkyl group, a cycloalkyl group, an aryl group, a monovalent hetero ring group other than a donor type hetero ring group, a substituted amino group or a group represented by the formula (1T'), further preferably a hydrogen atom, an alkyl group, an aryl group or a group represented by the formula (1T'), particularly preferably a hydrogen atom, an aryl group or a group represented by the formula (1T'), and these groups optionally have a substituent.

The examples and the preferable range of the aryl group, the monovalent hetero ring group other than a donor type hetero ring group and the substituted amino group represented by $R^{1T}$ are the same as the examples and the preferable range of the aryl group, the monovalent hetero ring group other than a donor type hetero ring group and the substituted amino group as the substituent which $Ar^{T2}$ optionally has, respectively.

The examples and the preferable range of the substituent which $R^{1T}$ optionally has are the same as the examples and the preferable range of the substituent which the substituent which $Ar^{T2}$ optionally has optionally further has.

The compound represented by the formula (T'-1) to the formula (T'-14) includes, for example, compounds represented by the formula (T"-1) to the formula (T"-25), and is preferably a compound represented by the formula (T"-1) to the formula (T"-22), more preferably a compound represented by the formula (T"-1) to the formula (T"-18), further preferably a compound represented by the formula (T"-1) to the formula (T"-8), particularly preferably a compound represented by the formula (T"-8).

[Chemical Formula 25]

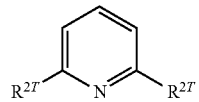 (T"-1)

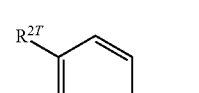 (T"-2)

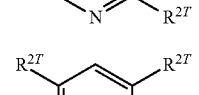 (T"-3)

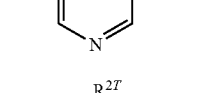 (T"-4)

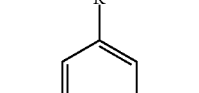 (T"-5)

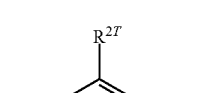 (T"-6)

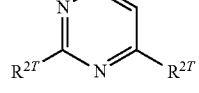 (T"-7)

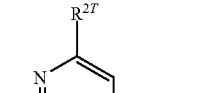 (T"-8)

[Chemical Formula 26]

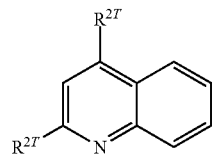 (T"-9)

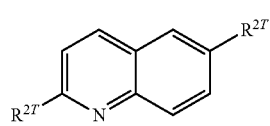 (T"-10)

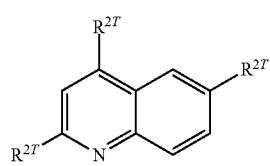 (T"-11)

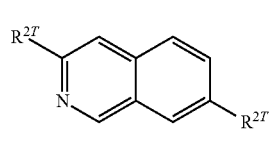 (T"-12)

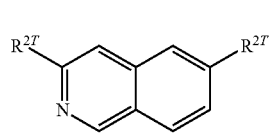 (T"-13)

[Chemical Formula 27]

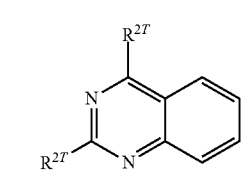 (T"-14)

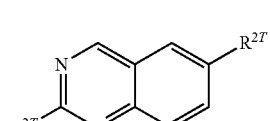 (T"-15)

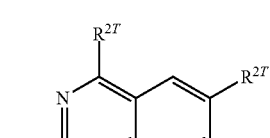 (T"-16)

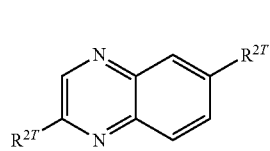 (T"-17)

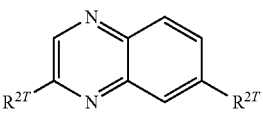

[Chemical Formula 28]

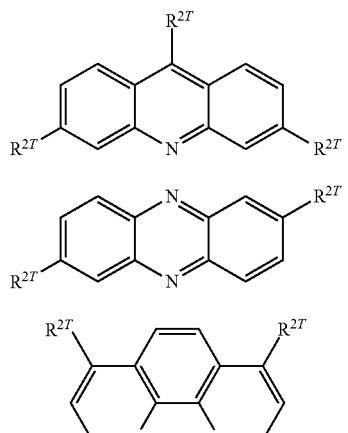

[Chemical Formula 29]

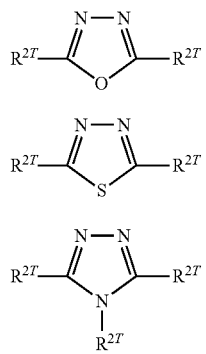

[wherein, $R^{2T}$ represents an alkyl group, a cycloalkyl group, an aryl group, a monovalent hetero ring group other than a donor type hetero ring group, a substituted amino group or a group represented by the formula (1T'), and these groups optionally have a substituent. A plurality of $R^{2T}$ may be the same or different. However, at least one of a plurality of $R^{2T}$ is a group represented by the formula (1T').]

It is preferable that one or two groups $R^{2T}$ of a plurality of $R^{2T}$ are each a group represented by the formula (1T').

$R^{2T}$ is preferably an alkyl group, an aryl group or a group represented by the formula (1T'), more preferably an aryl group or a group represented by the formula (1T'), and these groups optionally further have a substituent.

The examples and the preferable range of the aryl group, the monovalent hetero ring group and the substituted amino group represented by $R^{2T}$ are the same as the examples and the preferable range of the aryl group, the monovalent hetero ring group and the substituted amino group as the substituent which $Ar^{T2}$ optionally has, respectively.

The examples and the preferable range of the substituent which $R^{2T}$ optionally has are the same as the examples and the preferable range of the substituent which the substituent which $Ar^{T2}$ optionally has optionally further has.

The light emitting material represented by the formula (T) includes, for example, compounds represented by the following formulae. In the formulae, $Z^1$ represents a group represented by —N= or a group represented by —CH=. $Z^2$ represents an oxygen atom or a sulfur atom. A plurality of $Z^1$ and $Z^2$ may be the same or different at each occurrence.

[Chemical Formula 30]

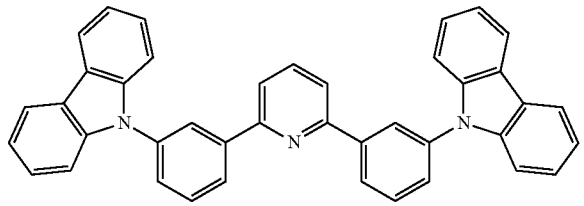

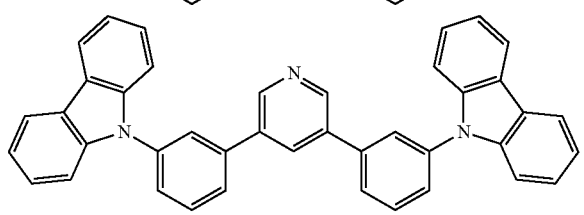

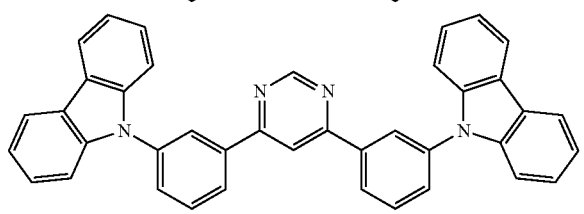

[Chemical Formula 31]

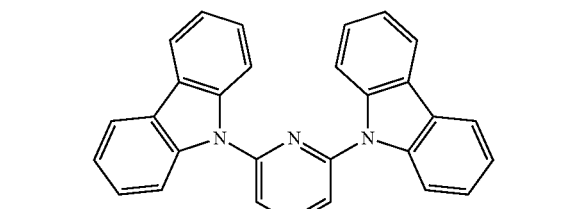

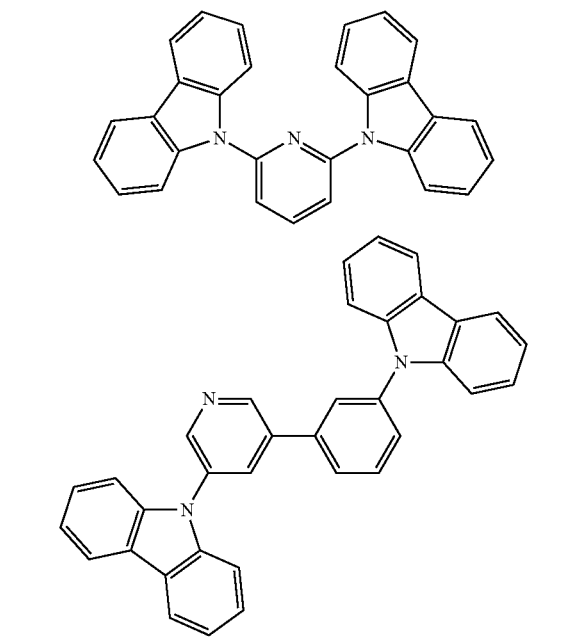

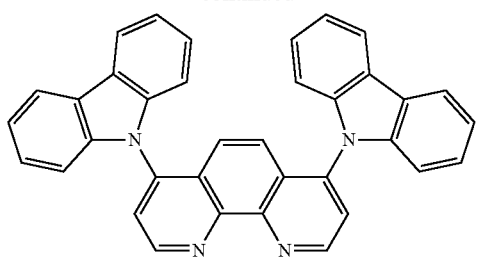
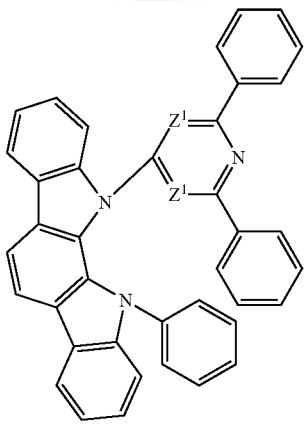
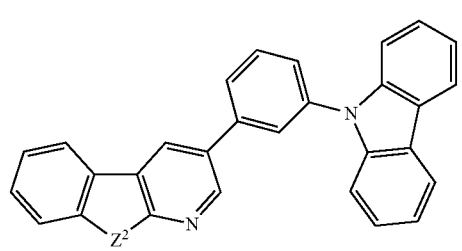
[Chemical Formula 32]
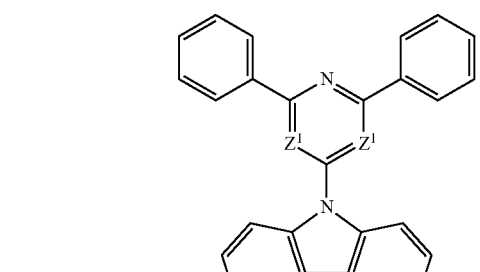
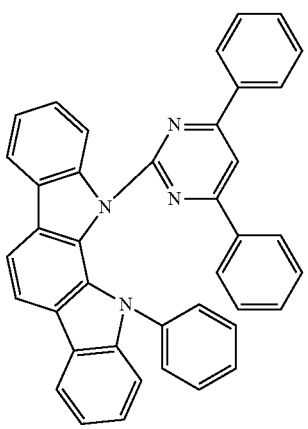
[Chemical Formula 33]
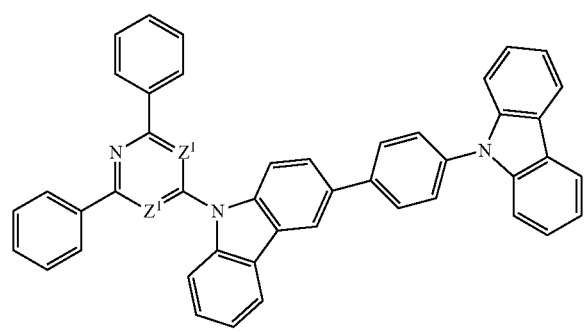
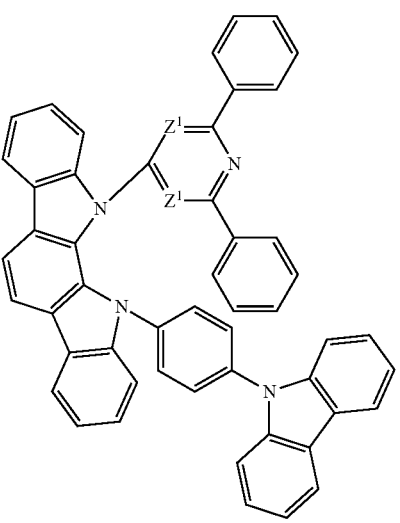

[Chemical Formula 34]
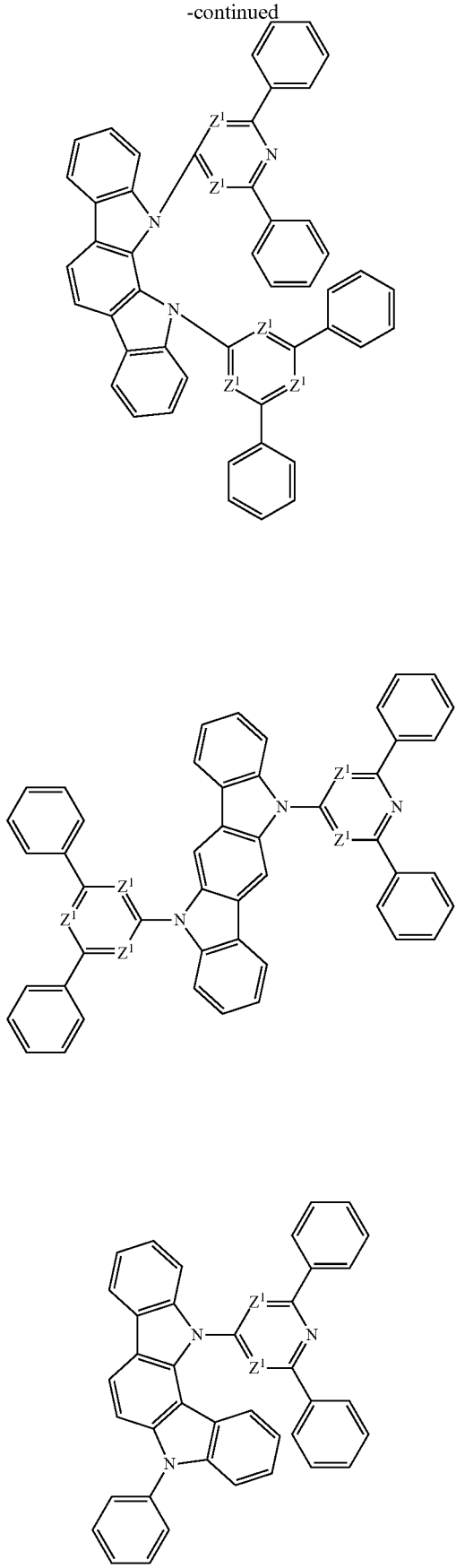
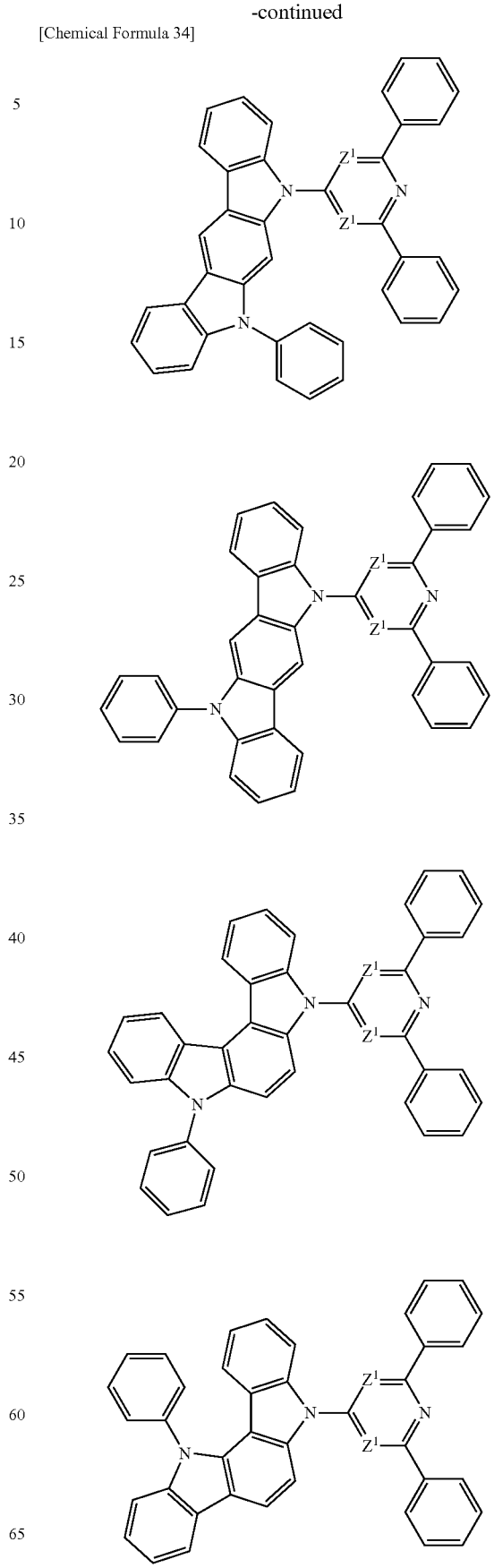

[Chemical Formula 35]
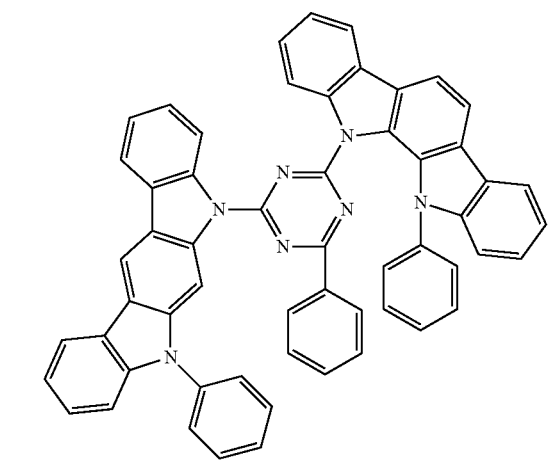
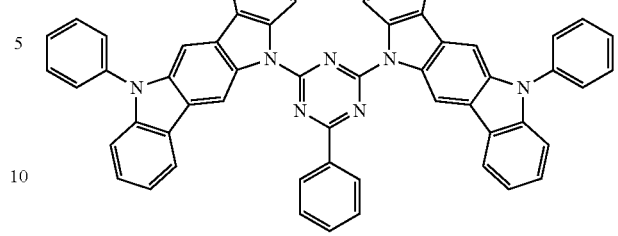
[Chemical Formula 36]
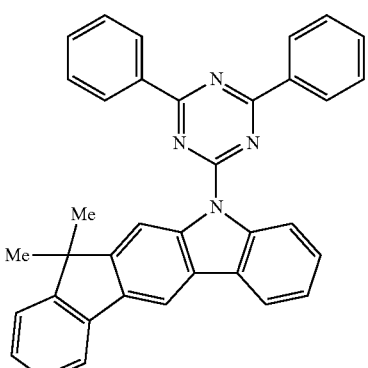
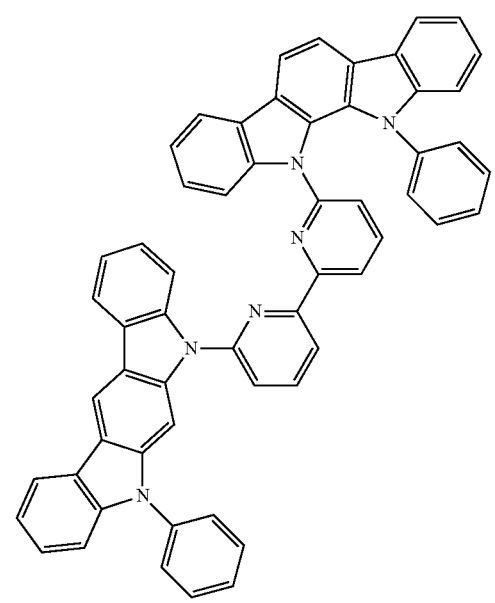
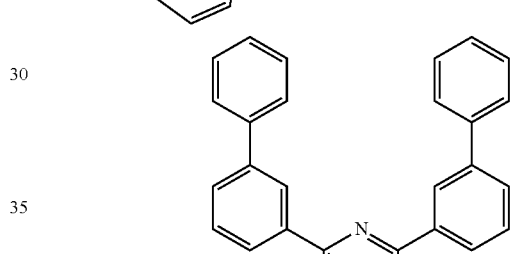
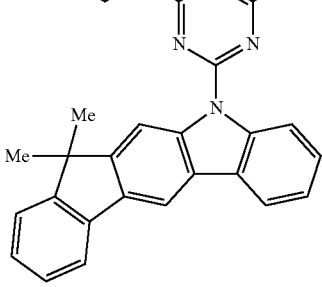
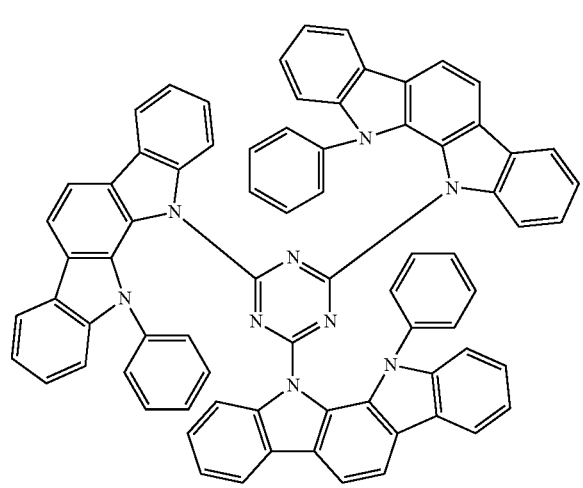
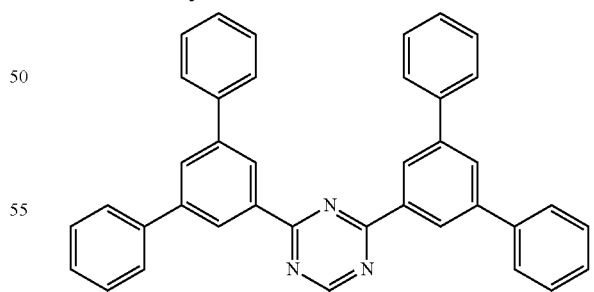
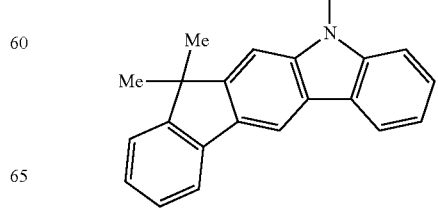

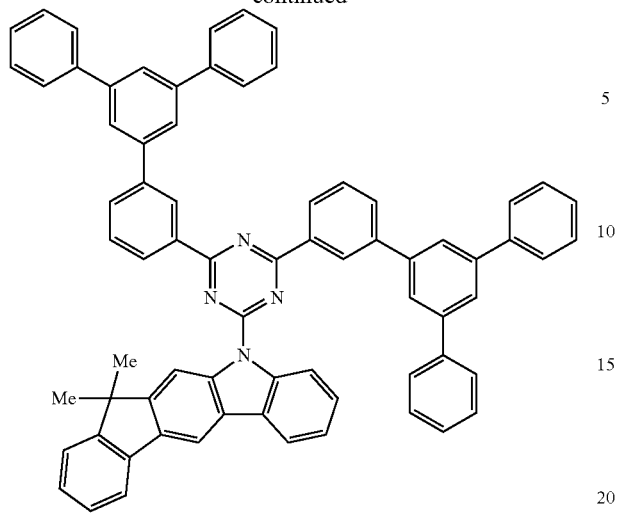
[Chemical Formula 37]
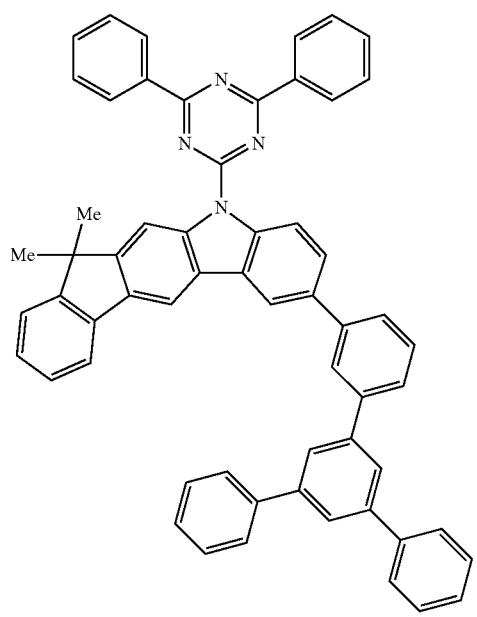
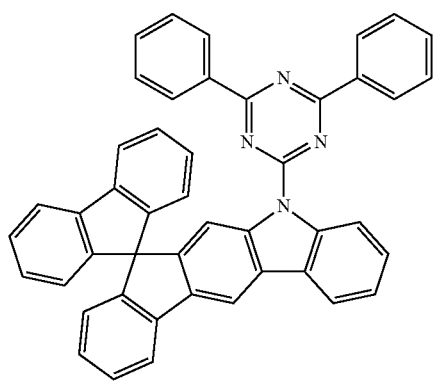
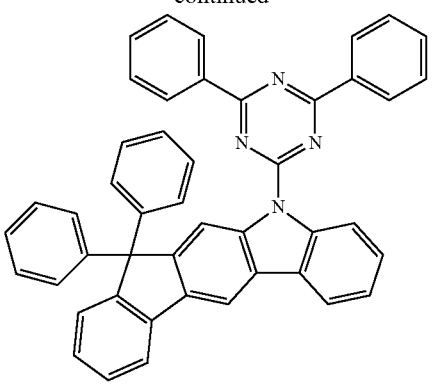
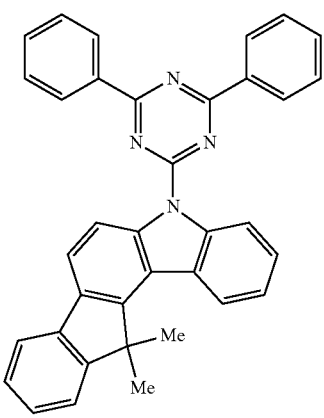
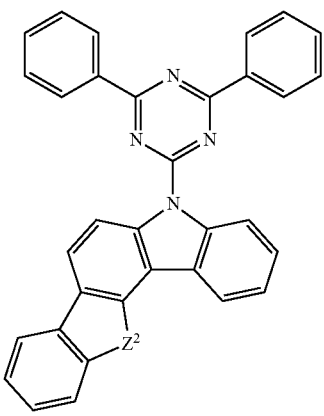
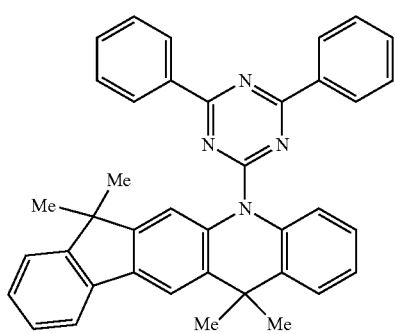

-continued
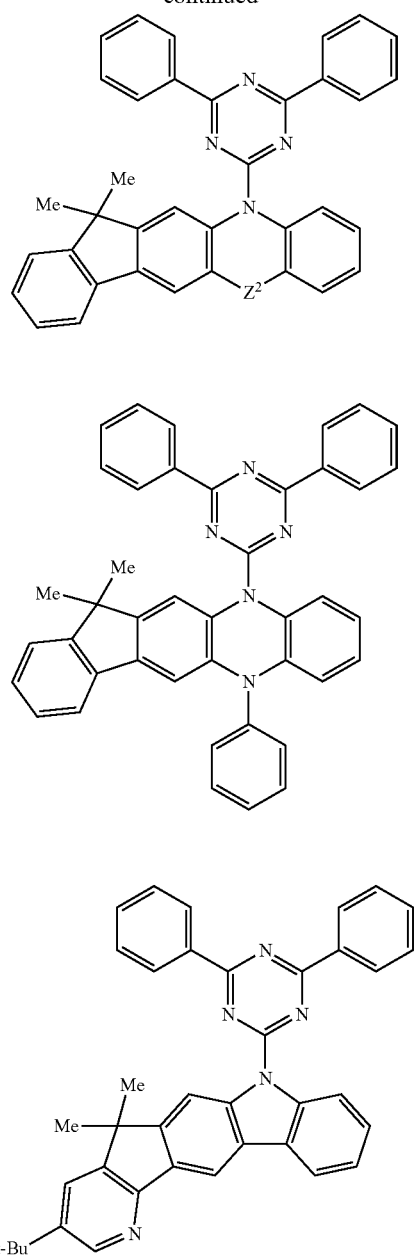
[Chemical Formula 38]
-continued
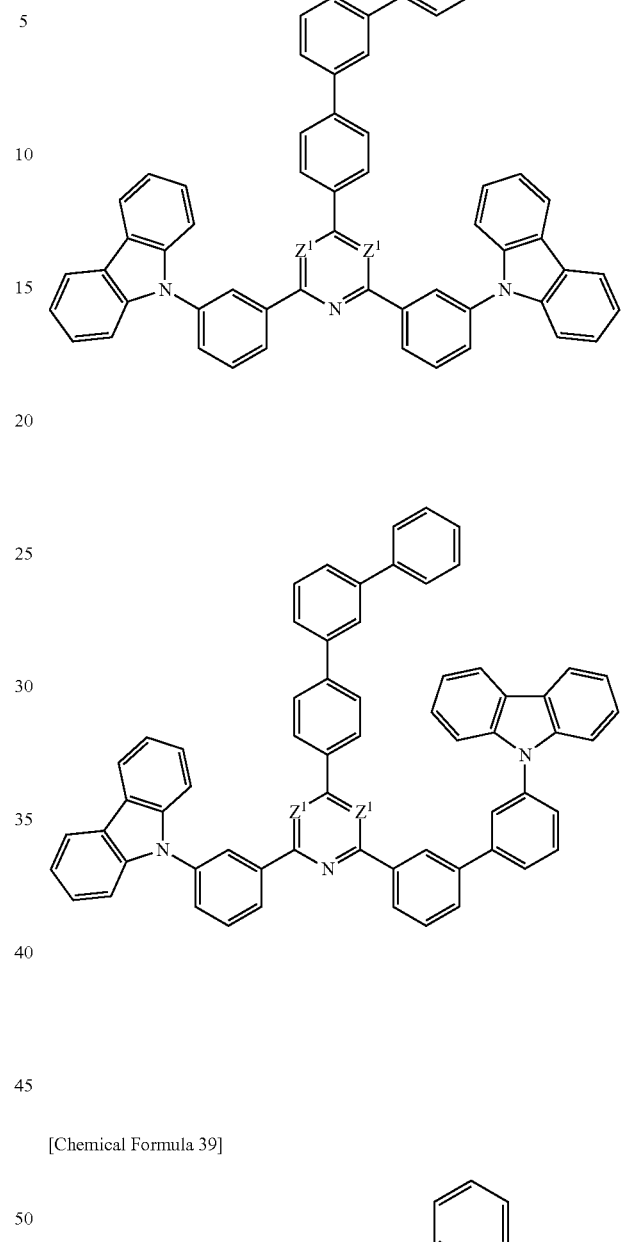
[Chemical Formula 39]
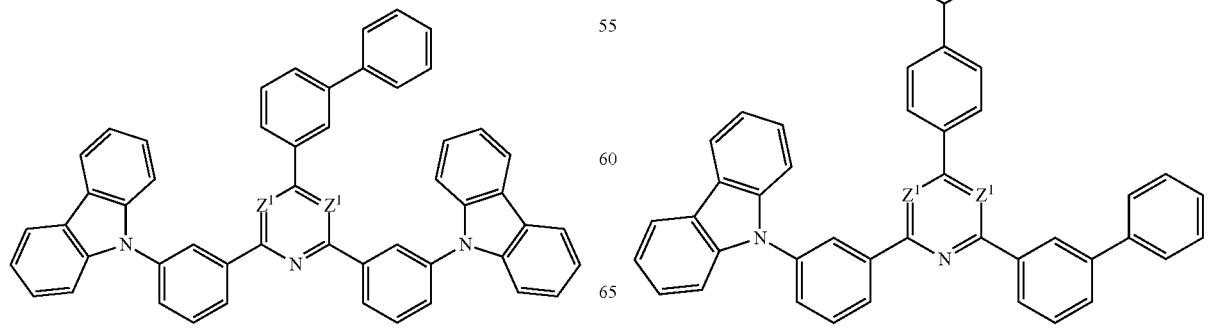

-continued
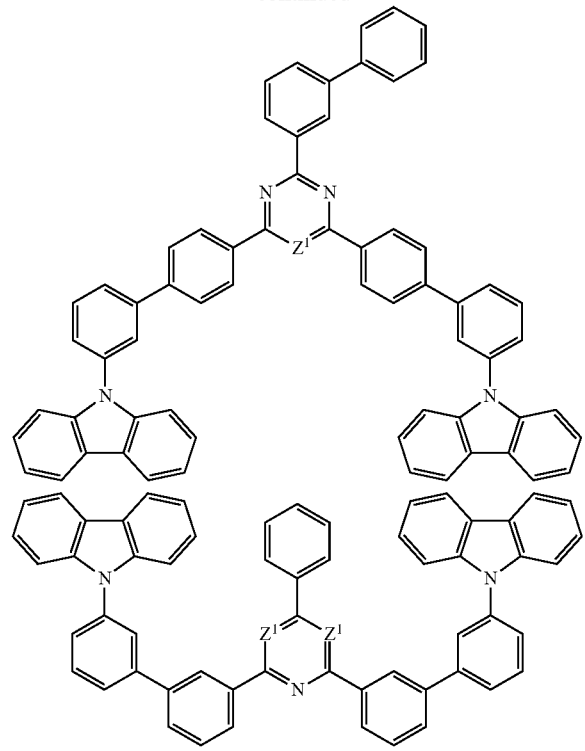
[Chemical Formula 40]
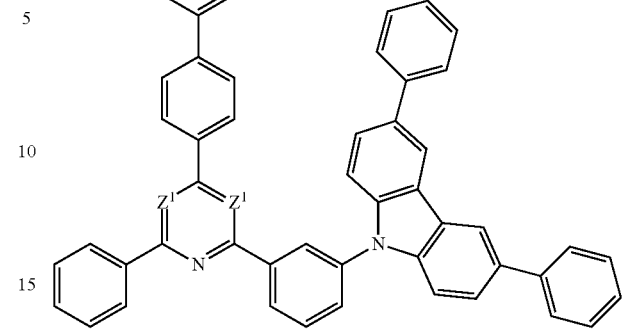
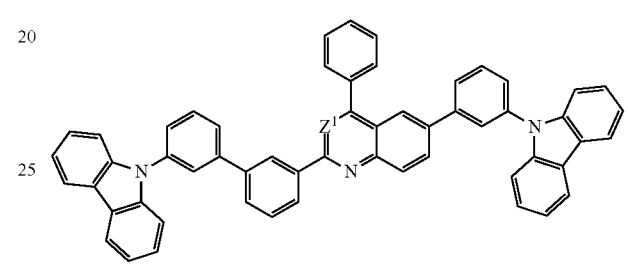
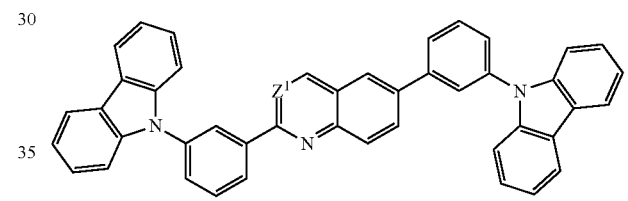
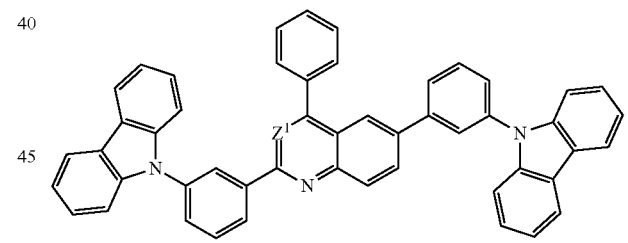
[Chemical Formula 41]
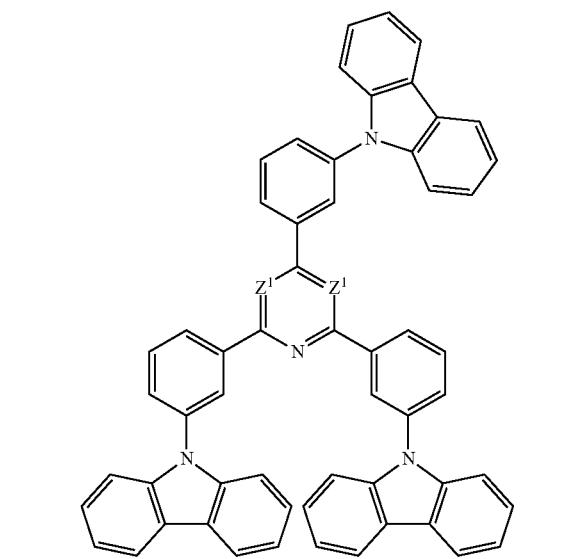
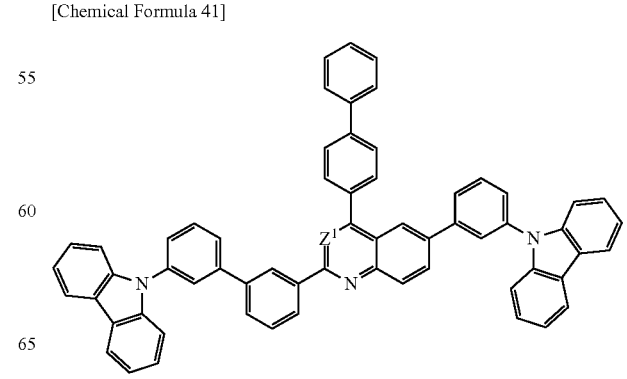

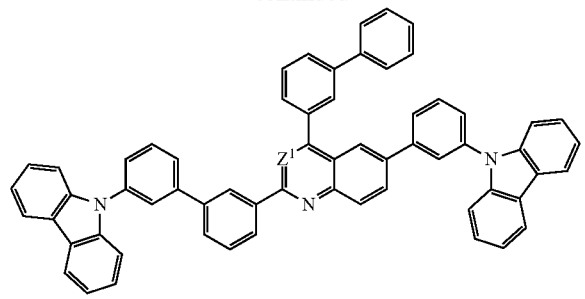
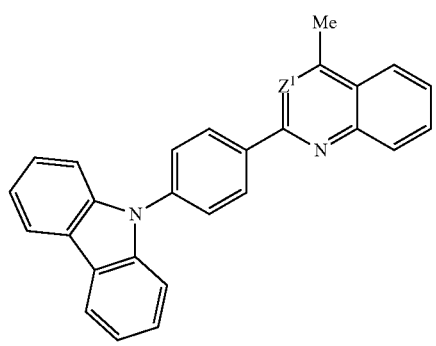
[Chemical Formula 42]
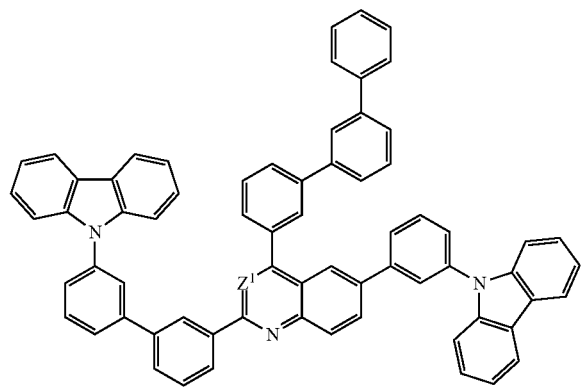
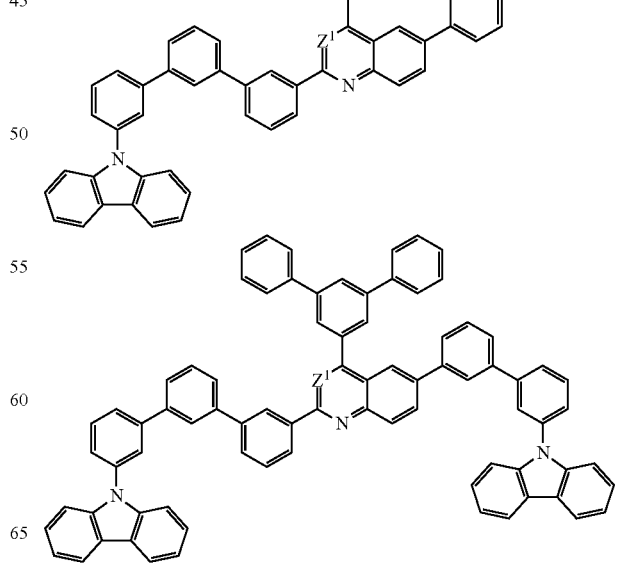
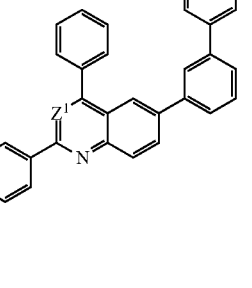
[Chemical Formula 43]
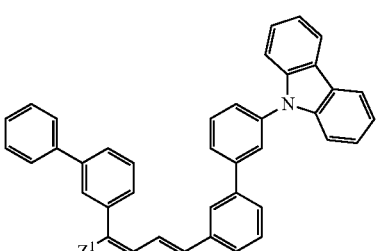
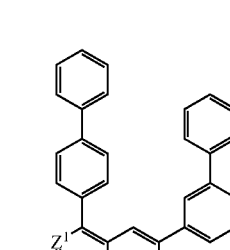

[Chemical Formula 44]
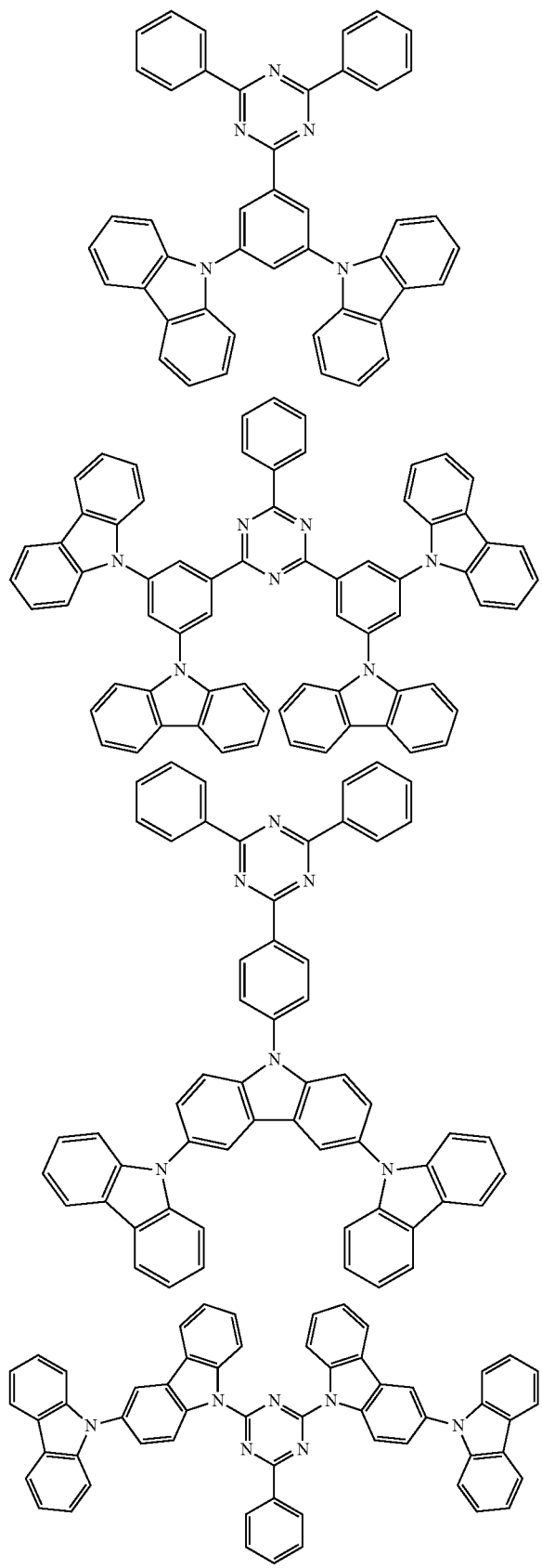
[Chemical Formula 45]
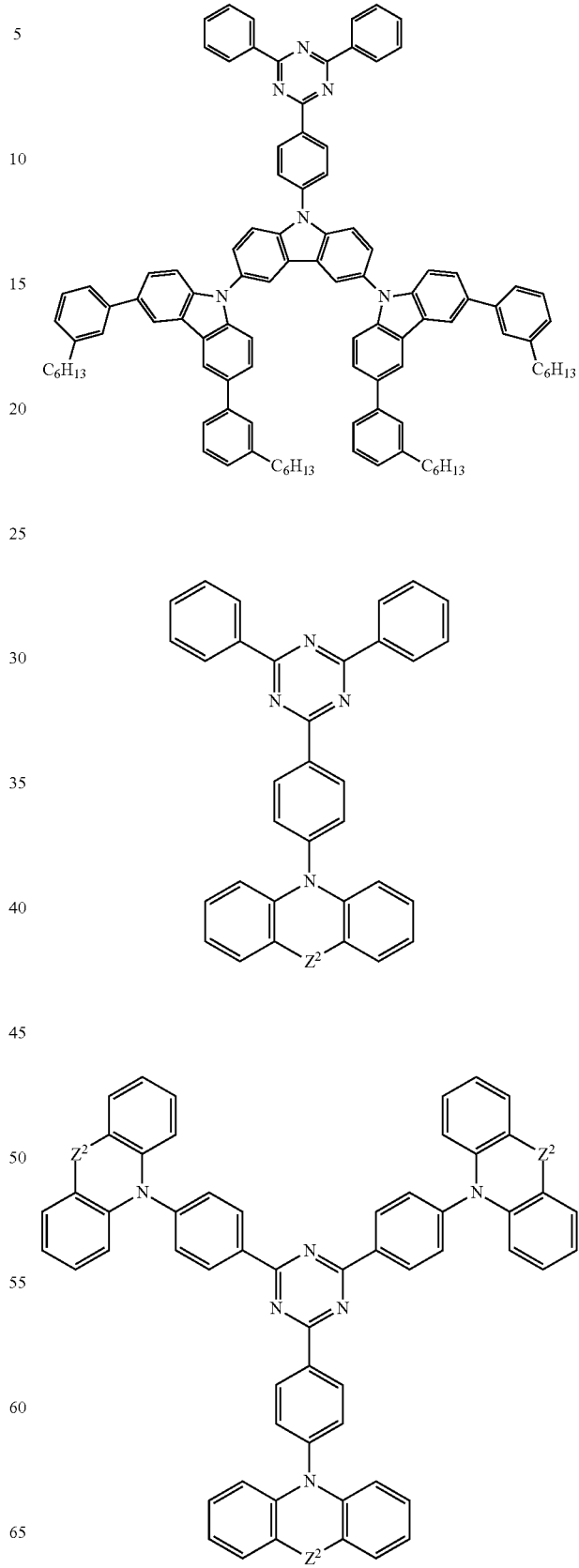

-continued

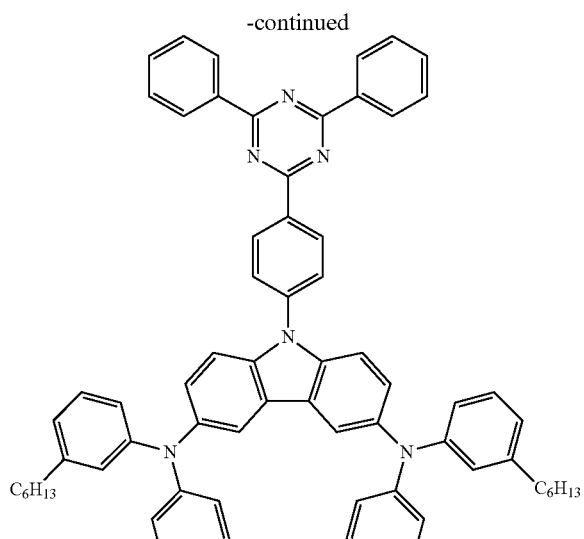

[Chemical Formula 46]

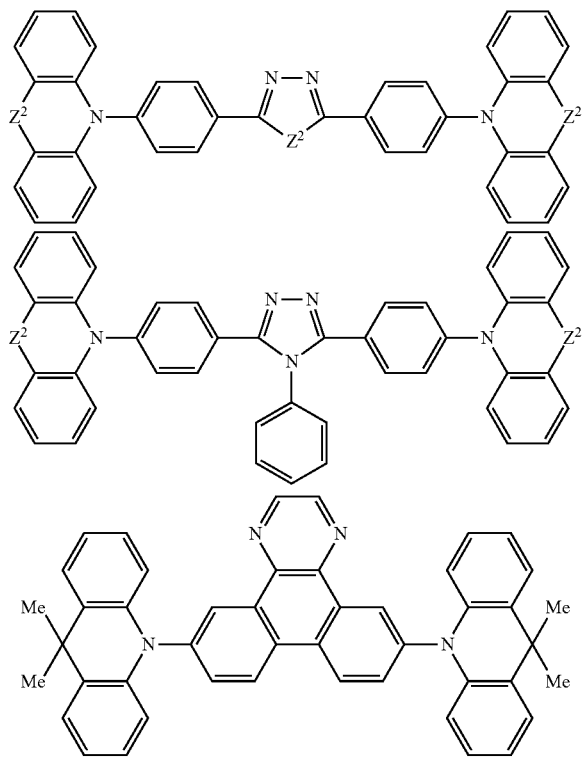

$Z^1$ is preferably a group represented by —N=. $Z^2$ is preferably an oxygen atom.

The light emitting material represented by the formula (T) is available from Aldrich, Luminescence Technology Corp. and the like. Additionally, the light emitting material represented by the formula (T) can be synthesized according to methods described is, for example, International Publication WO2007/063754, International Publication WO2008/056746, International Publication WO2011/032686, International Publication WO2012/096263, JP-A No. 2009-227663, JP-A No. 2010-275255, Advanced Materials (Adv. Mater), vol. 26, pp. 7931-7958, 2014.

[Host Material]

The first organic layer is preferably a layer containing the light emitting material represented by the formula (T) and a host material having at least one function of hole injectability, hole transportability, electron injectability and electron transportability, since the driving voltage of the light emitting device of the present invention lowers. When the first organic layer is a layer containing the light emitting material represented by the formula (T) and a host material, the host material may be contained singly or two or more kinds of the host materials may be contained. However, the light emitting material represented by the formula (T) is different from the host material.

The host material means a material which plays a role of transferring electric energy to the light emitting material represented by formula (T). It is preferable that the lowest excited triplet state of the host material is at energy level higher than the lowest excited triplet state of the light emitting material represented by the formula (T) and the lowest excited singlet state of the host material is at energy level higher than the lowest excited singlet state of the light emitting material represented by the formula (T), since the light emitting material represented by the formula (T) is allowed to emit light more efficiently by efficiently transferring electric energy from the host material to the light emitting material.

When the first organic layer is a layer containing the light emitting material represented by the formula (T) and a host material, the content of the light emitting material represented by the formula (T) is usually 0.1 to 50 parts by mass, preferably 1 to 45 parts by mass, more preferably 5 to 40 parts by mass, further preferably 10 to 20 parts by mass when the sum of the light emitting material represented by the formula (T) and the host material is taken as 100 parts by mass.

The host material is preferably one showing solubility with respect to the solvent capable of dissolving the light emitting material represented by the formula (T) contained in the first organic layer, since the light emitting device of the present invention can be fabricated by a solution application process.

The host material is classified into low molecular compounds and polymer compounds, and polymer compounds are preferable.

[Low Molecular Host]

The low molecular compound preferable as the host material (hereinafter, referred to as "low molecular host") is preferably a compound represented by the formula (H-1) or a compound represented by the formula (H-2), more preferably a compound represented by the formula (H-1). However, the compound represented by the formula (H-1) and the compound represented by the formula (H-2) are different from the light emitting material represented by the formula (T). The compound represented by the formula (H-1) is different from the compound represented by the formula (H-2).

[Chemical Formula 47]

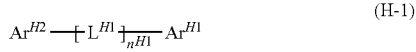 (H-1)

[wherein, $n^{H1}$ represents an integer of 0 or more and 10 or less.

$Ar^{H1}$ and $Ar^{H2}$ each independently represent an aryl group, a monovalent hetero ring group not containing a nitrogen atom having a double bond as a ring constituent atom or a substituted amino group, and these groups optionally have a substituent.

$L^{H1}$ represents an alkylene group, a cycloalkylene group, an arylene group or a divalent hetero ring group not containing a nitrogen atom having a double bond as a ring constituent atom, and these groups optionally have a substituent. When a plurality of $L^{H1}$ are present, they may be the same or different.]

$n^{H1}$ is preferably an integer of 0 or more and 5 or less, more preferably an integer of 0 or more and 3 or less, further preferably 1 or 2, particularly preferably 1.

$Ar^{H1}$ and $Ar^{H2}$ are each preferably an aryl group or a monovalent hetero ring group not containing a nitrogen atom having a double bond as a ring constituent atom, and these groups optionally have a substituent.

The examples and the preferable range of the aryl group represented by $Ar^{H1}$ and $Ar^{H2}$ are the same as the examples and the preferable range of the aryl group as the substituent which $Ar^{T1}$ optionally has, respectively.

The monovalent hetero ring group not containing a nitrogen atom having a double bond as a ring constituent atom denotes a group obtained by removing from a hetero ring not containing a nitrogen atom having a double bond as a ring constituent atom one hydrogen atom bonding directly to a carbon atom or a hetero atom constituting the ring.

In the monovalent hetero ring group not containing a nitrogen atom having a double bond as a ring constituent atom represented by $Ar^{H1}$ and $Ar^{H2}$, the examples and the preferable range of the hetero ring not containing a nitrogen atom having a double bond as a ring constituent atom are the same as the examples and the preferable range of the hetero ring not containing a nitrogen atom having a double bond as a ring constituent atom represented by the ring $R^{T1}$ and the ring $R^{T2}$.

In the substituted amino group represented by $Ar^{H1}$ and $Ar^{H2}$, the substituent which the amino group has is preferably an aryl group or a monovalent hetero ring group not containing a nitrogen atom having a double bond as a ring constituent atom, more preferably an aryl group, and these groups optionally further have a substituent. The examples and the preferable range of the aryl group as the substituent which the amino group has are the same as the examples and the preferable range of the aryl group as the substituent which $Ar^{T1}$ optionally has. The examples and the preferable range of the monovalent hetero ring group not containing a nitrogen atom having a double bond as a ring constituent atom as the substituent which the amino group has are the same as the examples and the preferable range of the monovalent hetero ring group not containing a nitrogen atom having a double bond as a ring constituent atom represented by $Ar^{H1}$ and $Ar^{H2}$.

$Ar^{H1}$ and $Ar^{H2}$ are each preferably a group obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring, a pyrrole ring, a furan ring, a thiophene ring, a silole ring, a phosphole ring, an indole ring, a benzofuran ring, a benzothiophene ring, a benzosilole ring, a benzophosphole ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring, an acridone ring, a phenazine ring, a 5,10-dihydrophenazine ring and a ring obtained by condensing these rings one hydrogen atom bonding directly to a carbon atom or a hetero atom constituting the ring, more preferably a group obtained by removing from a benzene ring, a naphthalene ring, an anthracene ring, a phenanthrene ring, a dihydrophenanthrene ring, a fluorene ring, a spirobifluorene ring, an indole ring, a benzofuran ring, a benzothiophene ring, a carbazole ring, a dibenzofuran ring, a dibenzothiophene ring, a phenoxazine ring, a phenothiazine ring, a 9,10-dihydroacridine ring or a 5,10-dihydrophenazine ring one hydrogen atom bonding directly to a carbon atom or a hetero atom constituting the ring, further preferably a group obtained by removing from a benzene ring, a naphthalene ring, a fluorene ring, a spirobifluorene ring, a carbazole ring, a dibenzofuran ring, a dibenzothiophene ring, a phenoxazine ring, a phenothiazine ring, a 9,10-dihydroacridine ring or a 5,10-dihydrophenazine ring one hydrogen atom bonding directly to a carbon atom or a hetero atom constituting the ring, particularly preferably a group obtained by removing from a benzene ring, a fluorene ring, a spirobifluorene ring, a carbazole ring, a dibenzofuran ring or a dibenzothiophene ring one hydrogen atom bonding directly to a carbon atom or a hetero atom constituting the ring, especially preferably a group obtained by removing from a carbazole ring, a dibenzofuran ring or a dibenzothiophene ring one hydrogen atom bonding directly to a carbon atom or a hetero atom constituting the ring, and these groups optionally have a substituent, since the driving voltage of the light emitting device of the present invention is further lowered.

$L^{H1}$ is preferably an arylene group or a divalent hetero ring group not containing a nitrogen atom having a double bond as a ring constituent atom, and these groups optionally have a substituent.

The examples and the preferable range of the alkylene group and the cycloalkylene group represented by $L^{H1}$ are the same as the examples and the preferable range of the alkylene group and the cycloalkylene group represented by $L^A$ described later, respectively.

The divalent hetero ring group not containing a nitrogen atom having a double bond as a ring constituent atom denotes a group obtained by removing from a hetero ring not containing a nitrogen atom having a double bond as a ring constituent atom two hydrogen atoms bonding directly to carbon atoms or hetero atoms constituting the ring.

In the divalent hetero ring group not containing a nitrogen atom having a double bond as a ring constituent atom represented by $L^{H1}$, the examples and the preferable range of the hetero ring not containing a nitrogen atom having a double bond as a ring constituent atom are the same as the examples and the preferable range of the hetero ring not containing a nitrogen atom having a double bond as a ring constituent atom represented by the ring $R^{T1}$ and the ring $R^{T2}$.

$L^{H1}$ is preferably a group obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring, a pyrrole ring, a furan ring, a thiophene ring, a silole ring, a phosphole ring, an indole ring, a benzofuran ring, a benzothiophene ring, a benzosilole ring, a benzophosphole ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring, an acridone ring, a phenazine ring, a 5,10-dihydrophenazine ring and a ring obtained by condensing these rings two hydrogen atoms bonding directly to carbon atoms or hetero atoms constituting the ring, more preferably a group obtained by removing from a benzene ring, a naphthalene ring, an anthracene ring, a phenanthrene ring, a dihydrophenanthrene ring, a fluorene ring, a spirobifluorene ring, an indole ring, a benzofuran ring, a benzothiophene ring, a carbazole ring, a dibenzofuran ring, a dibenzothiophene ring, a phenoxazine ring, a phenothiazine ring, a 9,10-dihydroacridine ring or a 5,10-dihydrophenazine ring two hydrogen atoms bonding directly to carbon atoms or hetero atoms constituting the ring, further preferably a group obtained by removing from a benzene ring, a naphthalene ring, a fluorene ring, a spirobifluorene ring, a carbazole ring, a dibenzofuran ring, a dibenzothiophene ring, a phenoxazine ring, a phenothiazine ring, a 9,10-dihydroacridine ring or a 5,10-dihydrophenazine ring two hydrogen atoms bonding directly to carbon atoms or hetero atoms constituting the ring, particularly preferably a group obtained by removing from a benzene ring, a fluorene ring, a spirobifluorene ring, a carbazole ring, a dibenzofuran ring or a dibenzothiophene ring two hydrogen atoms bonding directly to carbon atoms or hetero atoms constituting the ring, especially preferably a group obtained by removing from a carbazole ring, a dibenzofuran ring or a dibenzothiophene ring two hydrogen atoms bonding directly to carbon atoms or hetero atoms constituting the ring, and these groups optionally have a substituent, since the driving voltage of the light emitting device of the present invention is further lowered.

The substituent which $Ar^{H1}$, $Ar^{H2}$ and $L^{H1}$ optionally have is preferably an alkyl group, a cycloalkyl group, an alkoxy group, a cycloalkoxy group, an aryl group, a substituted amino group or a monovalent hetero ring group not containing a nitrogen atom having a double bond as a ring constituent atom, more preferably an alkyl group, a cycloalkyl group, an aryl group, a substituted amino group or a monovalent hetero ring group not containing a nitrogen atom having a double bond as a ring constituent atom, further preferably an alkyl group, a cycloalkyl group, an aryl group or a monovalent hetero ring group not containing a nitrogen atom having a double bond as a ring constituent atom, particularly preferably an alkyl group or a cycloalkyl group, and these groups optionally further have a substituent.

The examples and the preferable range of the aryl group, the substituted amino group and the monovalent hetero ring group not containing a nitrogen atom having a double bond as a ring constituent atom as the substituent which $Ar^{H1}$, $Ar^{H2}$ and $L^{H1}$ optionally have are the same as the examples and the preferable range of the aryl group, the substituted amino group and the monovalent hetero ring group not containing a nitrogen atom having a double bond as a ring constituent atom represented by $Ar^{H1}$ and $Ar^{H2}$, respectively.

The substituent which the substituent which $Ar^{H1}$, $Ar^{H2}$ and $L^{H1}$ optionally have optionally further hast is preferably an alkyl group, a cycloalkyl group, an alkoxy group, a cycloalkoxy group, an aryl group, a monovalent hetero ring group not containing a nitrogen atom having a double bond as a ring constituent atom or a substituted amino group, more preferably an alkyl group, a cycloalkyl group, an aryl group or a monovalent hetero ring group not containing a nitrogen atom having a double bond as a ring constituent atom, further preferably an alkyl group or a cycloalkyl group.

The examples and the preferable range of the aryl group, the substituted amino group and the monovalent hetero ring group not containing a nitrogen atom having a double bond as a ring constituent atom as the substituent which the substituent which $Ar^{H1}$, $Ar^{H2}$ and $L^{H1}$ optionally have optionally further has are the same as the examples and the preferable range of the aryl group, the substituted amino group and the monovalent hetero ring group not containing a nitrogen atom having a double bond as a ring constituent atom represented by $Ar^{H1}$ and $Ar^{H2}$, respectively.

[Chemical Formula 48]

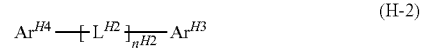

(H-2)

[wherein, $n^{H2}$ represents an integer of 1 or more and 10 or less.

$Ar^{H3}$ and $Ar^{H4}$ each independently represent a hydrogen atom, a halogen atom, a cyano group, an alkyl group, a cycloalkyl group, an alkoxy group, a cycloalkoxy group, an aryloxy group, an aryl group, a substituted amino group or a single-ring or condensed-ring monovalent hetero ring group containing a nitrogen atom having a double bond as a ring constituent atom, and these groups optionally have a substituent.

$L^{H2}$ represents an alkylene group, a cycloalkylene group, an arylene group or a single-ring or condensed-ring divalent hetero ring group containing a nitrogen atom having a double bond as a ring constituent atom, and these groups optionally have a substituent. When a plurality of $L^{H2}$ are present, they may be the same or different. However, at least one of $L^{H2}$ is a single-ring or condensed-ring divalent hetero ring group containing a nitrogen atom having a double bond as a ring constituent atom.].

$n^{H2}$ is preferably an integer of 1 or more and 5 or less, more preferably an integer of 1 or more and 3 or less, further preferably 1 or 2, particularly preferably 1.

$Ar^{H3}$ and $Ar^{H4}$ are each preferably a hydrogen atom, an alkyl group, a cycloalkyl group, an alkoxy group, a cycloalkoxy group, an aryl group or a single-ring or condensed-ring monovalent hetero ring group containing a nitrogen atom having a double bond as a ring constituent atom, more preferably an alkyl group, a cycloalkyl group, an aryl group or a single-ring or condensed-ring monovalent hetero ring group containing a nitrogen atom having a double bond as a ring constituent atom, further preferably an aryl group or a single-ring or condensed-ring monovalent hetero ring group containing a nitrogen atom having a double bond as a ring constituent atom, particularly preferably an aryl group, and these groups optionally have a substituent, since the driving voltage of the light emitting device of the present invention is further lowered.

The examples and the preferable range of the aryl group represented by $Ar^{H3}$ and $Ar^{H4}$ are the same as the examples and the preferable range of the aryl group as the substituent which $Ar^{T1}$ optionally has.

The single-ring or condensed-ring monovalent hetero ring group containing a nitrogen atom having a double bond as a ring constituent atom represented by $Ar^{H3}$ and $Ar^{H4}$ is a single-ring or condensed-ring group containing a nitrogen atom having a double bond as a ring constituent atom in which one hydrogen atom bonding directly to a carbon atom or a hetero atom constituting the ring is removed.

In the substituted amino group represented by $Ar^{H3}$ and $Ar^{H4}$, the substituent which the amino group has is preferably an aryl group or a single-ring or condensed-ring monovalent hetero ring group containing a nitrogen atom having a double bond as a ring constituent atom, more preferably an aryl group, and these groups optionally further have a substituent. The examples and the preferable range of the aryl group as the substituent which the amino group has are the same as the examples and the preferable range of the aryl group as the substituent which $Ar^{T1}$ optionally has.

$L^{H2}$ is preferably an arylene group or a single-ring or condensed-ring divalent hetero ring group containing a nitrogen atom having a double bond as a ring constituent atom, more preferably a single-ring or condensed-ring divalent hetero ring group containing a nitrogen atom having a double bond as a ring constituent atom, and these groups optionally have a substituent.

The single-ring or condensed-ring divalent hetero ring group containing a nitrogen atom having a double bond as a ring constituent atom is a single-ring or condensed-ring hetero ring group containing a nitrogen atom having a double bond as a ring constituent atom in which two hydrogen atoms bonding directly to carbon atoms or hetero atoms constituting the ring are removed.

The examples and the preferable range of the arylene group represented by $L^{H2}$ are the same as the examples and the preferable range of the arylene group represented by $L^{T1}$.

The examples and the preferable range of the alkylene group and the cycloalkylene group represented by $L^{H2}$ are the same as the examples and the preferable range of the alkylene group and the cycloalkylene group represented by $L^A$ described later, respectively.

The examples and the preferable range of the arylene group represented by $L^{H2}$ are the same as the examples and the preferable range of the arylene group represented by $L^{T1}$.

The substituent which $L^{H2}$, $Ar^{H3}$ and $Ar^{H4}$ optionally have is an alkyl group, a cycloalkyl group, an alkoxy group, a cycloalkoxy group, an aryl group, a substituted amino group or a single-ring or condensed-ring monovalent hetero ring group containing a nitrogen atom having a double bond as a ring constituent atom, more preferably an alkyl group, a cycloalkyl group, an aryl group or a single-ring or condensed-ring monovalent hetero ring group containing a nitrogen atom having a double bond as a ring constituent atom, further preferably an alkyl group, a cycloalkyl group or an aryl group, and these groups optionally further have a substituent.

The examples, the definition and the preferable range of the aryl group, the substituted amino group and the single-ring or condensed-ring monovalent hetero ring group containing a nitrogen atom having a double bond as a ring constituent atom as the substituent which $L^{H2}$, $Ar^{H3}$ and $Ar^{H4}$ optionally have are the same as the examples, the definition and the preferable range the aryl group, the substituted amino group and the single-ring or condensed-ring monovalent hetero ring group containing a nitrogen atom having a double bond as a ring constituent atom represented by $Ar^{H3}$ and $Ar^{H4}$, respectively.

The substituent which the substituent which $L^{H2}$, $Ar^{H3}$ and $Ar^{H4}$ optionally have optionally further has is preferably an alkyl group, a cycloalkyl group, an alkoxy group, a cycloalkoxy group, an aryl group, a substituted amino group or a single-ring or condensed-ring monovalent hetero ring group containing a nitrogen atom having a double bond as a ring constituent atom, more preferably an alkyl group, a cycloalkyl group, an aryl group or a single-ring or condensed-ring monovalent hetero ring group containing a nitrogen atom having a double bond as a ring constituent atom, further preferably an alkyl group or a cycloalkyl group.

The examples, the definition and the preferable range the aryl group, the substituted amino group and the single-ring or condensed-ring monovalent hetero ring group containing a nitrogen atom having a double bond as a ring constituent atom as the substituent which the substituent which $L^{H2}$, $Ar^{H3}$ and $Ar^{H4}$ optionally have optionally further has are the same as the examples, the definition and the preferable range of the aryl group, the substituted amino group and the single-ring or condensed-ring monovalent hetero ring group containing a nitrogen atom having a double bond as a ring constituent atom represented by $Ar^{H3}$ and $Ar^{H4}$, respectively.

As the compound represented by the formula (H-1), compounds represented by the formula (H-101) to the formula (H-106) and the formula (H-113) to the formula (H-118) are exemplified. As the compound represented by the formula (H-2), compounds represented by the formula (H-107) to the formula (H-112) are exemplified.

[Chemical Formula 49]

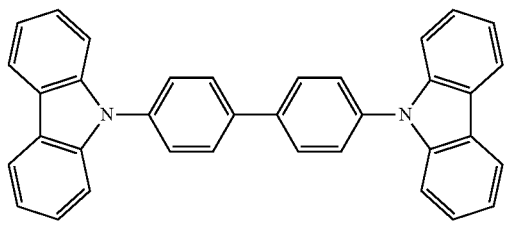

(H-101)

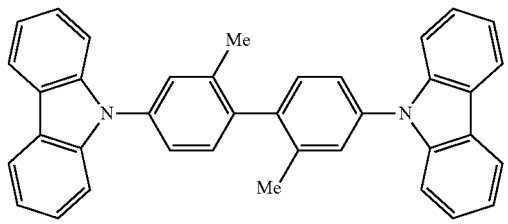

(H-102)

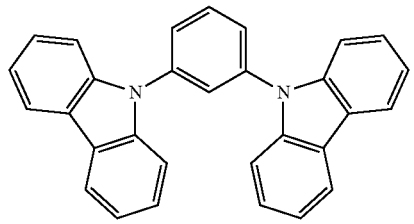

(H-103)

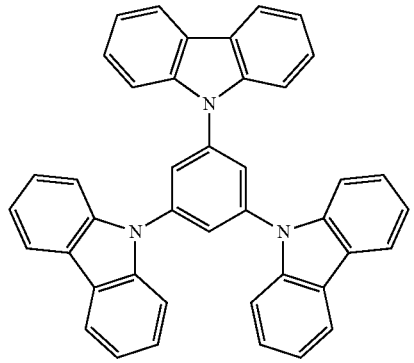

(H-104)

-continued
(H-105)
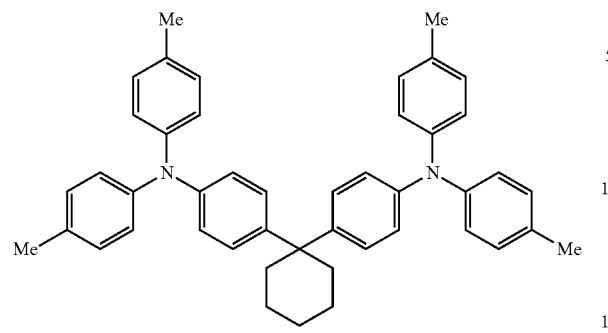
(H-106)
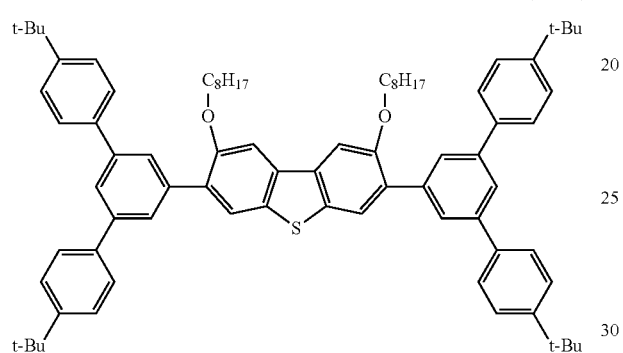
[Chemical Formula 50]
(H-107)
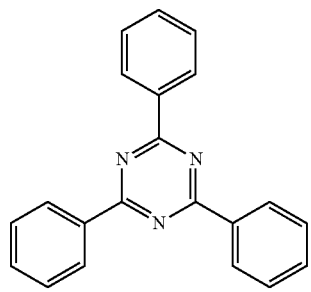
(H-108)
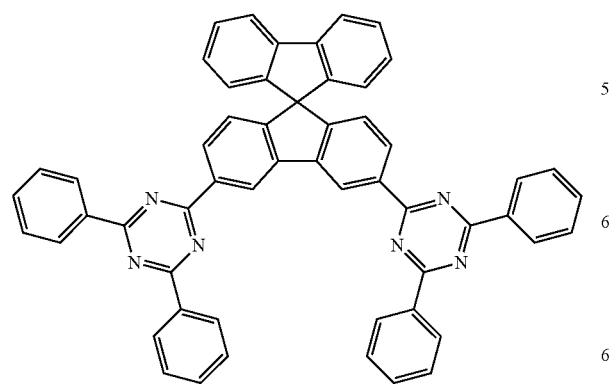
-continued
(H-109)
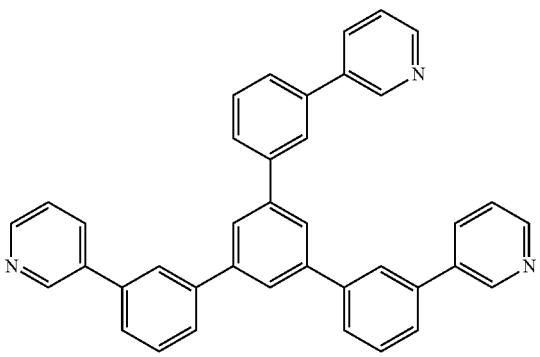
(H-110)
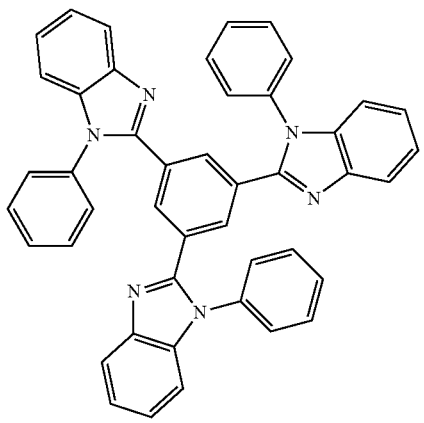
(H-111)
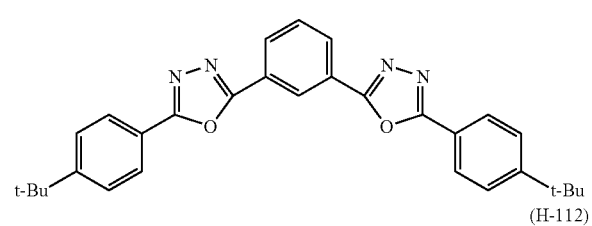
(H-112)
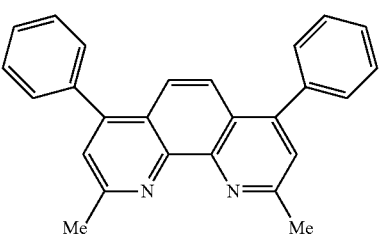

[Chemical Formula 51]

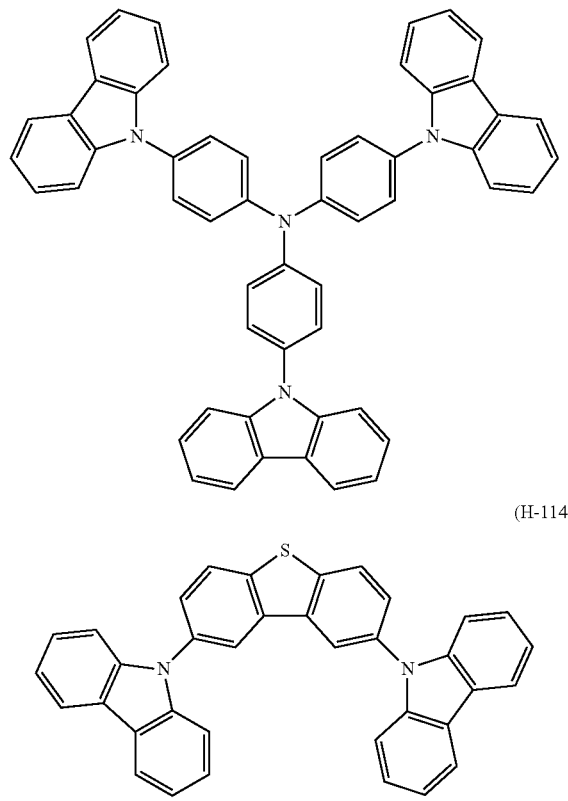

(H-113)

(H-114)

[Chemical Formula 52]

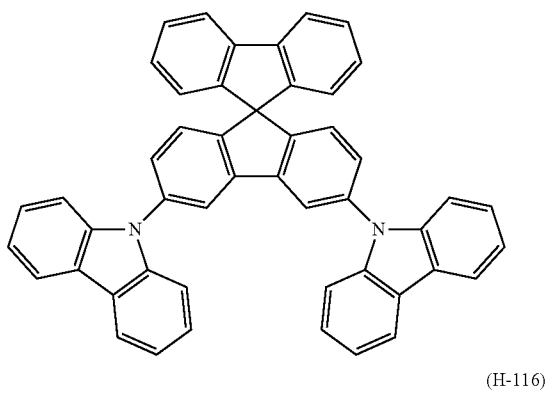

(H-115)

(H-116)

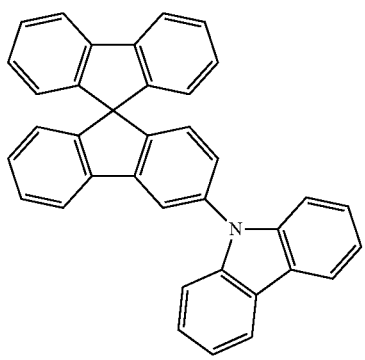

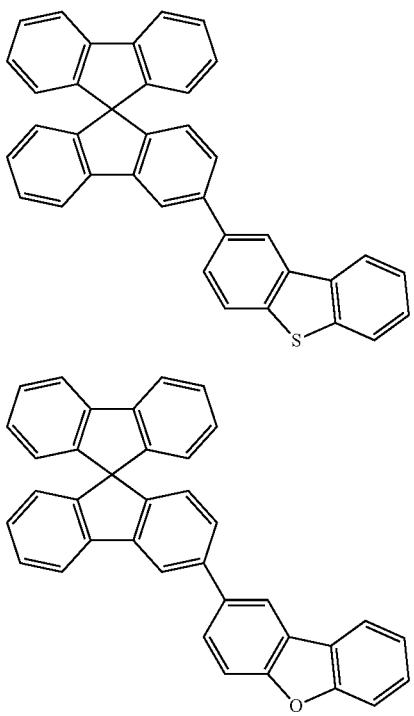

(H-117)

(H-118)

The polymer compound used as the host material includes, for example, a polymer compound described later as a hole transporting material and a polymer compound described later as an electron transporting material.

[Polymer Host]

The polymer compound which is preferable as the host compound (hereinafter, referred to as "polymer host") is preferably a polymer compound containing a constitutional unit represented by the formula (Y).

The arylene group represented by $Ar^{Y1}$ is more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19), and these groups optionally have a substituent.

The divalent hetero ring group represented by $Ar^{Y1}$ is more preferably a group represented by the formula (AA-1) to the formula (AA-4), the formula (AA-10) to the formula (AA-15), the formula (AA-18) to the formula (AA-21), the formula (AA-33) or the formula (AA-34), further preferably a group represented by the formula (AA-4), the formula (AA-10), the formula (AA-12), the formula (AA-14) or the formula (AA-33), and these groups optionally have a substituent.

In the divalent group in which at least one arylene group and at least one divalent hetero ring group are bonded directly represented by $Ar^{Y1}$, the more preferable range and the further preferable range of the arylene group and the divalent hetero ring group are the same as the more preferable range and the further preferable range of the arylene group and the divalent hetero ring group represented by $Ar^{Y1}$ described above, respectively.

"Divalent group in which at least one arylene group and at least one divalent hetero ring group are bonded directly" includes, for example, groups represented by the following formulae, and these groups optionally have a substituent.

[Chemical Formula 53]

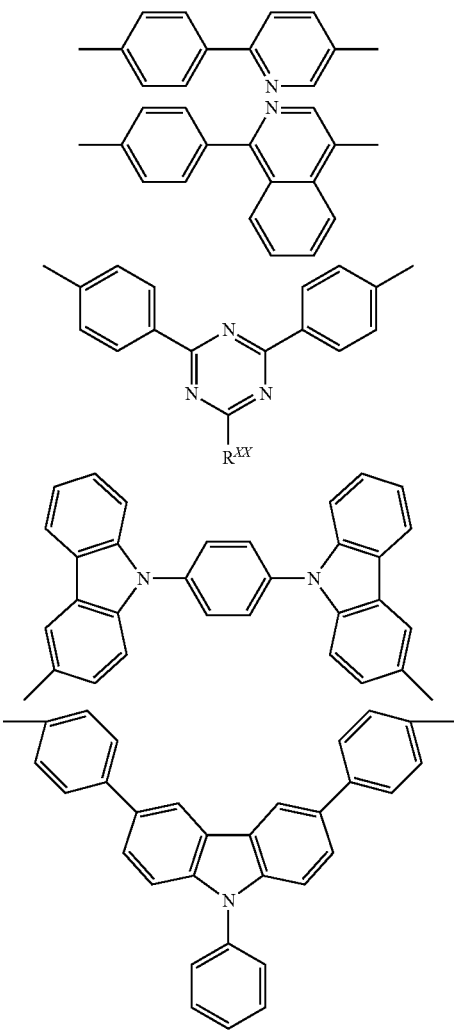

[wherein, $R^{XX}$ represents a hydrogen atom, an alkyl group, a cycloalkyl group, an aryl group or a monovalent hetero ring group, and these groups optionally have a substituent.]

$R^{XX}$ is preferably an alkyl group, a cycloalkyl group or an aryl group, and these groups optionally have a substituent.

The substituent which the group represented by $Ar^{Y1}$ optionally has is preferably an alkyl group, a cycloalkyl group or an aryl group, and these groups optionally further have a substituent.

The constitutional unit represented by the formula (Y) includes, for example, constitutional units represented by the formula (Y-1) to the formula (Y-10), and is preferably a constitutional unit represented by the formula (Y-1) to the formula (Y-3) from the standpoint of the driving voltage of the light emitting device of the present invention, preferably a constitutional unit represented by the formula (Y-4) to the formula (Y-7) from the standpoint of the electron transportability of the light emitting device of the present invention, and preferably a constitutional unit represented by the formula (Y-8) to the formula (Y-10) from the standpoint of the hole transportability of the light emitting device of the present invention.

[Chemical Formula 54]

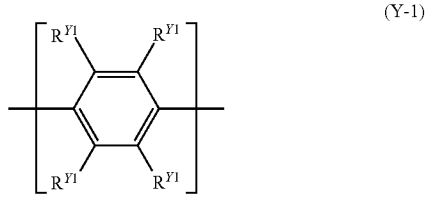

(Y-1)

[wherein, $R^{Y1}$ represents a hydrogen atom, an alkyl group, a cycloalkyl group, an alkoxy group, a cycloalkoxy group, an aryl group or a monovalent hetero ring group, and these groups optionally have a substituent. A plurality of $R^{Y1}$ may be the same or different, and adjacent $R^{Y1}$ may be combined together to form a ring together with carbon atoms to which they are attached.]

$R^{Y1}$ is preferably a hydrogen atom, an alkyl group, a cycloalkyl group or an aryl group, and these groups optionally have a substituent.

The constitutional unit represented by the formula (Y-1) is preferably a constitutional unit represented by the formula (Y-1').

[Chemical Formula 55]

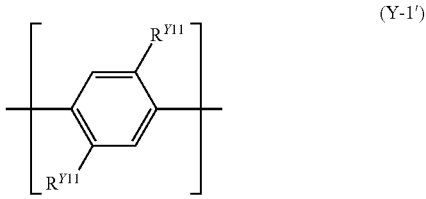

(Y-1')

[wherein, $R^{Y11}$ represents an alkyl group, a cycloalkyl group, an alkoxy group, a cycloalkoxy group, an aryl group or a monovalent hetero ring group, and these groups optionally have a substituent. A plurality of $R^{Y11}$ may be the same or different.]

$R^{Y11}$ is preferably an alkyl group, a cycloalkyl group or an aryl group, more preferably an alkyl group or a cycloalkyl group, and these groups optionally have a substituent.

[Chemical Formula 56]

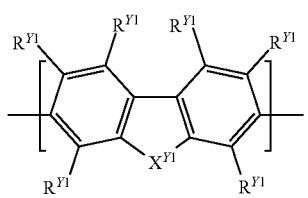

(Y-2)

[wherein, $R^{Y1}$ represents the same meaning as described above.

$X^{Y1}$ represents a group represented by —C($R^{Y2}$)$_2$—, —C($R^{Y2}$)=C($R^{Y2}$)— or —C($R^{Y2}$)$_2$—C($R^{Y2}$)$_2$—. $R^{Y2}$ represents a hydrogen atom, an alkyl group, a cycloalkyl group, an alkoxy group, a cycloalkoxy group, an aryl group or a monovalent hetero ring group, and these groups optionally have a substituent. A plurality of $R^{Y2}$ may be the same or different, and groups $R^{Y2}$ may be combined together to form a ring together with carbon atoms to which they are attached.]

$R^{Y2}$ is preferably an alkyl group, a cycloalkyl group, an aryl group or a monovalent hetero ring group, more preferably an alkyl group, a cycloalkyl group or an aryl group, and these groups optionally have a substituent.

In $X^{Y1}$, the combination of two groups $R^{Y2}$ in the group represented by —C($R^{Y2}$)$_2$— is preferably a combination in which both represent an alkyl group or a cycloalkyl group, both represent an aryl group, both represent a monovalent hetero ring group, or one represents an alkyl group or a cycloalkyl group and the other represents an aryl group or a monovalent hetero ring group, more preferably a combination in which one represents an alkyl group or a cycloalkyl group and the other represents an aryl group, and these groups optionally have a substituent. Two groups $R^{Y2}$ may be combined together to form a ring together with atoms to which they are attached, and when $R^{Y2}$ forms a ring, the group represented by —C($R^{Y2}$)$_2$— is preferably a group represented by the formula (Y-A1) to the formula (Y-A5), more preferably a group represented by the formula (Y-A4), and these groups optionally have a substituent.

[Chemical Formula 57]

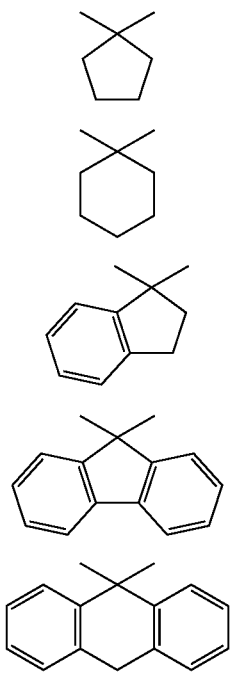

In $X^{Y1}$, the combination of two groups $R^{Y2}$ in the group represented by —C($R^{Y2}$)=C($R^{Y2}$)— is preferably a combination in which both represent an alkyl group or a cycloalkyl group, or one represents an alkyl group or a cycloalkyl group and the other represents an aryl group, and these groups optionally have a substituent.

In $X^{Y1}$, four groups $R^{Y2}$ in the group represented by —C($R^{Y2}$)$_2$—C($R^{Y2}$)$_2$— represent preferably an alkyl group or a cycloalkyl group optionally having a substituent. A plurality of $R^{Y2}$ may be combined together to form a ring together with atoms to which they are attached, and when $R^{Y2}$ forms a ring, the group represented by —C($R^{Y2}$)$_2$—C($R^{Y2}$)$_2$— is preferably a group represented by the formula (Y-B1) to the formula (Y-B5), more preferably a group represented by the formula (Y-B3), and these groups optionally have a substituent.

[Chemical Formula 58]

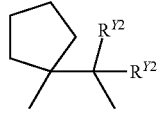

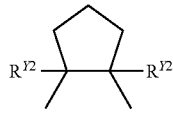

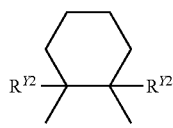

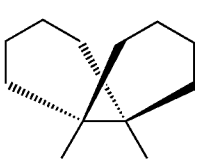

[wherein, $R^{Y2}$ represents the same meaning as described above.]

The constitutional unit represented by the formula (Y-2) is preferably a constitutional unit represented by the formula (Y-2').

[Chemical Formula 59]

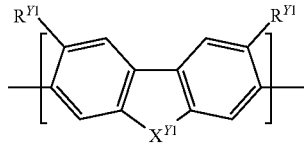

[wherein, $R^{Y1}$ and $X^{Y1}$ represent the same meaning as described above.]

[Chemical Formula 60]

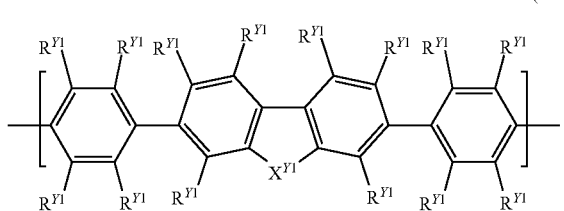

[wherein, $R^{Y1}$ and $X^{Y1}$ represent the same meaning as described above.]

The constitutional unit represented by the formula (Y-3) is preferably a constitutional unit represented by the formula (Y-3').

[Chemical Formula 61]

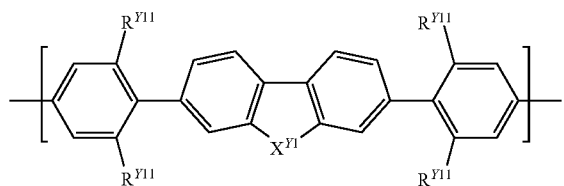

(Y-3')

[wherein, $R^{Y11}$ and $X^{Y1}$ represent the same meaning as described above.]

[Chemical Formula 62]

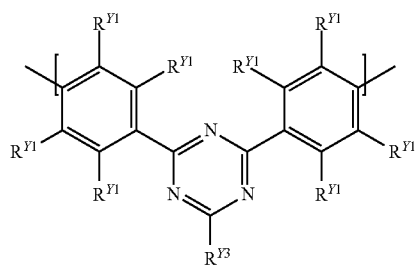

(Y-4)

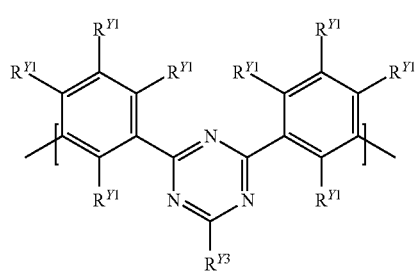

(Y-5)

[Chemical Formula 63]

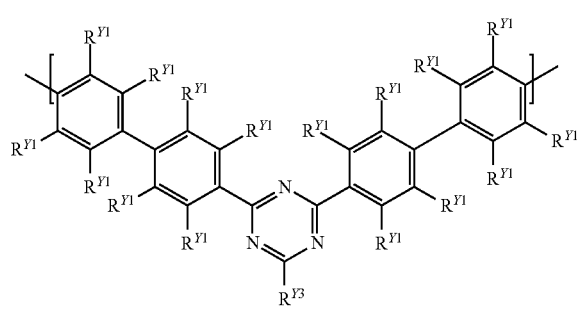

(Y-6)

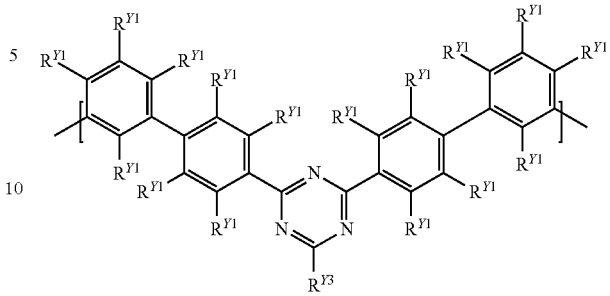

(Y-7)

[wherein,
$R^{Y1}$ represents the same meaning as described above.
$R^{Y3}$ represents a hydrogen atom, an alkyl group, a cycloalkyl group, an alkoxy group, a cycloalkoxy group, an aryl group or a monovalent hetero ring group, and these groups optionally have a substituent.]

$R^{Y3}$ is preferably an alkyl group, a cycloalkyl group, an alkoxy group, a cycloalkoxy group, an aryl group or a monovalent hetero ring group, more preferably an aryl group, and these groups optionally have a substituent.

The constitutional unit represented by the formula (Y-4) is preferably a constitutional unit represented by the formula (Y-4'), and the constitutional unit represented by the formula (Y-6) is preferably a constitutional unit represented by the formula (Y-6').

[Chemical Formula 64]

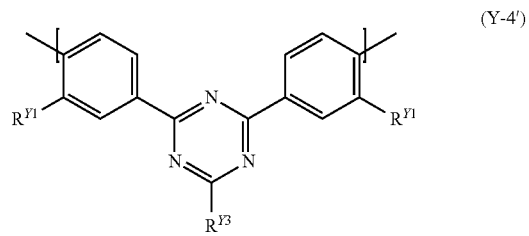

(Y-4')

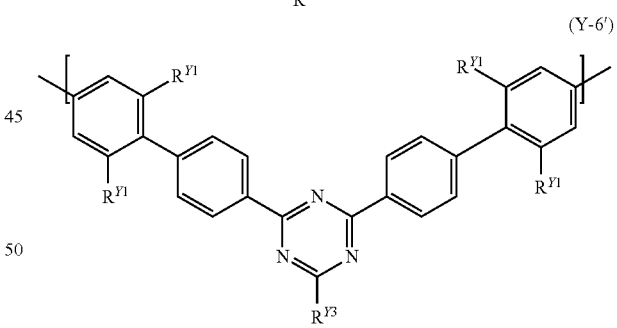

(Y-6')

[wherein, $R^{Y1}$ and $R^{Y3}$ represent the same meaning as described above.]

[Chemical Formula 65]

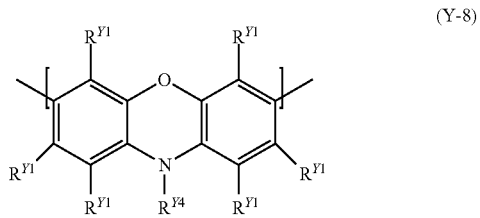

(Y-8)

-continued

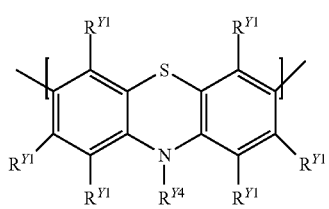
(Y-9)

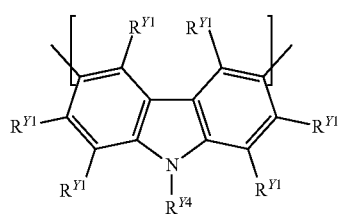
(Y-10)

[wherein,
R$^{Y1}$ represents the same meaning as described above.
R$^{Y4}$ represents a hydrogen atom, an alkyl group, a cycloalkyl group, an alkoxy group, a cycloalkoxy group, an aryl group or a monovalent hetero ring group, and these groups optionally have a substituent.]

R$^{Y4}$ is preferably an alkyl group, a cycloalkyl group, an alkoxy group, a cycloalkoxy group, an aryl group or a monovalent hetero ring group, more preferably an aryl group, and these groups optionally have a substituent.

The constitutional unit represented by the formula (Y) includes, for example, a constitutional unit composed of the arylene group represented by the formula (Y-101) to the formula (Y-121), a constitutional unit composed of the divalent hetero ring group represented by the formula (Y-201) to the formula (Y-206) and a constitutional unit composed of the divalent group in which at least one arylene group and at least one divalent hetero ring group are bonded directly represented by the formula (Y-300) to the formula (Y-304).

[Chemical Formula 66]

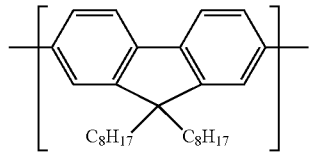
(Y-101)

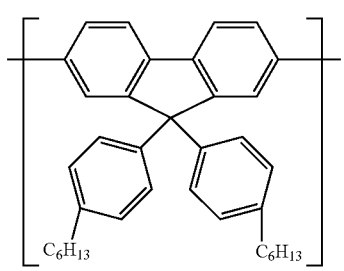
(Y-102)

-continued

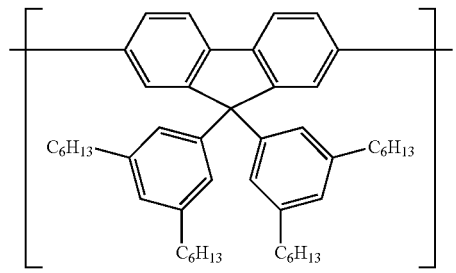
(Y-103)

[Chemical Formula 67]

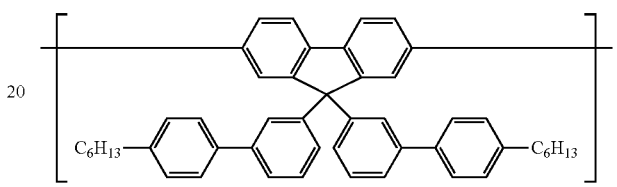
(Y-104)

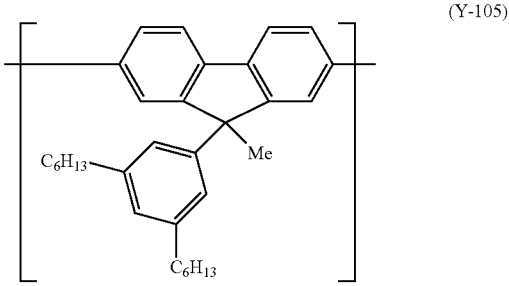
(Y-105)

[Chemical Formula 68]

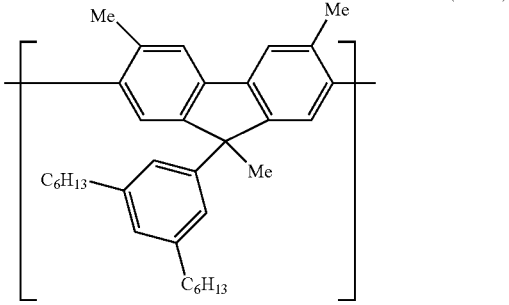
(Y-106)

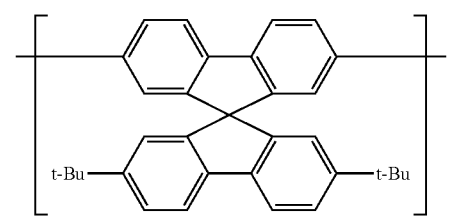
(Y-107)

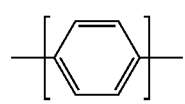
(Y-108)

-continued
(Y-109) 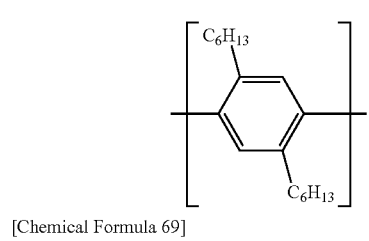
[Chemical Formula 69]
(Y-110) 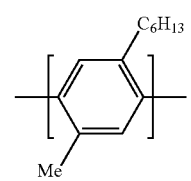
(Y-111) 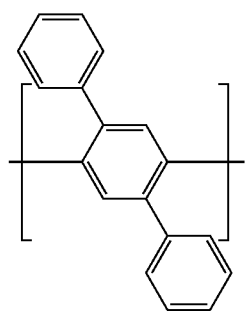
(Y-112) 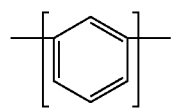
(Y-113) 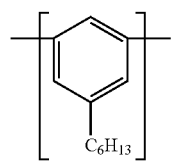
(Y-114) 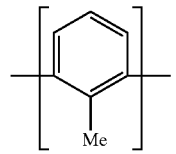
[Chemical Formula 70]
(Y-115) 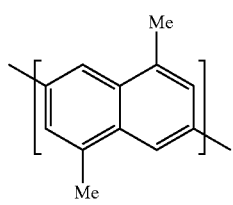
(Y-116) 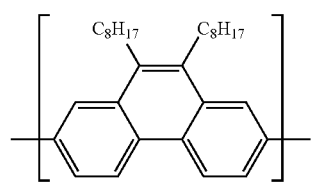
(Y-117) 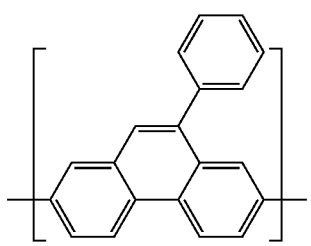
(Y-118) 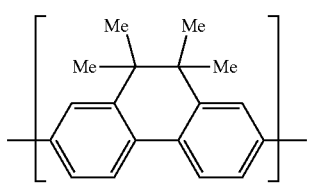
[Chemical Formula 71]
(Y-119) 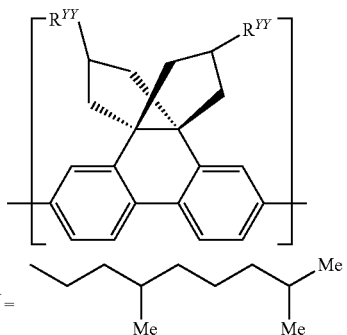
(Y-120) 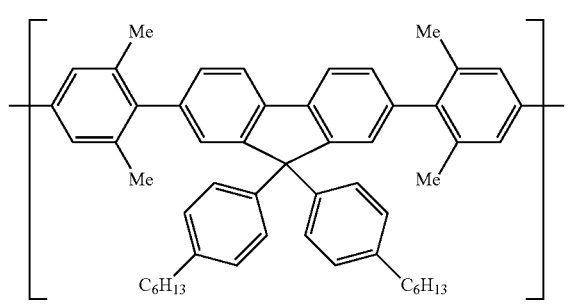
(Y-121) 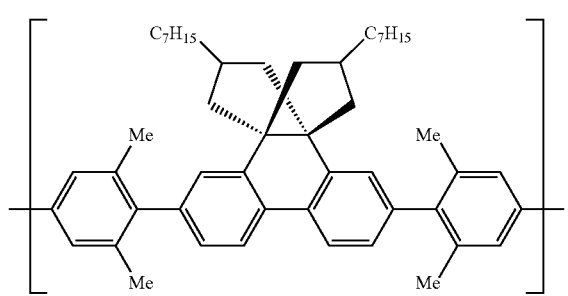

-continued
[Chemical Formula 72]
(Y-201)
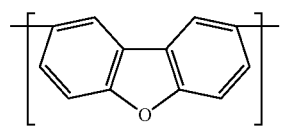
(Y-202)
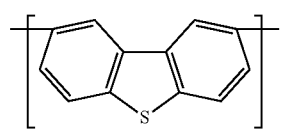
(Y-203)
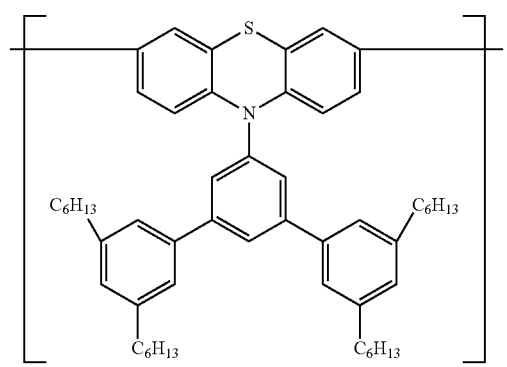
(Y-204)
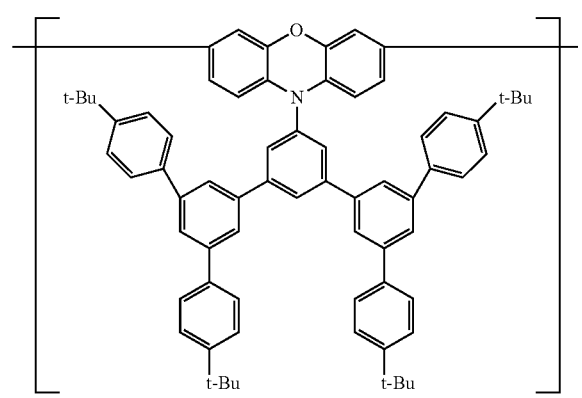
[Chemical Formula 73]
(Y-205)
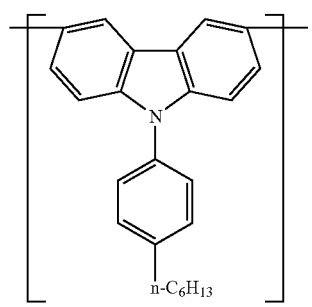
-continued
(Y-206)
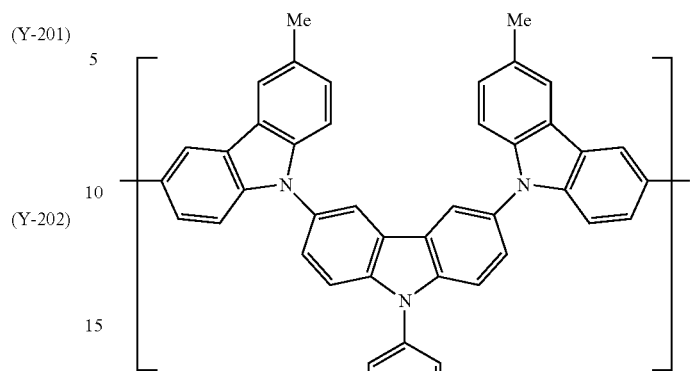
(Y-300)
[Chemical Formula 74]
(Y-301)
(Y-302)
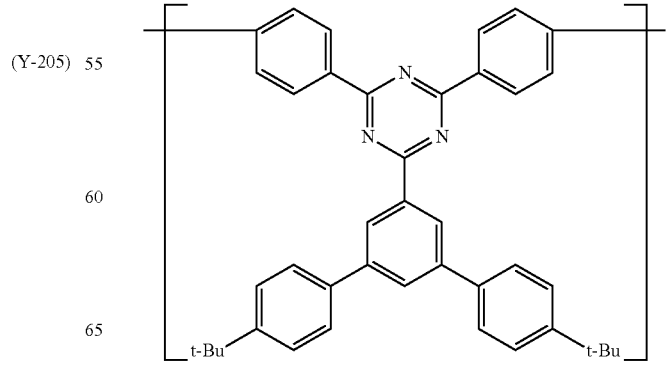

(Y-303)

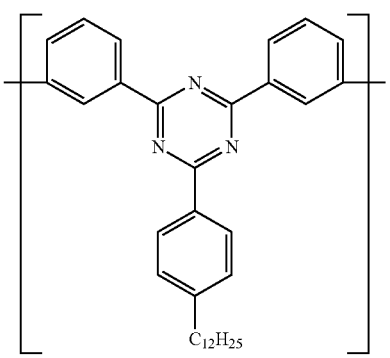

(Y-304)

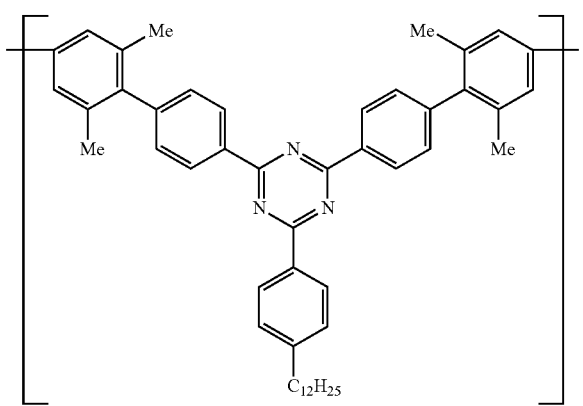

The amount of the constitutional unit represented by the formula (Y) in which $Ar^{Y1}$ is an arylene group is preferably 0.5 to 90% by mol, more preferably 30 to 80% by mol with respect to the total amount of constitutional units contained in the polymer host, since the driving voltage of the light emitting device of the present invention lowers.

The amount of the constitutional unit represented by the formula (Y) in which $Ar^{Y1}$ is a divalent hetero ring group or a divalent group in which at least one arylene group and at least one divalent hetero ring group are bonded directly is preferably 0.5 to 40% by mol, more preferably 3 to 30% by mol with respect to the total amount of constitutional units contained in the polymer host, since the light emitting device of the present invention is excellent in charge transportability.

The constitutional unit represented by the formula (Y) may be contained only singly or in combination of two or more kinds thereof in the polymer host.

It is preferable that the polymer host further contains a constitutional unit represented by the following formula (X), since excellent hole transportability is obtained.

[Chemical Formula 75]

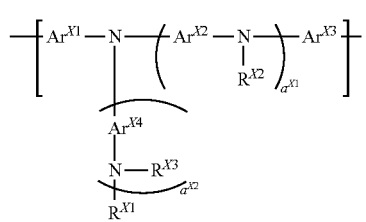

(X)

[wherein, $a^{X1}$ and $a^{X2}$ each independently represent an integer of 0 or more.

$Ar^{X1}$ and $Ar^{X3}$ each independently represent an arylene group or a divalent hetero ring group, and these groups optionally have a substituent.

$Ar^{X2}$ and $Ar^{X4}$ each independently represent an arylene group, a divalent hetero ring group or a divalent group in which at least one arylene group and at least one divalent hetero ring group are bonded directly, and these groups optionally have a substituent. When a plurality of $Ar^{X2}$ and $Ar^{X4}$ are present, they may be the same or different at each occurrence.

$R^{X1}$, $R^{X2}$ and $R^{X3}$ each independently represent a hydrogen atom, an alkyl group, a cycloalkyl group, an aryl group or a monovalent hetero ring group, and these groups optionally have a substituent. When a plurality of $R^{X2}$ and $R^{X3}$ are present, they may be the same or different at each occurrence.].

$a^{X1}$ is preferably 2 or less, more preferably 1, since the driving voltage of the light emitting device of the present invention is further lowered.

$a^{X2}$ is preferably 2 or less, more preferably 0, since the driving voltage of the light emitting device of the present invention is further lowered.

$R^{X1}$, $R^{X2}$ and $R^{X3}$ are each preferably an alkyl group, a cycloalkyl group, an aryl group or a monovalent hetero ring group, more preferably an aryl group, and these groups optionally have a substituent.

The arylene group represented by $Ar^{X1}$ and $Ar^{X3}$ is more preferably a group represented by the formula (A-1) or the formula (A-9), further preferably a group represented by the formula (A-1), and these groups optionally have a substituent.

The divalent hetero ring group represented by $Ar^{X1}$ and $Ar^{X3}$ is more preferably a group represented by the formula (AA-1), the formula (AA-2) or the formula (AA-7) to the formula (AA-26), and these groups optionally have a substituent.

$Ar^{X1}$ and $Ar^{X3}$ are each preferably an arylene group optionally having a substituent.

The arylene group represented by $Ar^{X2}$ and $Ar^{X4}$ is more preferably a group represented by the formula (A-1), the formula (A-6), the formula (A-7), the formula (A-9) to the formula (A-11) or the formula (A-19), and these groups optionally have a substituent.

The more preferable range of the divalent hetero ring group represented by $Ar^{X2}$ and $Ar^{X4}$ is the same as the more preferable range of the divalent hetero ring group represented by $Ar^{X1}$ and $Ar^{X3}$.

In the divalent group in which at least one arylene group and at least one divalent hetero ring group are bonded directly represented by $Ar^{X2}$ and $Ar^{X4}$, the more preferable range and the further preferable range of the arylene group and the divalent hetero ring group are the same as the more preferable range and the further preferable range of the arylene group and the divalent hetero ring group represented by $Ar^{X1}$ and $Ar^{X3}$, respectively.

The divalent group in which at least one arylene group and at least one divalent hetero ring group are bonded directly represented by $Ar^{X2}$ and $Ar^{X4}$ includes groups which are the same as the divalent group in which at least one arylene group and at least one divalent hetero ring group are bonded directly represented by $Ar^{Y1}$ in the formula (Y).

$Ar^{X2}$ and $Ar^{X4}$ are each preferably an arylene group optionally having a substituent.

The substituent which the group represented by $Ar^{X1}$ to $Ar^{X4}$ and $R^{X1}$ to $R^{X3}$ optionally has is preferably an alkyl group, a cycloalkyl group or an aryl group, and these groups optionally further have a substituent.

The constitutional unit represented by the formula (X) is preferably a constitutional unit represented by the formula (X-1) to the formula (X-7), more preferably a constitutional unit represented by the formula (X-1) to the formula (X-6), further preferably a constitutional unit represented by the formula (X-3) to the formula (X-6).

[Chemical Formula 76]

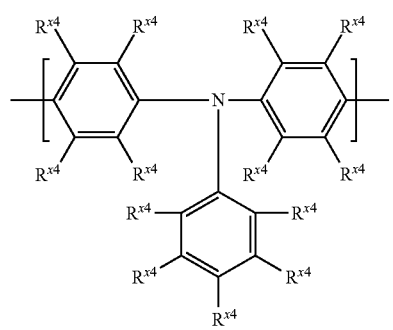

(X-1)

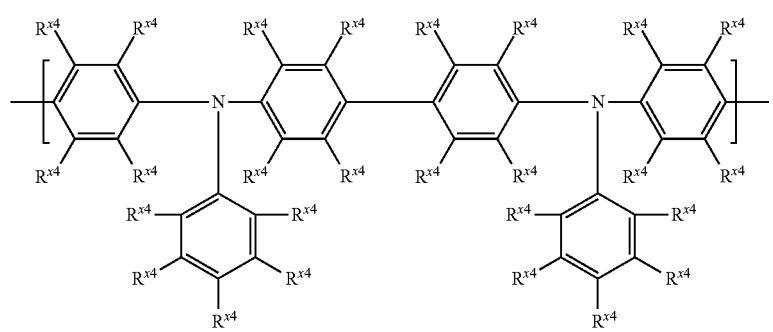

(X-2)

[Chemical Formula 77]

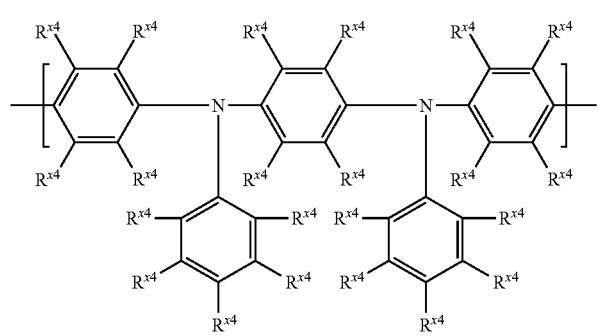

(X-3)

[Chemical Formula 78]

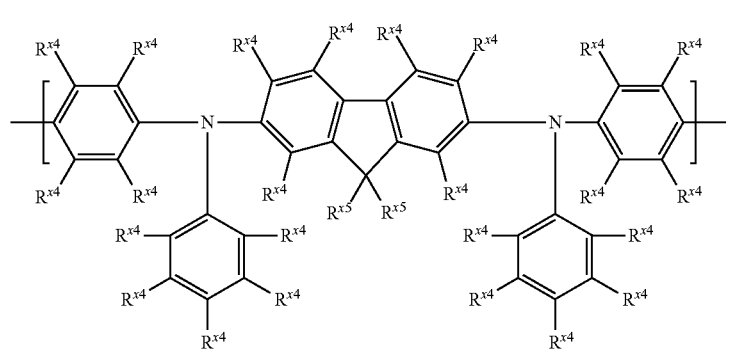

(X-4)

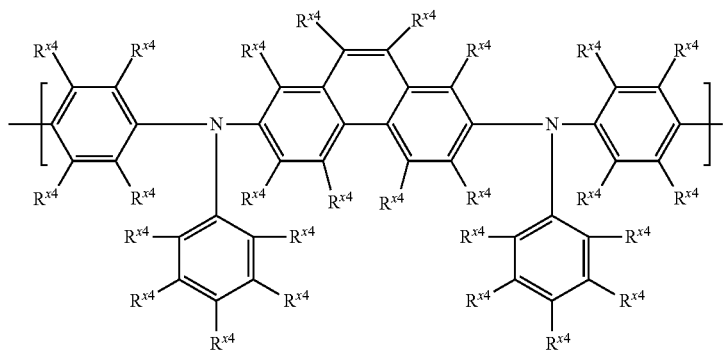

(X-5)

[Chemical Formula 79]

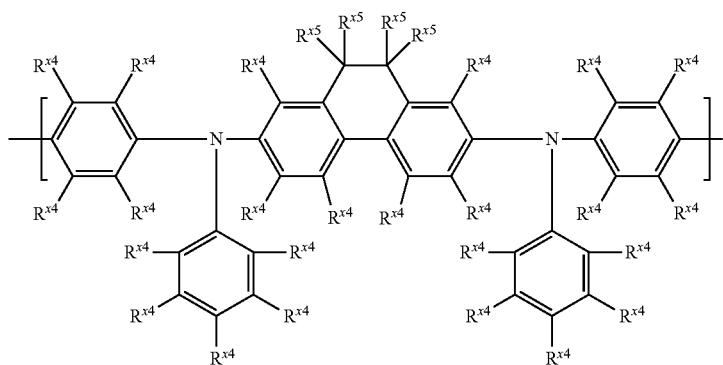

(X-6)

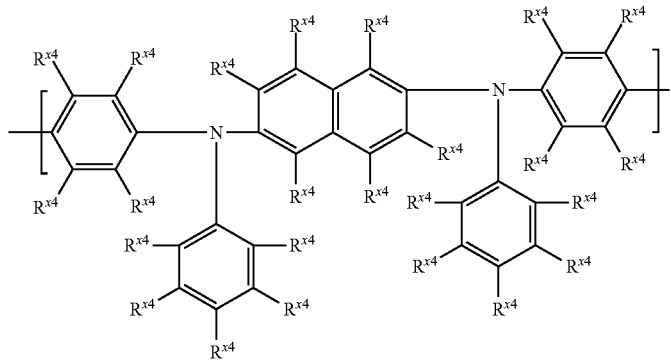

(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent hetero ring group or a cyano group, and these groups optionally have a substituent. A plurality of $R^{X4}$ may be the same or different. A plurality of $R^{X5}$ may be the same or different, and adjacent $R^{X5}$ may be combined together to form a ring together with carbon atoms to which they are attached.]

The amount of the constitutional unit represented by the formula (X) is preferably 0.1 to 50% by mol, more preferably 1 to 40% by mol, further preferably 5 to 30% by mol with respect to the total amount of constitutional units contained in the polymer host, since excellent hole transportability is obtained.

The constitutional unit represented by the formula (X) includes, for example, constitutional units represented by the formula (X1-1) to the formula (X1-15), and is preferably a constitutional unit represented by the formula (X1-3) to the formula (X1-10).

[Chemical Formula 80]

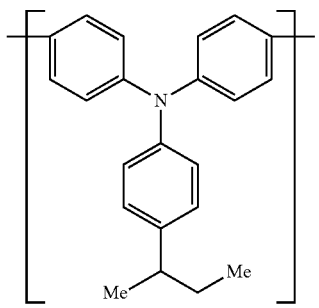

(X1-1)

(X1-2)
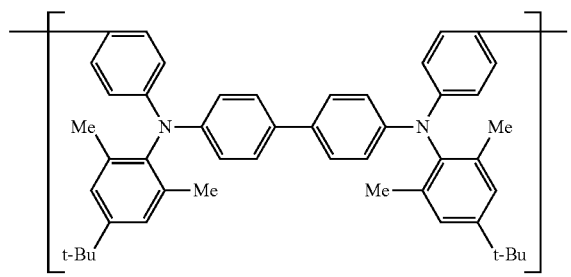
(X1-3)
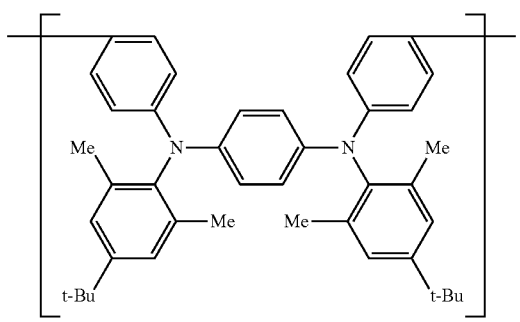
[Chemical Formula 81]
(X1-4)
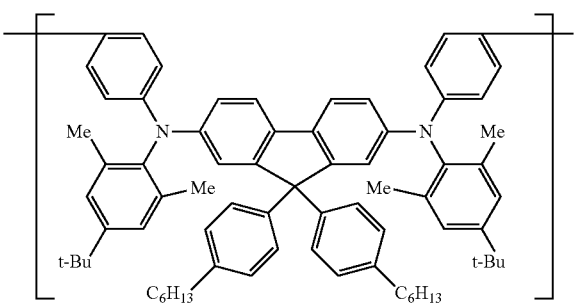
(X1-5)
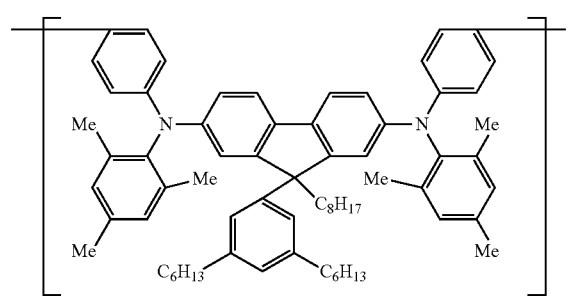
[Chemical Formula 82]
(X1-6)
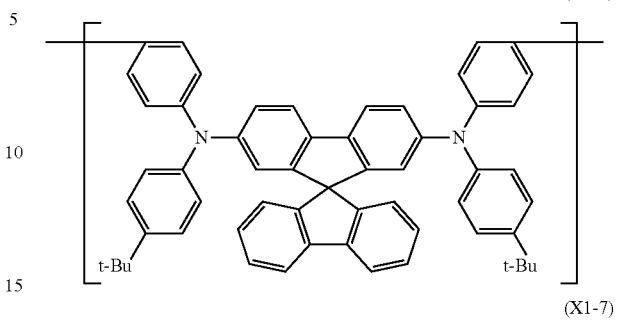
(X1-7)
[Chemical Formula 83]
(X1-8)
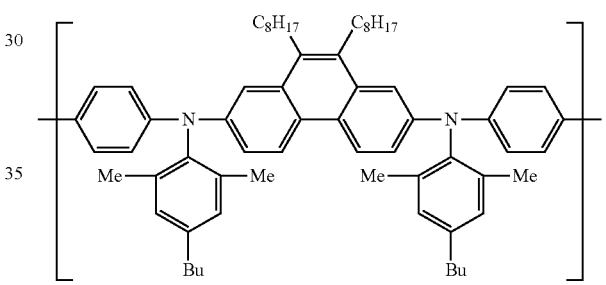
(X1-9)
[Chemical Formula 84]
(X1-10)
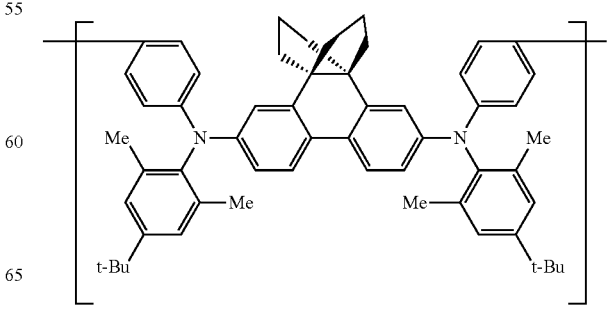

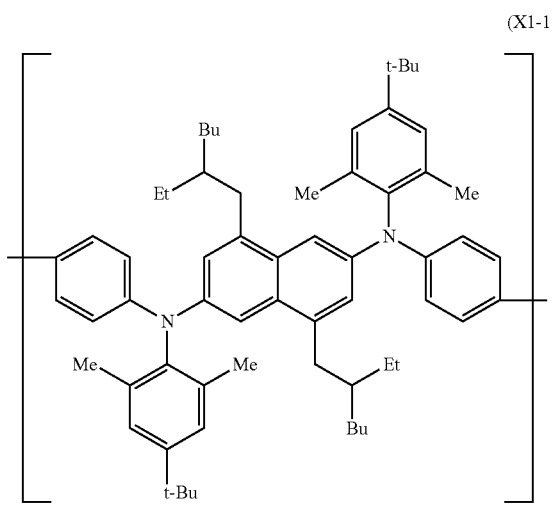

(X1-11)

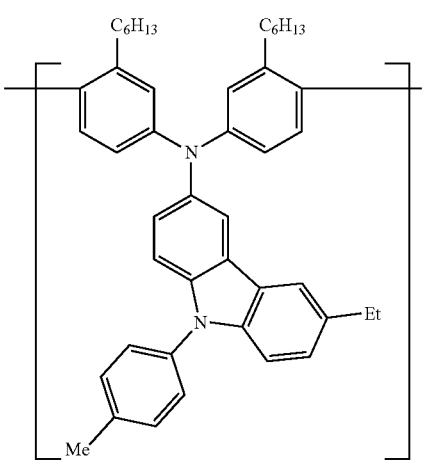

(X1-14)

[Chemical Formula 85]

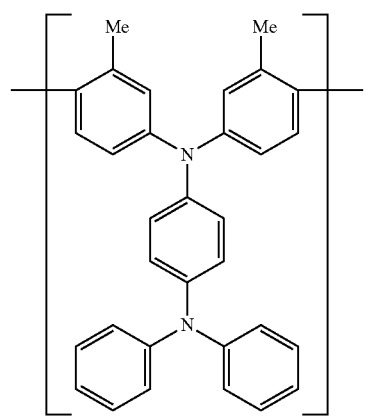

(X1-15)

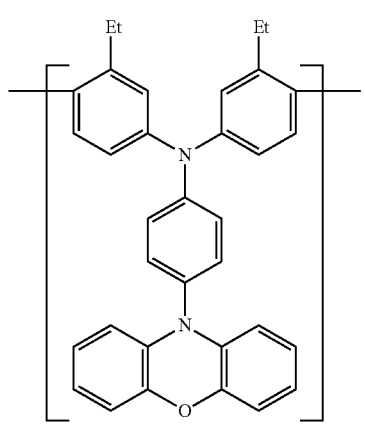

(X1-12)

The constitutional unit represented by the formula (X) may be contained only singly or in combination of two or more kinds thereof in the polymer host.

The polymer host includes, for example, polymer compounds P-1 to P-6.

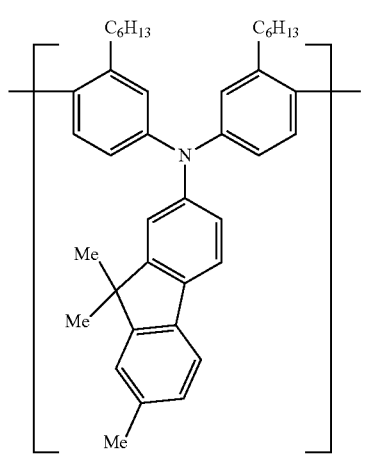

(X1-13)

TABLE 1

| polymer compound | constitutional unit and mole fraction thereof | | | | |
| --- | --- | --- | --- | --- | --- |
| | formula (Y) | | | formula (X) | |
| | formulae (Y-1) to (Y-3) p | formulae (Y-4) to (Y-7) q | formulae (Y-8) to (Y-10) r | formulae (X-1) to (X-7) s | other t |
| P-1 | 0.1 to 99.9 | 0.1 to 99.9 | 0 | 0 | 0 to 30 |
| P-2 | 0.1 to 99.9 | 0 | 0.1 to 99.9 | 0 | 0 to 30 |
| P-3 | 0.1 to 99.8 | 0.1 to 99.8 | 0 | 0.1 to 99.8 | 0 to 30 |
| P-4 | 0.1 to 99.8 | 0.1 to 99.8 | 0.1 to 99.8 | 0 | 0 to 30 |
| P-5 | 0.1 to 99.8 | 0 | 0.1 to 99.8 | 0.1 to 99.8 | 0 to 30 |
| P-6 | 0.1 to 99.7 | 0.1 to 99.7 | 0.1 to 99.7 | 0.1 to 99.7 | 0 to 30 |

[in the table, p, q, r, s and t represent the mole fraction of each constitutional unit. p+q+r+s+t=100 and 100≥p+q+r+s≥70. The other constitutional unit denotes a constitutional unit other than the constitutional unit represented by the formula (Y) and the constitutional unit represented by the formula (X).]

The polymer host may be any of a block copolymer, a random copolymer, an alternating copolymer and a graft copolymer, and may also be another form, and is preferably a copolymer obtained by copolymerizing a plurality of raw material monomers.

The polymer host has a polystyrene-equivalent number-average molecular weight of preferably $5 \times 10^3$ to $1 \times 10^6$, more preferably $1 \times 10^4$ to $5 \times 10^5$, more preferably $1.5 \times 10^4$ to $1.5 \times 10^5$.

[Production Method of Polymer Host]

The polymer host can be produced using known polymerization methods described in Chemical Review (Chem. Rev.), vol. 109, pp. 897 to 1091 (2009) and the like, and methods of polymerizing by a coupling reaction using a transition metal catalyst such as the Suzuki reaction, the Yamamoto reaction, the Buchwald reaction, the Stille reaction, the Negishi reaction, the Kumada reaction and the like are exemplified.

In the above-described polymerization methods, the method of charging monomers includes a method in which the entire monomers are charged all at once into the reaction system, a method in which a part of the monomers is charged and reacted, then, the remaining monomers are charged all at once, continuously or in a divided manner, a method of charging monomers continuously or dividedly, and other methods.

The transition metal catalyst includes a palladium catalyst, a nickel catalyst and the like.

For the post treatment of the polymerization reaction, known methods, for example, a method in which water-soluble impurities are removed by liquid separation, a method in which a reaction solution after the polymerization reaction is added to a lower alcohol such as methanol and the like, the deposited precipitate is filtrated, then, dried, and other methods, are used each singly or used in combination. When the purity of the polymer host is low, it can be purified by usual methods such as, for example, recrystallization, reprecipitation, continuous extraction with a Soxhlet extractor, column chromatography and the like.

[First Composition]

The first organic layer may be a layer containing a composition (hereinafter, referred to also as "first composition") containing a light emitting material represented by the formula (T) and at least one material selected from the group consisting of a host material, a hole transporting material, a hole injection material, an electron transporting material, an electron injection material, a light emitting material (different from the light emitting material represented by the formula (T)) and an antioxidant described above.

[Hole Transporting Material]

The hole transporting material is classified into low molecular compounds and polymer compounds, and polymer compounds are preferable. The hole transporting material may have a crosslink group.

The polymer compound includes, for example, polyvinylcarbazole and derivatives thereof; polyarylenes having an aromatic amine structure in the side chain or main chain and derivatives thereof. The polymer compound may also be a compound in which an electron accepting site is bonded. The electron accepting site includes, for example, fullerene, tetrafluorotetracyanoquinodimethane, tetracyanoethylene, trinitrofluorenone and the like, and fullerene is preferable.

In the first composition, the compounding amount of the hole transporting material is usually 1 to 400 parts by mass, preferably 5 to 150 parts by mass when the amount of the light emitting material represented by the formula (T) is taken as 100 parts by mass.

The hole transporting material may be used singly or in combination of two or more kinds thereof.

[Electron Transporting Material]

The electron transporting material is classified into low molecular compounds and polymer compounds. The electron transporting material may have a crosslink group.

The low molecular compound includes, for example, metal complexes having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene and derivatives thereof. The polymer compound may be doped with a metal.

In the first composition, the compounding amount of the electron transporting material is usually 1 to 400 parts by mass, preferably 5 to 150 parts by mass when the amount of the light emitting material represented by the formula (T) is taken as 100 parts by mass.

The electron transporting material may be used singly or in combination of two or more kinds thereof.

[Hole Injection Material and Electron Injection Material]

The hole injection material and the electron injection material are each classified into low molecular compounds and polymer compounds. The hole injection material and the electron injection material may have a crosslink group.

The low molecular compound includes, for example, metal phthalocyanines such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer containing an aromatic amine structure in the main chain or side chain, and the like.

In the first composition, the compounding amounts of the hole injection material and the electron injection material are each usually 1 to 400 parts by mass, preferably 5 to 150 parts by mass when the amount of the light emitting material represented by the formula (T) is taken as 100 parts by mass.

The electron injection material and the hole injection material each may be used singly or in combination of two or more kinds thereof.

[Ion Doping]

When the hole injection material or the electron injection material contains an electrically conductive polymer, the electric conductivity of the electrically conductive polymer is preferably $1 \times 10^{-5}$ S/cm to $1 \times 10^3$ S/cm. For adjusting the electric conductivity of the electrically conductive polymer within such a range, the electrically conductive polymer can be doped with an appropriate amount of ions.

The kind of the ion to be doped is an anion for the hole injection material and a cation for the electron injection material. The anion includes, for example, a polystyrenesulfonic ion, an alkylbenzenesulfonic ion and a camphor sulfonic ion. The cation includes, for example, a lithium ion, a sodium ion, a potassium ion and a tetrabutylammonium ion.

The ion to be doped may be used singly or in combination of two or more kinds thereof.

[Light Emitting Material]

The light emitting material is classified into low molecular compounds and polymer compounds. The light emitting material may have a crosslink group.

The low molecular compound includes, for example, naphthalene and derivatives thereof, anthracene and derivatives thereof and perylene and derivatives thereof, and phosphorescent metal complexes having iridium, platinum or europium as the central metal.

The polymer compound includes polymer compounds containing, for example, a phenylene group, a naphthalenediyl group, anthracenediyl group, a fluorenediyl group, a phenanthrenediyl group, a dihydrophenanthrenediyl group, a group represented by the formula (X), a carbazolediyl group, a phenoxazinediyl group, a phenothiazinediyl group, a pyrenediyl group and the like.

In the first composition, the compounding amount of the light emitting material is usually 1 to 400 parts by mass, preferably 5 to 150 parts by mass when the amount of the light emitting material represented by the formula (T) is taken as 100 parts by mass.

The light emitting material may be used singly or in combination of two or more kinds thereof.

[Antioxidant]

The antioxidant may be a compound which is soluble in a solvent which is the same as the solvent for the light emitting material represented by the formula (T) and does not inhibit light emission and charge transportation, and includes, for example, phenol type antioxidants and phosphorus-based antioxidants.

In the first composition, the compounding amount of the antioxidant is usually 0.001 to 10 parts by mass when the amount of the light emitting material represented by the formula (T) is taken as 100 parts by mass.

The antioxidant may be used singly or in combination of two or more kinds thereof.

[First ink]

The composition containing the light emitting material represented by the formula (T) and a solvent (hereinafter, referred to also as "first ink") can be suitably used for application methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method, a nozzle coat method and the like.

The viscosity of the first ink may be adjusted according to the type of the application method, and when applied printing methods in which a solution passes through a discharge device such as an inkjet printing method and the like, the viscosity is preferably 1 to 20 mPa·s at 25° C. since clogging and flight deflection during discharge scarcely occur.

The solvent contained in the first ink is preferably a solvent capable of dissolving or uniformly dispersing solid components in the ink. The solvent includes, for example, chlorine-based solvents such as 1,2-dichloroethane, 1,1,2-trichloroethane, chlorobenzene, o-dichlorobenzene and the like; ether type solvents such as tetrahydrofuran, dioxane, anisole, 4-methylanisole and the like; aromatic hydrocarbon type solvents such as toluene, xylene, mesitylene, ethylbenzene, n-hexylbenzene, cyclohexylbenzene and the like; aliphatic hydrocarbon type solvents such as cyclohexane, methylcyclohexane, n-pentane, n-hexane, n-heptane, n-octane, n-nonane, n-decane, n-dodecane, bicyclohexyl and the like; ketone type solvents such as acetone, methyl ethyl ketone, cyclohexanone, acetophenone and the like; ester type solvents such as ethyl acetate, butyl acetate, ethyl cellosolve acetate, methyl benzoate, phenyl acetate and the like; polyhydric alcohol type solvents such as ethylene glycol, glycerin, 1,2-hexanediol and the like; alcohol type solvents such as isopropyl alcohol, cyclohexanol and the like; sulfoxide type solvents such as dimethyl sulfoxide and the like; and amide type solvents such as N-methyl-2-pyrrolidone, N,N-dimethylformamide and the like. The solvent may be used singly or in combination of two or more kinds thereof.

In the first ink, the compounding amount of the solvent is usually 1000 to 100000 parts bymass, preferably 2000 to 20000 parts by mass when the amount of the light emitting material represented by the formula (T) is taken as 100 parts by mass.

<Second Organic Layer>

The second organic layer is a layer containing a crosslinked body of a polymer compound containing a crosslink constitutional unit (hereinafter, referred to also as "polymer compound of second organic layer").

The crosslinked body of the polymer compound of the second organic layer is obtained by bringing the polymer compound of the second organic layer into crosslinked state by the above-described method.

The polymer compound of the second organic layer is preferably a polymer compound containing a crosslink constitutional unit having at least one crosslink group selected from Group A of crosslink group, since the driving voltage of the light emitting device of the present invention is further lowered.

The crosslink group selected from Group A of crosslink group is preferably a crosslink group represented by the formula (XL-1) to the formula (XL-4), the formula (XL-7) to the formula (XL-10) or the formula (XL-14) to the formula (XL-17), more preferably a crosslink group represented by the formula (XL-1), the formula (XL-3), the formula (XL-9), the formula (XL-10), the formula (XL-16) or the formula (XL-17), further preferably a crosslink group represented by the formula (XL-1), the formula (XL-16) or the formula (XL-17), particularly preferably a crosslink group represented by the formula (XL-1) or the formula (XL-17), especially preferably a crosslink group represented by the formula (XL-17), since the driving voltage of the light emitting device of the present invention is further lowered.

The crosslink group selected from Group A of crosslink group is preferably a crosslink group represented by the formula (XL-2) to the formula (XL-4), the formula (XL-7) to the formula (XL-10), the formula (XL-14), the formula (XL-15) or the formula (XL-17), more preferably a crosslink group represented by the formula (XL-9), the formula (XL-10) or the formula (XL-17), particularly preferably a crosslink group represented by the formula (XL-17), since the driving voltage of the light emitting device of the present invention is further lowered and the crosslinkability of the polymer compound of the second organic layer is more excellent.

[Polymer Compound of Second Organic Layer]

The constitutional unit having at least one crosslink group selected from Group A of crosslink group contained in the polymer compound of the second organic layer is preferably a constitutional unit represented by the formula (2) or a constitutional unit represented by the formula (2'), and constitutional units represented by the following formulae may also be permissible.

[Chemical Formula 86]

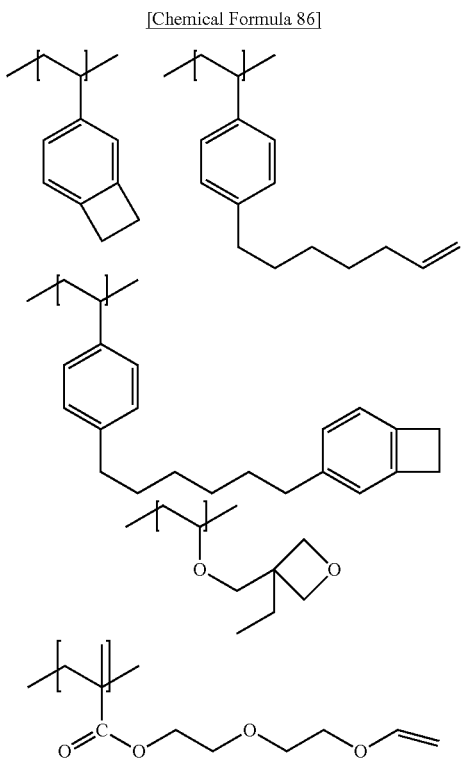

When the polymer compound of the second organic layer contains two or more constitutional units having at least one crosslink group selected from Group A of crosslink group, it is preferable that the crosslink groups are mutually different in at least two constitutional units having at least one crosslink group selected from Group A of crosslink group. The combination of the mutually different crosslink groups is preferably a combination of a crosslink group represented by the formula (XL-1), the formula (XL-2), the formula (XL-5) to the formula (XL-8) or the formula (XL-14) to the formula (XL-16) with a crosslink group represented by the formula (XL-3), the formula (XL-4), the formula (XL-13) or the formula (XL-17), more preferably a combination of a crosslink group represented by the formula (XL-1) or the formula (XL-16) with a crosslink group represented by the formula (XL-17), further preferably a combination of a crosslink group represented by the formula (XL-1) with a crosslink group represented by the formula (XL-17).

Constitutional unit represented by the formula (2)

nA is preferably an integer of 0 to 3, more preferably an integer of 0 to 2, further preferably 2, since the driving voltage of the light emitting device of the present invention is further lowered.

n is preferably 2, since the driving voltage of the light emitting device of the present invention is further lowered.

$Ar^3$ is preferably an aromatic hydrocarbon group optionally having a substituent, since the driving voltage of the light emitting device of the present invention is further lowered.

The number of carbon atoms of the aromatic hydrocarbon group represented by $Ar^3$ is, not including the number of carbon atoms of the substituent, usually 6 to 60, preferably 6 to 30, more preferably 6 to 18.

The arylene group portion obtained by removing n substituents from the aromatic hydrocarbon group represented by $Ar^3$ is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19), and these groups optionally have a substituent.

The number of carbon atoms of the hetero ring group represented by $Ar^3$ is, not including the number of carbon atoms of the substituent, usually 2 to 60, preferably 3 to 30, more preferably 4 to 18.

The divalent hetero ring group portion obtained by removing n substituents from the hetero ring group represented by $Ar^3$ is preferably a group represented by the formula (AA-1) to the formula (AA-34).

The aromatic hydrocarbon group and the hetero ring group represented by $Ar^3$ optionally have a substituent, and the substituent is preferably an alkyl group, a cycloalkyl group, an alkoxy group, a cycloalkoxy group, an aryl group, an aryloxy group, a halogen atom, a monovalent hetero ring group and a cyano group.

The number of carbon atoms of the alkylene group represented by $L^A$ is, not including the number of carbon atoms of the substituent, usually 1 to 20, preferably 1 to 15, more preferably 1 to 10. The number of carbon atoms of the cycloalkylene group represented by $L^A$ is, not including the number of carbon atoms of the substituent, usually 3 to 20.

The alkylene group and the cycloalkylene group optionally have a substituent and examples thereof include a methylene group, an ethylene group, a propylene group, a butylene group, a hexylene group, a cyclohexylene group and an octylene group.

The alkylene group and the cycloalkylene group represented by $L^A$ optionally have a substituent. The substituent which the alkylene group and the cycloalkylene group optionally have is preferably an alkyl group, a cycloalkyl group, an alkoxy group, a cycloalkoxy group, a halogen atom or a cyano group, and these groups optionally further have a substituent.

The arylene group represented by $L^A$ optionally has a substituent. The arylene group is preferably a phenylene group or a fluorenediyl group, more preferably a m-phenylene group, a p-phenylene group, a fluorene-2,7-diyl group or a fluorene-9,9-diyl group. The substituent which the arylene group optionally has is preferably an alkyl group, a cycloalkyl group, an alkoxy group, a cycloalkoxy group, an aryl group, an aryloxy group, a monovalent hetero ring group, a halogen atom, a cyano group or a crosslink group selected from Group A of crosslink group, and these groups optionally further have a substituent.

The divalent hetero ring group represented by $L^A$ is preferably a group represented by the formula (AA-1) to the formula (AA-34).

$L^A$ is preferably an arylene group or an alkylene group, more preferably a phenylene group, a fluorenediyl group or an alkylene group, and these groups optionally have a substituent, since production of the polymer compound of the second organic layer becomes easy.

The crosslink group represented by X is preferably a crosslink group represented by the formula (XL-1) to the formula (XL-4), the formula (XL-7) to the formula (XL-10) or the formula (XL-14) to the formula (XL-17), more preferably a crosslink group represented by the formula (XL-1), the formula (XL-3), the formula (XL-9), the formula (XL-10), the formula (XL-16) or the formula (XL-17), further preferably a crosslink group represented by the formula (XL-1), the formula (XL-16) or the formula (XL- 17), particularly preferably a crosslink group represented by the formula (XL-1) or the formula (XL-17), especially preferably a crosslink group represented by the formula (XL-17), since the driving voltage of the light emitting device of the present invention is further lowered.

The crosslink group represented by X is preferably a crosslink group represented by the formula (XL-2) to the formula (XL-4), the formula (XL-7) to the formula (XL-10), the formula (XL-14), the formula (XL-15) or the formula (XL-17), more preferably a crosslink group represented by the formula (XL-9), the formula (XL-10) or the formula (XL-17), particularly preferably a crosslink group represented by the formula (XL-17), since the driving voltage of the light emitting device of the present invention is further lowered and the crosslinkability of the polymer compound of the second organic layer is more excellent.

The amount of the constitutional unit represented by the formula (2) is preferably 0.5 to 80% by mol, more preferably 3 to 65% by mol, further preferably 5 to 50% by mol with respect to the total amount of constitutional units contained in the polymer compound of the second organic layer, since the polymer compound of the second organic layer is excellent in stability and crosslinkability.

The constitutional unit represented by the formula (2) may be contained only singly or in combination of two or more kinds thereof in the polymer compound of the second organic layer.

When the polymer compound of the second organic layer contains two or more constitutional units represented by the formula (2), it is preferable that the crosslink groups represented by X are mutually different in at least two constitutional units represented by the formula (2). The preferable range of the combination of the mutually different crosslink groups represented by X is the same as the preferable range of the combination of the mutually different crosslink groups described above.

Constitutional unit represented by the formula (2')

mA is preferably an integer of 0 to 3, more preferably an integer of 0 to 2, further preferably 0 or 1, particularly preferably 0, since the driving voltage of the light emitting device of the present invention is further lowered.

m is preferably 1 or 2, more preferably 2, since the driving voltage of the light emitting device of the present invention is further lowered.

c is preferably 0, since production of the polymer compound of the second organic layer becomes easy and the driving voltage of the light emitting device of the present invention is further lowered.

$Ar^5$ is preferably an aromatic hydrocarbon group optionally having a substituent, since the driving voltage of the light emitting device of the present invention is further lowered.

The definition and the examples of the arylene group portion obtained by removing m substituents from the aromatic hydrocarbon group represented by $Ar^5$ are the same as the definition and the examples of the arylene group represented by $Ar^{X2}$ in the formula (X).

The definition and the examples of the divalent hetero ring group portion obtained by removing m substituents from the hetero ring group represented by $Ar^5$ are the same as the definition and the examples of the divalent hetero ring group portion represented by $Ar^{X2}$ in the formula (X).

The definition and the examples of the divalent group obtained by removing m substituents from the group in which at least one aromatic hydrocarbon ring and at least one hetero ring are bonded directly represented by $Ar^5$ are the same as the definition and the examples of the divalent group in which at least one arylene group and at least one divalent hetero ring group are bonded directly represented by $Ar^{X2}$ in the formula (X).

$Ar^4$ and $Ar^6$ are each preferably an arylene group optionally having a substituent, since the driving voltage of the light emitting device of the present invention is further lowered.

The definition and the examples of the arylene group represented by $Ar^4$ and $Ar^6$ are the same as the definition and the examples of the arylene group represented by $Ar^{X1}$ and $Ar^{X3}$ in the formula (X).

The definition and the examples of the divalent hetero ring group represented by $Ar^4$ and $Ar^6$ are the same as the definition and the examples of the divalent hetero ring group represented by $Ar^{X1}$ and $Ar^{X3}$ in the formula (X).

The group represented by $Ar^4$, $Ar^5$ and $Ar^6$ optionally has a substituent, and the substituent is preferably an alkyl group, a cycloalkyl group, an alkoxy group, a cycloalkoxy group, an aryl group, an aryloxy group, a halogen atom, a monovalent hetero ring group and a cyano group.

The definition and the examples of the alkylene group, the cycloalkylene group, the arylene group and the divalent hetero ring group represented by $K^4$ are the same as the definition and the examples of the alkylene group, the cycloalkylene group, the arylene group and the divalent hetero ring group represented by $L^4$, respectively.

$K^4$ is preferably a phenylene group or a methylene group, since production of the polymer compound of the second organic layer becomes easy.

The definition and the examples of the crosslink group represented by X' are the same as the definition and the examples of the crosslink group represented by X described above.

The amount of the constitutional unit represented by the formula (2') is preferably 0.5 to 50% by mol, more preferably 3 to 30% by mol, further preferably 5 to 20% by mol with respect to the total amount of constitutional units contained in the polymer compound of the second organic layer, since the polymer compound of the second organic layer is excellent in stability and the polymer compound of the second organic layer is excellent in crosslinkability.

The constitutional unit represented by the formula (2') may be contained only singly or in combination of two or more kinds thereof in the polymer compound of the second organic layer.

When the polymer compound of the second organic layer contains two or more constitutional units represented by the formula (2'), it is preferable that the crosslink groups represented by X' are mutually different in at least two constitutional units represented by the formula (2'). The preferable range of the combination of the mutually different crosslink groups represented by X' is the same as the preferable range of the combination of the mutually different crosslink groups described above.

Preferable embodiment of constitutional unit represented by the formula (2) or (2')

The constitutional unit represented by the formula (2) includes, for example, constitutional units represented by the formula (2-1) to the formula (2-30), and the constitutional unit represented by the formula (2') includes, for example, constitutional units represented by the formula (2'-1) to the formula (2'-9). Of them, preferable are constitutional units represented by the formula (2-1) to the formula (2-30), more preferable are constitutional units represented by the formula (2-1) to the formula (2-15), the formula (2-19), the formula (2-20), the formula (2-23), the formula (2-25) or the formula (2-30), further preferable are constitutional units represented by the formula (2-1) to the formula (2-9) or the formula (2-30), since the polymer compound of the second organic layer is excellent in crosslinkability.
[Chemical Formula 87]
(2-1)
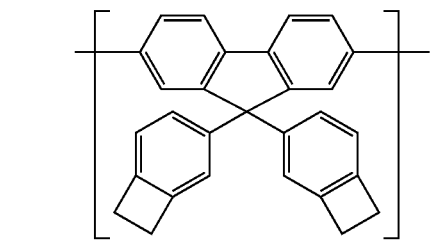
(2-2)
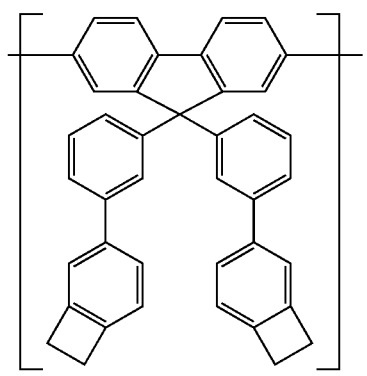
(2-3)
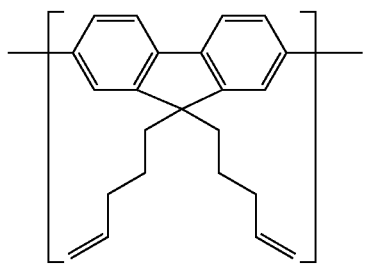
(2-4)
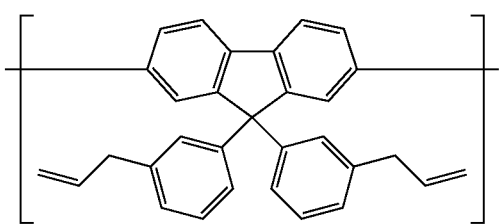
(2-5)
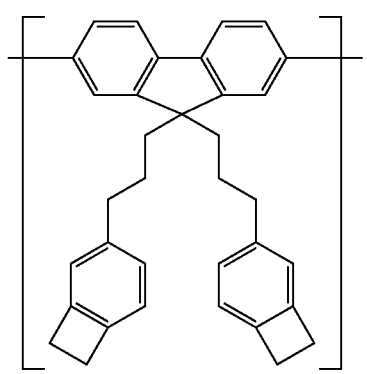
-continued
(2-6)
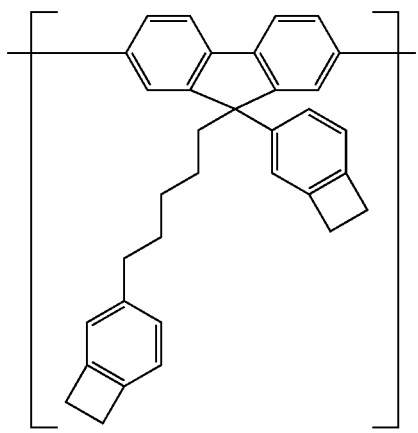
(2-7)
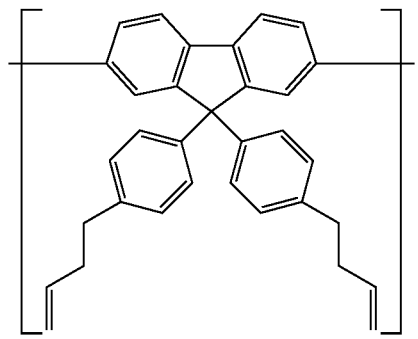
(2-8)
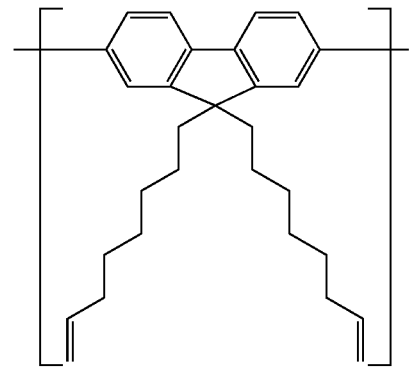
(2-9)
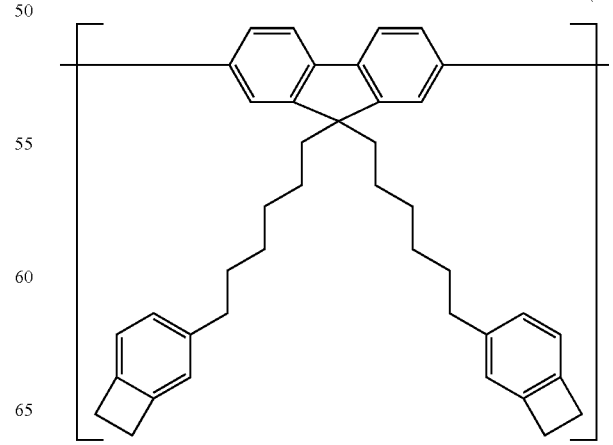

(2-10)
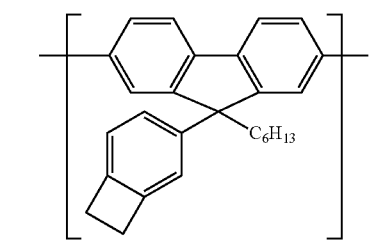
(2-11)
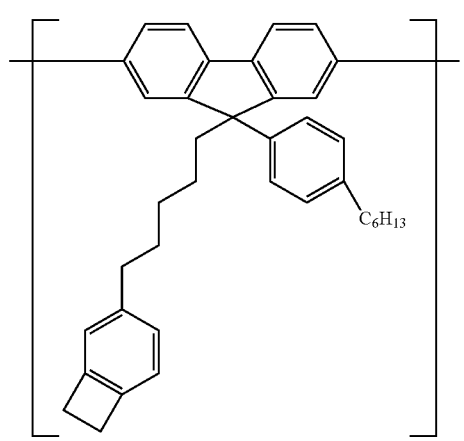
(2-12)
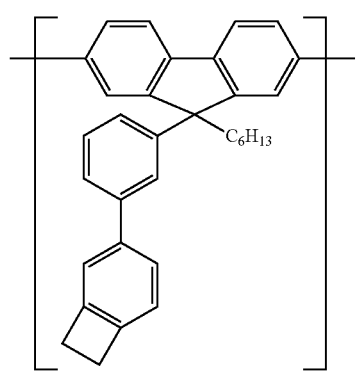
(2-13)
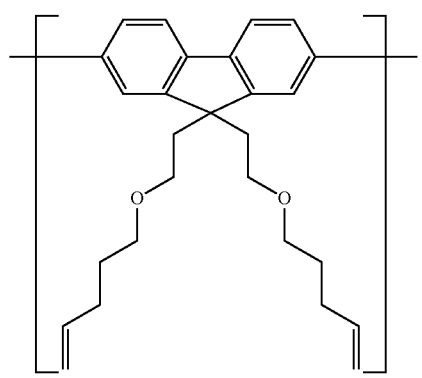
(2-14)
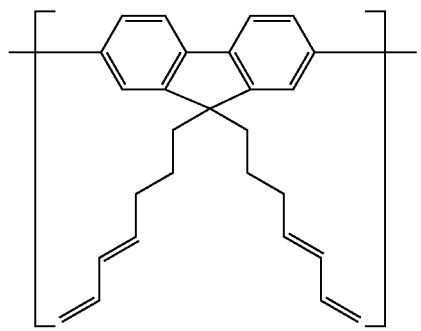
(2-15)
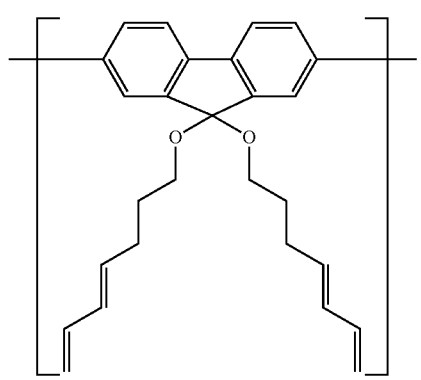
[Chemical Formula 88]
(2-16)
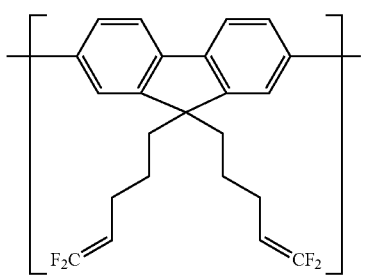
(2-17)
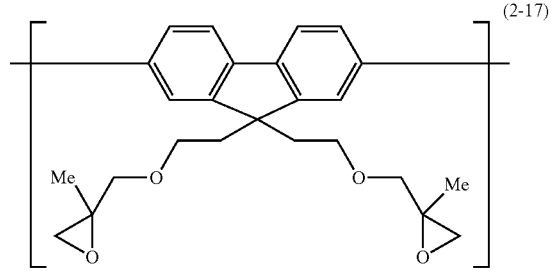

99
-continued
(2-18)
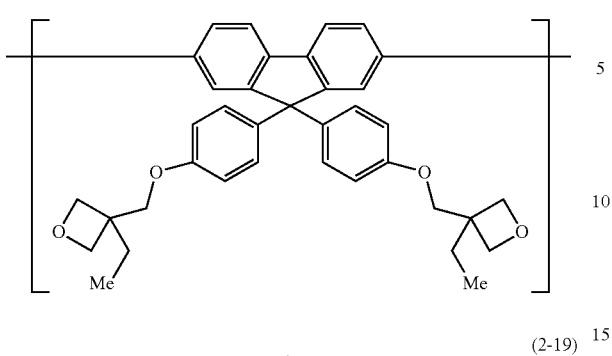
(2-19)
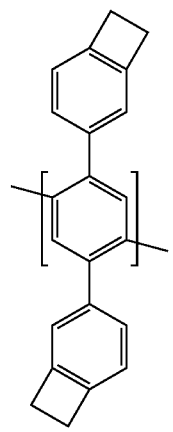
(2-20)
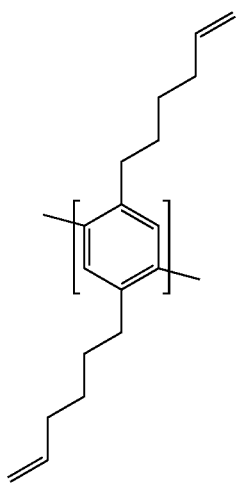
(2-21)
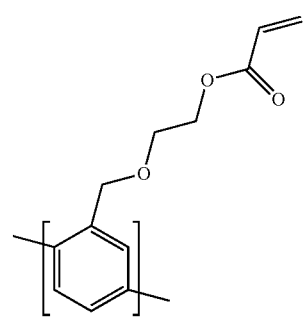
100
-continued
(2-22)
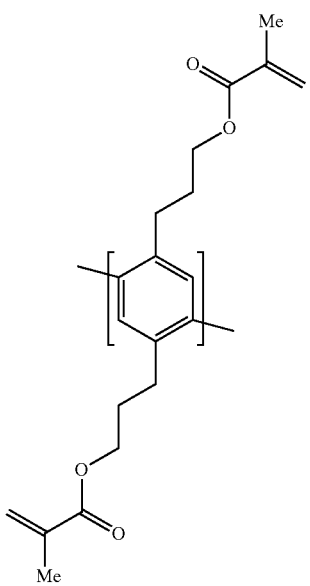
(2-23)
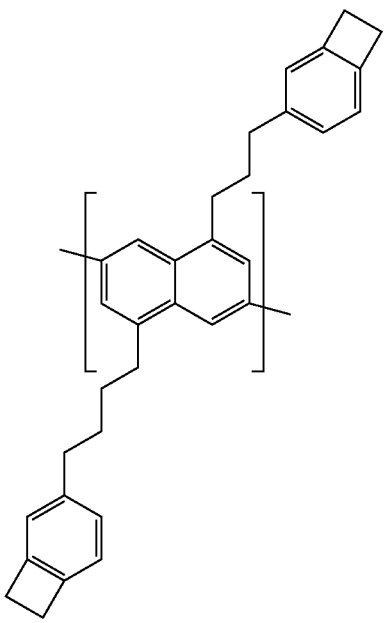

(2-24)
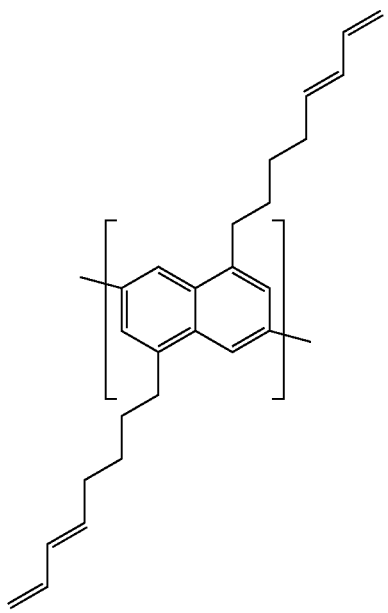
(2-25)
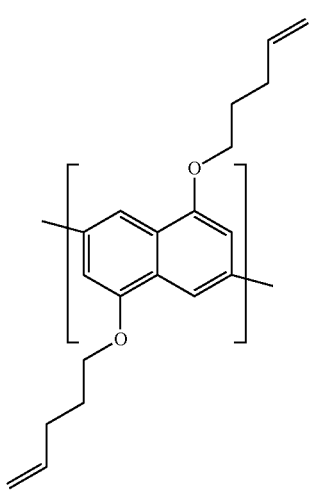
(2-26)
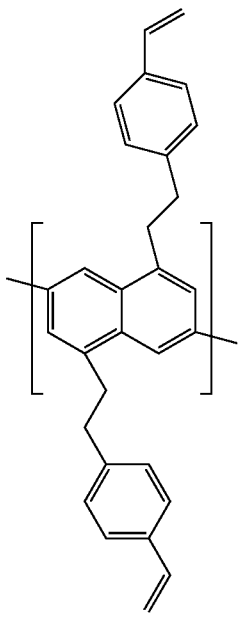
(2-27)
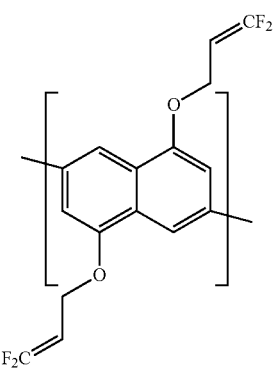
(2-28)
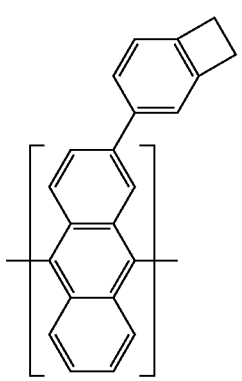
(2-29)
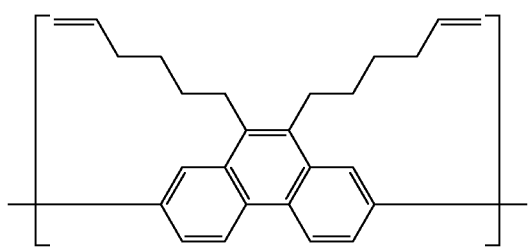

(2-30)
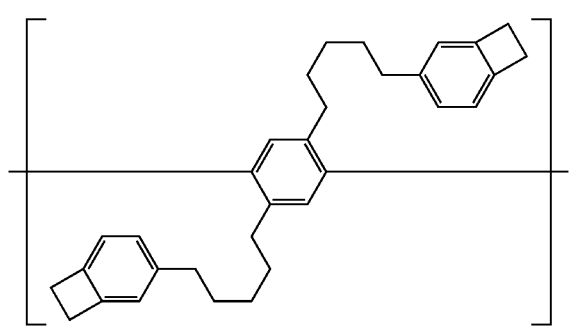
[Chemical Formula 89]
(2'-1)
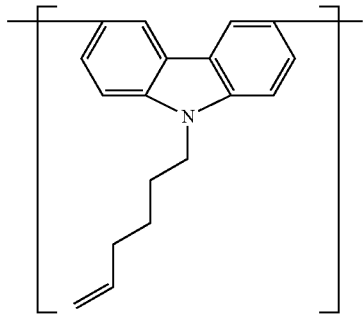
(2'-2)
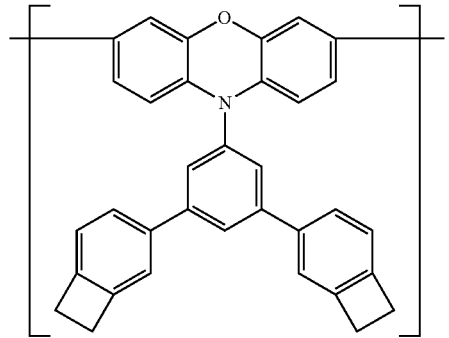
(2'-3)
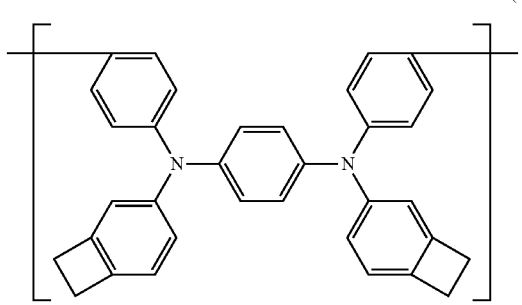
(2'-4)
(2'-5)
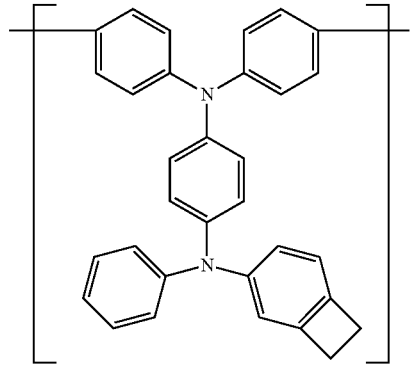
(2'-6)
(2'-7)
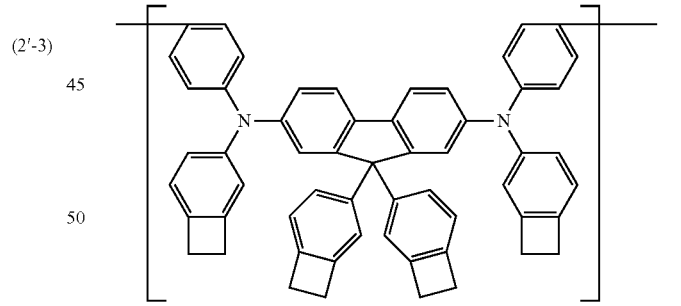
(2'-8)
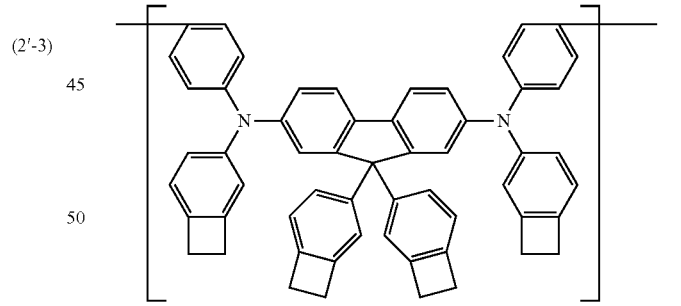
(2'-9)
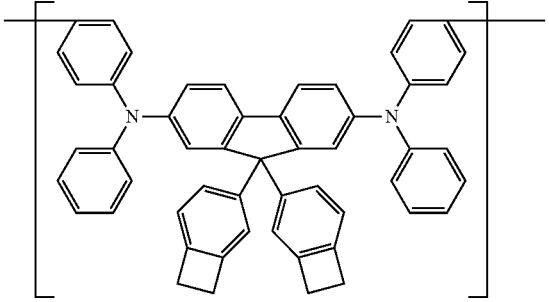

Other Constitutional Unit

It is preferable that the polymer compound of the second organic layer further contains a constitutional unit represented by the formula (X), since excellent hole transportability is obtained. It is preferable that the polymer compound of the second organic layer further contains a constitutional unit represented by the formula (Y), since the driving voltage of the light emitting device of the present invention is further lowered.

It is preferable that the polymer compound of the second organic layer further contains a constitutional unit represented by the formula (X) and a constitutional unit represented by the formula (Y) since excellent hole transportability is obtained and the driving voltage of the light emitting device of the present invention is further lowered.

The definition and the examples of the constitutional unit represented by the formula (X) which the polymer compound of the second organic layer may contain are the same as the definition and the examples of the constitutional unit represented by the formula (X) which the polymer host described above may contain. The definition and examples of the constitutional unit represented by the formula (Y) which the polymer compound of the second organic layer may contain are the same as the definition and the examples of the constitutional unit represented by the formula (Y) which the polymer host described above may contain.

When the polymer compound of the second organic layer contains a constitutional unit represented by the formula (X), at least one of $Ar^{X1}$ and $Ar^{X3}$ is preferably a group represented by the formula (X-1-1'), the formula (X-1-1"), the formula (X-1-2'), the formula (X-1-2") or the formula (X-2-1) to the formula (X-2-4), more preferably a group represented by the formula (X-1-1'), the formula (X-1-1"), the formula (X-1-2'), the formula (X-2-2) or the formula (X-2-3), further preferably a group represented by the formula (X-1-1'), the formula (X-1-1") or the formula (X-1-2'), particularly preferably a group represented by the formula (X-1-1"), since the driving voltage of the light emitting device of the present invention is further lowered.

When the polymer compound of the second organic layer contains a constitutional unit represented by the formula (X), $Ar^{X1}$ and $Ar^{X3}$ are each preferably a group represented by the formula (X-1-1'), the formula (X-1-1"), the formula (X-1-2'), the formula (X-1-2") or the formula (X-2-1) to the formula (X-2-4), more preferably a group represented by the formula (X-1-1'), the formula (X-1-1"), the formula (X-1-2'), the formula (X-2-2) or the formula (X-2-3), further preferably a group represented by the formula (X-1-1'), the formula (X-1-1") or the formula (X-1-2'), particularly preferably a group represented by the formula (X-1-1"), since the driving voltage of the light emitting device of the present invention is further lowered.

[Chemical Formula 90]

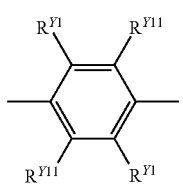
(X-1-1')

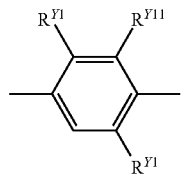
(X-1-1")

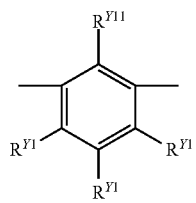
(X-1-2')

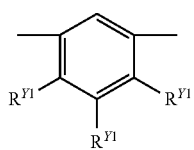
(X-1-2")

[Chemical Formula 91]

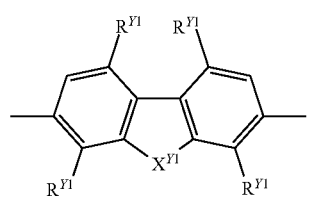
(X-2-1)

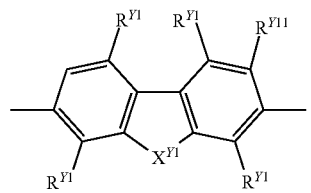
(X-2-2)

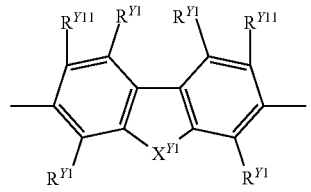
(X-2-3)

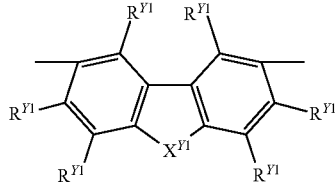
(X-2-4)

[wherein, $R^{Y1}$, $R^{Y11}$ and $X^{Y1}$ represent the same meaning as described above.]

When the polymer compound of the second organic layer contains a constitutional unit represented by the formula (Y), the polymer compound contains preferably a constitutional unit represented by the formula (Y-1-1), the formula (Y-1-2), the formula (Y-2-1) to (Y-2-4) or the formula (Y-Y3-1) to the formula (Y-Y3-4), more preferably a constitutional unit represented by the formula (Y-1-1'), the formula (Y-1-1"), the formula (Y-1-2'), the formula (Y-1-2"), the formula (Y-2-2), the formula (Y-2-3) or the formula (Y-Y3-1) to the formula (Y-Y3-3), further preferably a constitutional unit represented by the formula (Y-1-1'), the formula (Y-1-1"), the formula (Y-1-2'), the formula (Y-2-3) or the formula (Y-Y3-1), particularly preferably a constitutional unit represented by the formula (Y-1-1'), since the driving voltage of the light emitting device of the present invention is further lowered.

When the polymer compound of the second organic layer contains a constitutional unit represented by the formula (Y), the polymer compound contains preferably a constitutional unit represented by any of the formula (Y-8) to the formula (Y-10), more preferably a constitutional unit represented by the formula (Y-10), since the driving voltage of the light emitting device of the present invention is further lowered and the polymer compound of the second organic layer is more excellent in hole transportability.

The constitutional unit represented by the formula (X) may be contained only singly or in combination of two or more kinds thereof in the polymer compound of the second organic layer. The constitutional unit represented by the formula (Y) may be contained only singly or in combination of two or more kinds thereof in the polymer compound of the second organic layer.

When the polymer compound of the second organic layer contains a constitutional unit represented by the formula (X), the amount of the constitutional unit represented by the formula (X) is preferably 0.1 to 90% by mol, more preferably 1 to 70% by mol, further preferably 10 to 50% by mol with respect to the total amount of constitutional units contained in the polymer compound of the second organic layer, since excellent hole transportability is obtained.

When the polymer compound of the second organic layer contains a constitutional unit represented by the formula (Y) in which $Ar^{Y1}$ is an arylene group, the amount of the constitutional unit represented by the formula (Y) is preferably 0.5 to 90% by mol, more preferably 30 to 60% by mol with respect to the total amount of constitutional units contained in the polymer compound of the second organic layer, since the driving voltage of the light emitting device of the present invention is further lowered.

When the polymer compound of the second organic layer contains a constitutional unit represented by the formula (Y) in which $Ar^{Y1}$ is a divalent hetero ring group or a divalent group in which at least one arylene group and at least one divalent hetero ring group are bonded directly, the amount of the constitutional unit represented by the formula (Y) is preferably 0.1 to 90% by mol, more preferably 1 to 70% by mol, further preferably 10 to 50% by mol with respect to the total amount of constitutional units contained in the polymer compound of the second organic layer, since the polymer compound of the second organic layer is excellent in charge transportability.

The polymer compound of the second organic layer includes, for example, polymer compounds P-7 to P-14. In the present specification, "other constitutional unit" denotes a constitutional unit other than the constitutional units represented by the formula (2), the formula (2'), the formula (X) and the formula (Y).

TABLE 2

| polymer compound | constitutional unit and mole fraction thereof | | | | |
|---|---|---|---|---|---|
| | formula (2) p' | formula (2') q' | formula (X) r' | formula (Y) s' | other t' |
| P-7 | 0.1 to 99.9 | 0.1 to 99.9 | 0 | 0 | 0 to 30 |
| P-8 | 0.1 to 99.9 | 0 | 0.1 to 99.9 | 0 | 0 to 30 |
| P-9 | 0.1 to 99.9 | 0 | 0 | 0.1 to 99.9 | 0 to 30 |
| P-10 | 0 | 0.1 to 99.9 | 0.1 to 99.9 | 0 | 0 to 30 |
| P-11 | 0 | 0.1 to 99.9 | 0 | 0.1 to 99.9 | 0 to 30 |
| P-12 | 0.1 to 99.8 | 0.1 to 99.8 | 0.1 to 99.8 | 0 | 0 to 30 |
| P-13 | 0.1 to 99.8 | 0.1 to 99.8 | 0 | 0.1 to 99.8 | 0 to 30 |
| P-14 | 0.1 to 99.7 | 0.1 to 99.7 | 0.1 to 99.7 | 0.1 to 99.7 | 0 to 30 |

[in the table, p', q', r', s' and t' represent the mole fraction of each constitutional unit. p'+q'+r'+s'+t'=100 and 70≤p'+q'+r'+s'≤100.].

The polymer compound of the second organic layer may be any of a block copolymer, a random copolymer, an alternating copolymer and a graft copolymer, and may also be another form, and is preferably a copolymer obtained by copolymerizing a plurality of raw material monomers.

The polymer compound of the second organic layer has a polystyrene-equivalent number-average molecular weight of preferably $5 \times 10^3$ to $1 \times 10^6$, more preferably $1 \times 10^4$ to $5 \times 10^5$, further preferably $1.5 \times 10^4$ to $1 \times 10^5$.

[Production Method of Polymer Compound of Second Organic Layer]

The polymer compound of the second organic layer can be produced by the same method as the production method of the polymer host described above.

[Second Composition]

The second organic layer may be a layer containing a composition containing a crosslinked body of the polymer compound of the second organic layer and at least one material selected from the group consisting of a hole transporting material, a hole injection material, an electron transporting material, an electron injection material, a light emitting material and an antioxidant (hereinafter, referred to also as "second composition").

The examples and the preferable range of the hole transporting material, the electron transporting material, the hole injection material, the electron injection material and the light emitting material contained in the second composition are the same as the examples and the preferable range of the hole transporting material, the electron transporting material, the hole injection material, the electron injection material and the light emitting material contained in the first composition. In the second composition, the compounding amounts of the hole transporting material, the electron transporting material, the hole injection material, the electron injection material and the light emitting material are each usually 1 to 400 parts by mass, preferably 5 to 150 parts by mass when the amount of the crosslinked body of the polymer compound of the second organic layer is taken as 100 parts by mass.

The examples and the preferable range of the antioxidant contained in the second composition are the same as the examples and the preferable range of the antioxidant contained in the first composition. In the second composition, the compounding amount of the antioxidant is usually 0.001 to 10 parts by mass when the amount of the crosslinked body of the polymer compound of the second organic layer is taken as 100 parts by mass.

[Second Ink]

A composition containing the polymer compound of the second organic layer and a solvent (hereinafter, referred to also as "second ink") can be suitably used in wet methods explained in the section of the first ink. The preferable range of the viscosity of the second ink is the same as the preferable range of the viscosity of the first ink. The examples and the preferable range of the solvent contained in the second ink are the same as the examples and the preferable range of the solvent contained in the first ink.

In the second ink, the compounding amount of the solvent is usually 1000 to 100000 parts bymass, preferably 2000 to 20000 parts by mass when the amount of the polymer compound of the second organic layer is taken as 100 parts by mass.

<Layer Constitution of Light Emitting Device>

The light emitting device of the present invention may have layers other than the anode, the cathode, the first organic layer and the second organic layer.

In the light emitting device of the present invention, the first organic layer is usually a light emitting layer (hereinafter, referred to as "first light emitting layer"). The first organic layer is preferably a layer not containing a phosphorescent metal complex. The phosphorescent metal complex is a metal complex showing emission from the triplet excited state at room temperature (25° C.).

In the light emitting device of the present invention, the second organic layer is usually a hole transporting layer, a second light emitting layer or an electron transporting layer, preferably a hole transporting layer or a second light emitting layer, more preferably a hole transporting layer.

In the light emitting device of the present invention, it is preferable that the first organic layer and the second organic layer are adjacent, since the driving voltage of the light emitting device of the present invention is further lowered.

In the light emitting device of the present invention, the second organic layer is preferably a layer disposed between the anode and the first organic layer, more preferably a hole transporting layer or a second light emitting layer disposed between the anode and the first organic layer, further preferably a hole transporting layer disposed between the anode and the first organic layer, since the driving voltage of the light emitting device of the present invention is further lowered.

In the first organic layer of the light emitting device of the present invention, the light emitting material represented by the formula (T) may be contained singly or in combination of two or more kinds thereof. In the second organic layer of the light emitting device of the present invention, the crosslinked body of the polymer compound of the second organic layer may be contained singly or in combination of two or more kinds thereof.

In the light emitting device of the present invention, when the second organic layer is a hole transporting layer disposed between the anode and the first organic layer, it is preferable that a hole injection layer is further provided between the anode and the second organic layer, since the driving voltage of the light emitting device of the present invention is further lowered. When the second organic layer is a hole transporting layer disposed between the anode and the first organic layer, it is preferable that at least one of an electron injection layer and an electron transporting layer is further provided between the cathode and the first organic layer, since the driving voltage of the light emitting device of the present invention is further lowered.

In the light emitting device of the present invention, when the second organic layer is a second light emitting layer disposed between the anode and the first organic layer, it is preferable that at least one of a hole injection layer and a hole transporting layer is further provided between the anode and the second organic layer, since the driving voltage of the light emitting device of the present invention is further lowered. When the second organic layer is a second light emitting layer disposed between the anode and the first organic layer, it is preferable that at least one of an electron injection layer and an electron transporting layer is further provided between the cathode and the first organic layer, since the driving voltage of the light emitting device of the present invention is further lowered.

In the light emitting device of the present invention, when the second organic layer is a second light emitting layer disposed between the cathode and the first organic layer, it is preferable that at least one of a hole injection layer and a hole transporting layer is further provided between the anode and the first organic layer, since the driving voltage of the light emitting device of the present invention is further lowered. When the second organic layer is a second light emitting layer disposed between the cathode and the first organic layer, it is preferable that at least one of an electron injection layer and an electron transporting layer is further provided between the cathode and the second organic layer, since the driving voltage of the light emitting device of the present invention is further lowered.

In the light emitting device of the present invention, when the second organic layer is an electron transporting layer disposed between the cathode and the first organic layer, it is preferable that at least one of a hole injection layer and a hole transporting layer is further provided between the anode and the first organic layer, since the driving voltage of the light emitting device of the present invention is further lowered. When the second organic layer is an electron transporting layer disposed between the cathode and the first organic layer, it is preferable that an electron injection layer is further provided between the cathode and the second organic layer, since the driving voltage of the light emitting device of the present invention is further lowered.

The specific layer constitution of the light emitting device of the present invention includes, for example, layer constitutions represented by (D1) to (D15). The light emitting device of the present invention usually has a substrate, and an anode may be first laminated on the substrate, or a cathode may be first laminated on the substrate.

(D1) anode/second light emitting layer (second organic layer)/first light emitting layer (first organic layer)/cathode (D2) anode/hole transporting layer (second organic layer)/first light emitting layer (first organic layer)/cathode (D3) anode/hole injection layer/second light emitting layer (second organic layer)/first light emitting layer (first organic layer)/cathode (D4) anode/hole injection layer/second light emitting layer (second organic layer)/first light emitting layer (first organic layer)/electron transporting layer/cathode (D5) anode/hole injection layer/second light emitting layer (second organic layer)/first light emitting layer (first organic layer)/electron injection layer/cathode (D6) anode/hole injection layer/second light emitting layer (second organic layer)/first light emitting layer (first organic layer)/electron transporting layer/electron injection layer/cathode (D7) anode/hole injection layer/hole transporting layer (second organic layer)/first light emitting layer (first organic layer)/cathode (D8) anode/hole injection layer/hole transporting layer (second organic layer)/first light emitting layer (first organic layer)/electron transporting layer/cathode (D9) anode/hole injection layer/hole transporting layer (second organic layer)/first light emitting layer (first organic layer)/electron injection layer/cathode (D10) anode/hole injection layer/hole transporting layer (second organic layer)/first light emitting layer (first organic layer)/electron transporting layer/electron injection layer/cathode (D11) anode/hole injection layer/hole transporting layer/second light emitting layer (second organic layer)/first light emitting layer (first organic layer)/electron transporting layer/electron injection layer/cathode (D12) anode/hole injection layer/hole transporting layer (second organic layer)/first light emitting layer (first organic layer)/second light emitting layer/electron transporting layer/electron injection layer/cathode (D13) anode/hole injection layer/hole transporting layer/first light emitting layer (first organic layer)/second light emitting layer (second organic layer)/electron transporting layer/electron injection layer/cathode (D14) anode/hole injection layer/hole transporting layer/first light emitting layer (first organic layer)/electron transporting layer (second organic layer)/electron injection layer/cathode (D15) anode/hole injection layer/hole transporting layer (second organic layer)/second light emitting layer/first light emitting layer (first organic layer)/electron transporting layer/electron injection layer/cathode In (D1) to (D15) described above, "/" means that layers before and after is are laminated adjacent to each other. Specifically, "second light emitting layer (second organic layer)/first light emitting layer (first organic layer)" means that a second light emitting layer (second organic layer) and a first light emitting layer (first organic layer) are laminated adjacent to each other.

Layer constitutions represented by (D3) to (D12) are preferable, layer constitutions represented by (D7) to (D10) are more preferable, since the driving voltage of the light emitting device of the present invention is further lowered.

In the light emitting device of the present invention, two or more layers of the anode, the hole injection layer, the hole transporting layer, the second light emitting layer, the electron transporting layer, the electron injection layer and the cathode may be provided, respectively, as necessary When a plurality of anodes, hole injection layers, hole transporting layers, second light emitting layers, electron transporting layers, electron injection layers and cathodes are present, they may be the same or different at each occurrence.

The thicknesses of the anode, the hole injection layer, the hole transporting layer, the first light emitting layer, the second light emitting layer, the electron transporting layer, the electron injection layer and the cathode are each usually 1 nm to 1 µm, preferably 2 nm to 500 nm, further preferably 5 nm to 150 nm.

In the light emitting device of the present invention, the order, the number and the thickness of layers to be laminated may be adjusted in consideration of the light emission efficiency, the driving voltage and the device life of the light emitting device.

[Second Light Emitting Layer]

The second light emitting layer is usually a layer containing a second organic layer and a light emitting material, and preferably a layer containing a light emitting material. When the second light emitting layer is a layer containing a light emitting material, the light emitting material contained in the second light emitting layer includes, for example, light emitting materials which the first composition may contain described above. The light emitting material contained in the second light emitting layer may be contained singly or in combination of two or more kinds thereof.

When the light emitting device of the present invention has a second light emitting layer and when a hole transporting layer described later and an electron transporting layer described later are not a second organic layer, it is preferable that the second light emitting layer is a second organic layer.

[Hole Transporting Layer]

The hole transporting layer is usually a layer containing a second organic layer or a hole transporting material, and preferably a second organic layer. When the hole transporting layer is a layer containing a hole transporting material, the hole transporting material includes, for example, hole transporting materials which the first composition may contain described above. The hole transporting material contained in the hole transporting layer may be contained singly or in combination of two or more kinds thereof.

When the light emitting device of the present invention has a hole transporting layer and when a second light emitting layer described above and an electron transporting layer described later are not a second organic layer, it is preferable that the hole transporting layer is a second organic layer.

[Electron Transporting Layer]

The electron transporting layer is usually a layer containing a second organic layer or an electron transporting material, and is preferably a layer containing an electron transporting material. When the electron transporting layer is a layer containing an electron transporting material, the electron transporting material contained in the electron transporting layer includes, for example, electron transporting materials which the first composition may contain described above. The electron transporting material contained in the electron transporting layer may be contained singly or in combination of two or more kinds thereof.

When the light emitting device of the present invention has an electron transporting layer and when a second light emitting layer described above and a hole transporting layer described above are not a second organic layer, it is preferable that the electron transporting layer is a second organic layer.

[Hole Injection Layer and Electron Injection Layer]

The hole injection layer is a layer containing a hole injection material. The hole injection material contained in the hole injection layer includes, for example, hole injection materials which the first composition may contain described above. The hole injection material contained in the hole injection layer may be contained singly or in combination of two or more kinds thereof.

The electron injection layer is a layer containing an electron injection material. The electron injection material contained in the electron injection layer includes, for example, electron injection materials which the first composition may contain described above. The electron injection material contained in the electron injection layer may be contained singly or in combination of two or more kinds thereof.

[Substrate/Electrode]

The substrate in the light emitting device may advantageously be a substrate on which an electrode can be formed and which does not change chemically in forming an organic layer, and is, for example, a substrate made of a material such as glass, plastic, silicon and the like. When an opaque substrate is used, it is preferable that the electrode farthest from the substrate is transparent or semi-transparent.

The material of the anode includes, for example, electrically conductive metal oxides and semi-transparent metals, preferably includes indium oxide, zinc oxide, tin oxide; electrically conductive compounds such as indium-tin-oxide (ITO), indium-zinc-oxide and the like; argentine-palladium-copper (APC) complex; NESA, gold, platinum, silver and copper.

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of at least one of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

In the light emitting device of the present invention, at least one of the anode and the cathode is usually transparent or semi-transparent, and it is preferable that the anode is transparent or semi-transparent.

The method for forming the anode and the cathode includes, for example, a vacuum vapor deposition method, a sputtering method, an ion plating method, a plating method and a lamination method.

[Production Method of Light Emitting Device]

The method for forming each of the first light emitting layer, the second light emitting layer, the hole transporting layer, the electron transporting layer, the hole injection layer, the electron injection layer and the like in the light emitting device of the present invention includes, when a low molecular compound is used, for example, a method of vacuum vapor deposition from a powder and a method of forming a film from a solution or melted state, and when a polymer compound is used, for example, a method of forming a film from a solution or melted state.

The first light emitting layer, the second light emitting layer, the hole transporting layer, the electron transporting layer, the hole injection layer and the electron injection layer can be formed by application methods such as a spin coat method, an inkjet printing method and the like using the first ink, the second ink, and inks containing the light emitting material, the hole transporting material, the electron transporting material, the hole injection material and the electron injection material described above, respectively.

[Application of Light Emitting Device]

In order to obtain planar light emission using a light emitting device, the planar anode and the planar cathode may be arranged so as to overlap each other. In order to obtain patterned light emission, there are a method of installing a mask having a patterned window on the surface of a planar light emitting device, a method in which a layer to be formed as a non-light emitting part is formed extremely thick so as to cause substantially non light emission and a method of forming an anode or a cathode, or both electrodes in a pattern. A segment type display capable of displaying numerals, letters and the like can be obtained by forming a pattern by any one of these methods and disposing several electrodes so that several electrodes can be turned on and off independently. In order to obtain a dot matrix display, both the anode and the cathode may be formed in a stripe shape and arranged so as to be orthogonal to each other. Partial color display and multicolor display become possible by a method of separately coating plural kinds of polymer compounds having different emission colors or a method using a color filter or a fluorescence conversion filter. The dot matrix display can be driven passively or can be driven actively in combination with a TFT and the like. These displays can be used for displays of computers, televisions, portable terminals, and the like. The planar light emitting device can be suitably used as a planar light source for backlight of a liquid crystal display, or as a planar light source for illumination. If a flexible substrate is used, it can be used as a curved light source and a curved display.

EXAMPLES

The present invention will be illustrated further in detail by examples below, but the present invention is not limited to these examples.

In examples, the polystyrene-equivalent number-average molecular weight (Mn) and the polystyrene-equivalent weight-average molecular weight (Mw) of a polymer compound were determined by size exclusion chromatography (SEC) using tetrahydrofucan as a mobile phase. The measurement conditions of SEC are as follows.

A polymer compound to be measured was dissolved at a concentration of about 0.05% by mass in tetrahydrofuran, and 10 μL of the solution was injected into SEC. The mobile phase was run at a flow rate of 2.0 mL/min. As the column, PLgel MIXED-B (manufactured by Polymer Laboratories) was used. As the detector, UV-VIS detector (manufactured by Shimadzu Corp., trade name: SPD-10Avp) was used.

LC-MS was measured by the following method.

A measurement sample was dissolved in chloroform or tetrahydrofucan so as to give a concentration of about 2 mg/mL, and about 1 μL of the solution was injected into LC-MS (manufactured by Agilent, trade name: 1100LCMSD). As the mobile phase for LC-MS, acetonitrile and tetrahydrofuran were used while changing the ratio of them and run at a flow rate of 0.2 mL/min. As the column, L-column 2 ODS (3 μm) (manufactured by Chemical Evaluation and Research Institute, Japan, internal diameter: 2.1 mm, length: 100 mm, particle size: 3 μm) was used.

NMR was measured by the following method.

A measurement sample of 5 to 10 mg was dissolved in about 0.5 mL of deuterated chloroform ($CDCl_3$), deuterated tetrahydrofuran, deuterated dimethyl sulfoxide, deuterated acetone, deuterated N,N-dimethylformamide, deuterated toluene, deuterated methanol, deuterated ethanol, deuterated 2-propanol or deuterated methylene chloride, and NMR was measured using an NMR apparatus (manufactured by Agilent, trade name: INOVA300 or MERCURY 400VX).

As an indicator of the purity of the compound, the value of high performance liquid chromatography (HPLC) area percentage was used. This value is a value by HPLC (manufactured by Shimadzu Corp., trade name: LC-20A) at UV=254 nm unless otherwise stated. In this procedure, the compound to be measured was dissolved in tetrahydrofuran or chloroform so as to give a concentration of 0.01 to 0.2% by mass, and the solution was injected into HPLC in an amount of 1 to 10 μL depending on the concentration. As the mobile phase of HPLC, acetonitrile and tetrahydrofuran were used at a ratio of acetonitrile/tetrahydrofuran changing from 100/0 to 0/100 (volume ratio), and the solution was run at a flow rate of 1.0 mL/min. As the column, Kaseisorb LC ODS 2000 (manufactured by Tokyo Chemical Industry Co., Ltd.) or an ODS column having the equivalent performance was used. As the detector, a photo diode array detector (manufactured by Shimadzu Corp., trade name: SPD-M20A) was used.

For calculation of $\Delta E_{ST}$ and oscillator strength value of a compound, the structure of the ground state of the compound was optimized by the B3LYP level density functional method, and 6-31G* was used as the basis function in this operation. Using Gaussian09 as a quantum chemical calculation program, $\Delta E_{ST}$ and oscillator strength of a compound were calculated by the B3LYP level time-dependent density functional method.

<Synthesis Examples T1 and T2> Synthesis of Light Emitting Materials T1 and T2

A light emitting material T1 was synthesized as well as a method described in International Publication WO2010/136109.

A light emitting material T2 was synthesized as well as a method described in International Publication WO2007/063754.

[Chemical Formula 92]

Light emitting material T1

Light emitting material T2

$\Delta E_{ST}$ and oscillator strength of the light emitting material T1 were 0.1295 eV and 0.0011, respectively.

$\Delta E_{ST}$ and oscillator strength of the light emitting material T2 were 0.1072 eV and 0.0062, respectively.

<Synthesis Example T3> Synthesis of Light Emitting Material T3

[Chemical Formula 93]

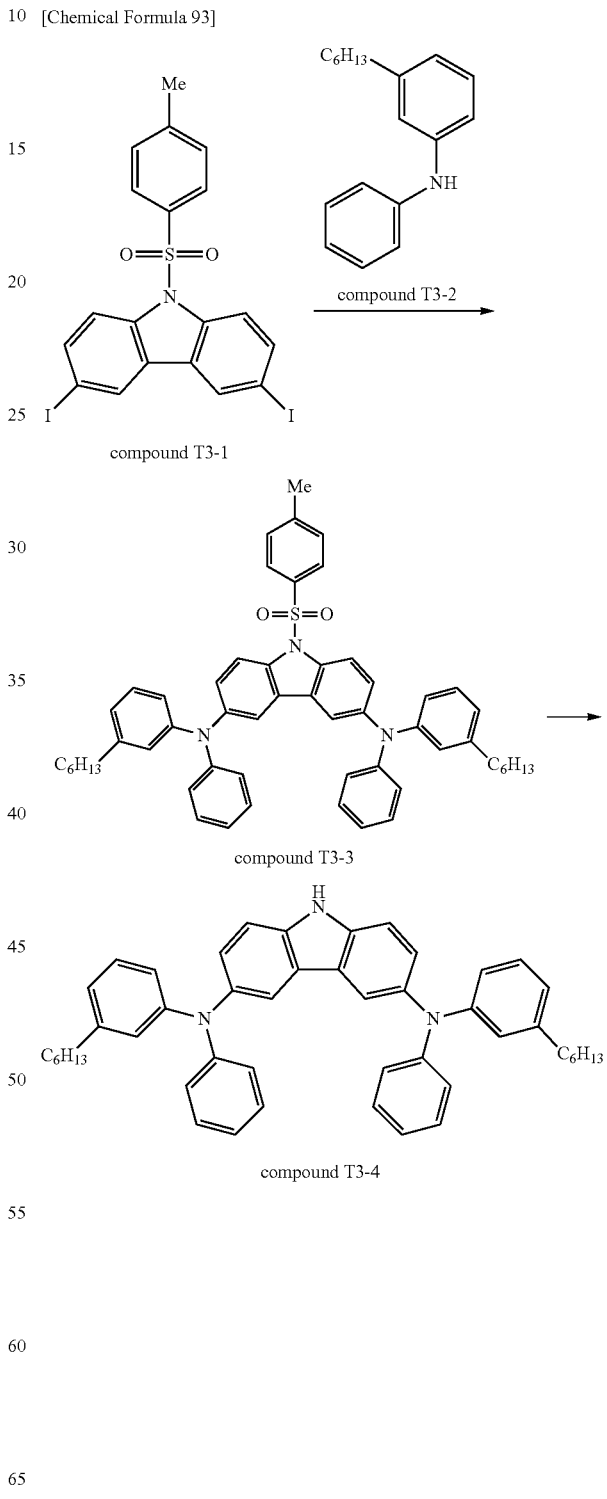

compound T3-1 compound T3-2 compound T3-3 compound T3-4

[Chemical Formula 94]

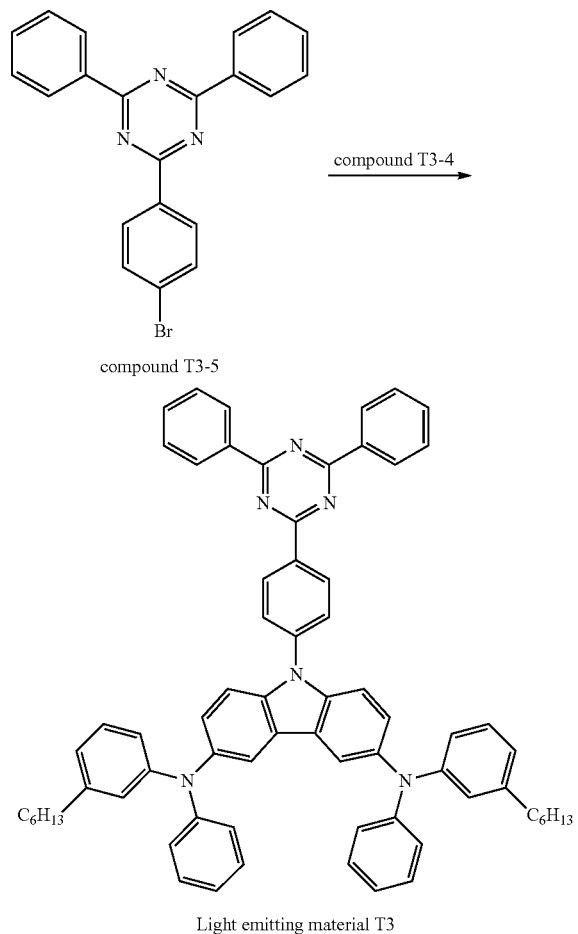

Light emitting material T3

(Synthesis of Compound T3-3)

An argon atmosphere was prepared in a reaction vessel, then, the compound T3-1 (2.5 g), the compound T3-2 (2.8 g), tris(dibenzylideneacetone)dipalladium(0) (0.25 g), tri-tert-butylphosphonium tetrafluoroborate (0.13 g), sodium tert-butoxide (1.3 g) and toluene (75 ml) were added, and stirred at room temperature for 1 hour. Thereafter, to this were added hexane and silica gel, and the mixture was stirred at 50° C., then, filtrated through a filter paved with silica gel. The resultant filtrate was concentrated under reduced pressure, to obtain a solid. The resultant solid was purified by silica gel column chromatography (a mixed solvent of hexane and toluene), then, dried under reduced pressure at 50° C., to obtain a coarse product (3.1 g, brown oil) of a compound T3-3. To the resultant coarse product were added hexane and activated carbon, and the mixture was stirred at room temperature, then, filtrated under reduced pressure. The resultant filtrate was concentrated under reduced pressure, to obtain a compound T3-3 (2.7 g, yellow solid). The compound T3-3 had a HPLC area percentage value of 98.5%.

$^1$H-NMR (CDCl$_3$, 400 MHz): δ (ppm)=8.20-8.11 (m, 2H), 7.74-6.85 (m, 26H), 2.50-2.30 (m, 7H), 1.53-0.82 (m, 22H).

(Synthesis of Compound T3-4)

A nitrogen atmosphere was prepared in a reaction vessel, then, the compound T3-3 (2.6 g), tetrahydrofuran (26 ml), dimethyl sulfoxide (16 ml) and a 33% by mass potassium hydroxide aqueous solution (5.4 g) were added, and stirred for 6.5 hours under reflux. The resultant mixture was cooled down to room temperature, then, extraction was performed using a mixed solution of ion exchanged water and toluene, and further, the resultant organic layer was washed with ion exchanged water. The resultant organic layer was dried over anhydrous sodium sulfate, then, filtrated, and the resultant filtrate was concentrated under reduced pressure, to obtain a coarse product. The resultant coarse product was purified by silica gel column chromatography (a mixed solvent of hexane and toluene), then, dried under reduced pressure at 50° C., to obtain a compound T3-4 (2.1 g, brown oil). The compound T3-4 had a HPLC area percentage value of 97.6%.

(Synthesis of Light Emitting Material T3)

A nitrogen atmosphere was prepared in a reaction vessel, then, the compound T3-4 (2.1 g), the compound T3-5 (1.3 g), palladium acetate (0.071 g), tri-tert-butylphosphonium tetrafluoroborate (0.096 g) and xylene (84 ml) were added. Thereafter, to this was added sodium tert-butoxide (0.76 g), and the mixture was stirred at 100° C. for 1 hour. The resultant mixture was cooled down to room temperature, then, hexane and silica gel were added and the mixture was stirred at room temperature, then, filtrated through a filter paved with silica gel. The resultant filtrate was concentrated under reduced pressure, to obtain a coarse product. The resultant coarse product was crystallized with a mixed solvent of hexane and ethanol, to obtain a solid. The resultant solid was purified by silica gel column chromatography (a mixed solvent of hexane and toluene), and further, crystallized with a mixed solvent of toluene, ethyl acetate and acetonitrile. The resultant solid was dried under reduced pressure at 50° C., to obtain a light emitting material T3 (1.2 g, yellow solid). The light emitting material T3 had a HPLC area percentage value of 99.5% or more.

LC-MS (APCI, positive): m/z=977.5 [M+H]+

$^1$H-NMR (CDCl$_3$, 400 MHz): δ (ppm)=9.06-8.98 (m, 2H), 8.82-8.80 (m, 4H), 7.90-6.80 (m, 32H), 2.54-2.43 (m, 4H), 1.53-1.49 (m, 4H), 1.25 (m, 12H), 0.85-0.83 (m, 6H).

$\Delta E_{ST}$ and oscillator strength of the light emitting material T3 were 0.1088 eV and 0.1848, respectively.

<Light Emitting Materials T4 to T6, TC1 and TC2>

Light emitting materials T4, T5, T6, TC1 and TC2 were purchased from Luminescense Technology.

[Chemical Formula 95]

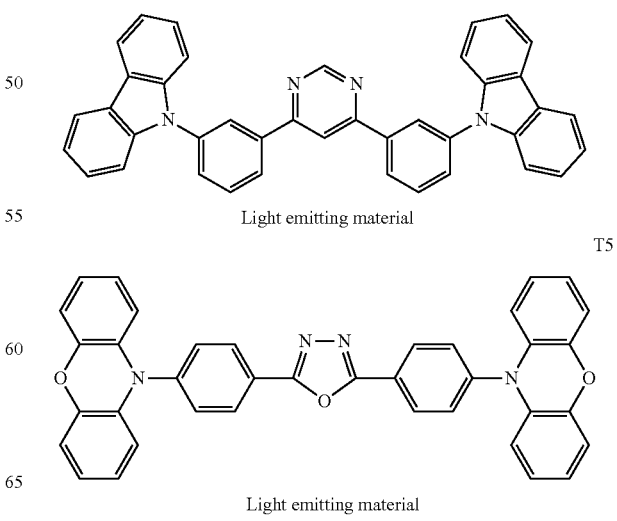

Light emitting material T4

Light emitting material T5

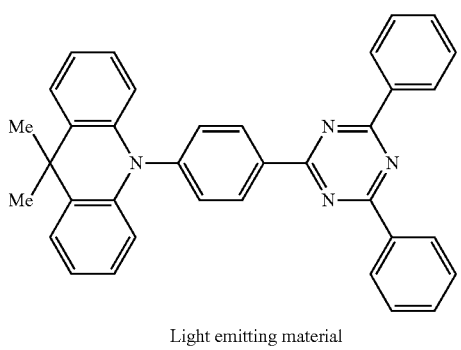

T6

Light emitting material

[Chemical Formula 97]

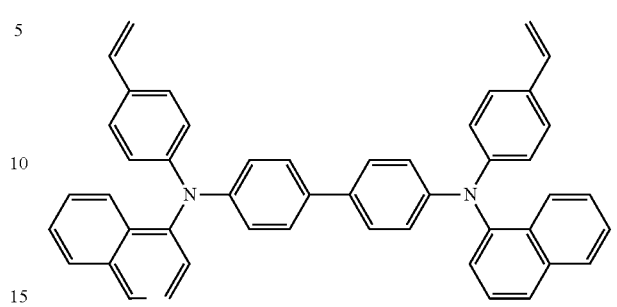

compound HTL-M1

[Chemical Formula 96]

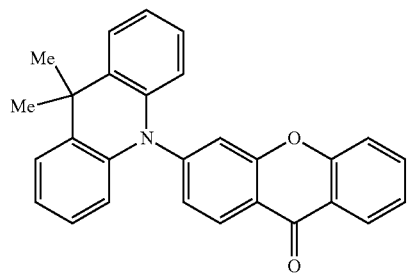

TC1

Light emitting material

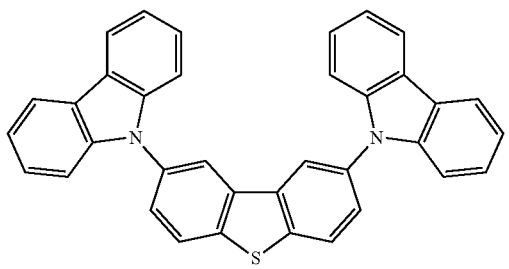

compound HM-1

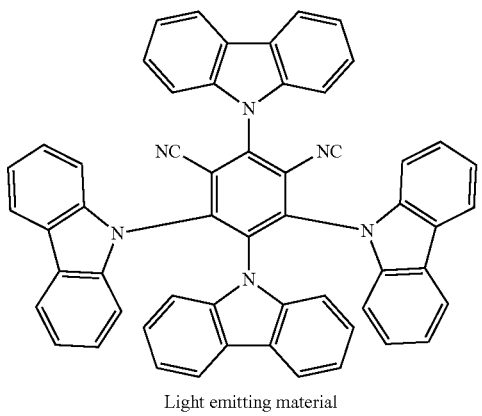

TC2

Light emitting material $\Delta E_{ST}$ and oscillator strength of the light emitting material T4 were 0.1563 eV and 0.0069, respectively.

$\Delta E_{ST}$ and oscillator strength of the light emitting material T5 were 0.0265 eV and 0.0323, respectively.

$\Delta E_{ST}$ and oscillator strength of the light emitting material T6 were 0.0065 eV and 0, respectively.

$\Delta E_{ST}$ and oscillator strength of the light emitting material TC1 were 0.0102 eV and 0, respectively.

$\Delta E_{ST}$ and oscillator strength of the light emitting material TC2 were 0.1185 eV and 0.0574, respectively.

<Compounds HTL-M1 and HM-1>

Compounds HTL-M1 and HM-1 were purchased from Luminescense Technology.

<Synthesis Example M1> Synthesis of Compounds M1 to M11

A compound M1 and a compound M3 were synthesized according to a method described in JP-A No. 2010-189630.

A compound M2 was synthesized according to a method described in International Publication WO2012/086671.

A compound M4 and a compound M5 were synthesized according to a method described in International Publication WO2013/191088.

Compounds M6, M7 and M13 were synthesized according to a method described in International Publication WO2002/045184.

A compound M8 was synthesized according to a method described in International Publication WO2011/049241.

A compound M9 was synthesized according to a method described in International Publication WO2015/145871.

A compound M10 was synthesized according to a method described in International Publication WO2013/146806.

A compound M11 was synthesized according to a method described in International Publication WO2005/049546.

Compounds M12 and M16 were synthesized according to a method described in JP-A No. 2011-174062.

A compound M14 was synthesized according to a method described in JP-A No. 2010-215886.

Compounds M15, M18, M20, M23 and M24 were synthesized according to a method described in International Publication WO2016/031639.

A compound M17 was synthesized according to a method described in JP-A No. 2008-106241.

A compound M19 was synthesized as well as a method described in JP-A No. 2014-1328.

A compound M21 and a compound M22 were synthesized according to a method described in International Publication WO2013/191088.

[Chemical Formula 98]

compound M1, compound M2, compound M3

[Chemical Formula 99]

compound M4, compound M5

[Chemical Formula 100]

compound M6, compound M7, compound M8

[Chemical Formula 101]

compound M9

-continued
compound M10
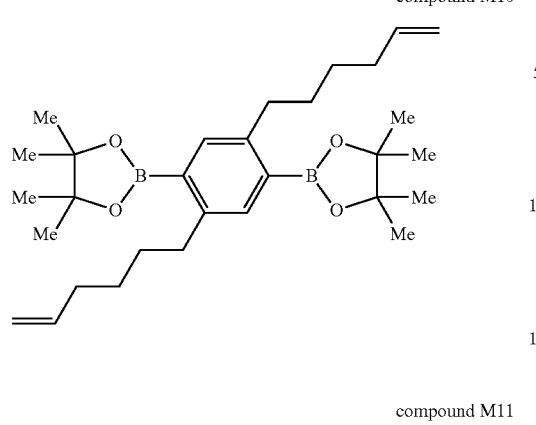
compound M11
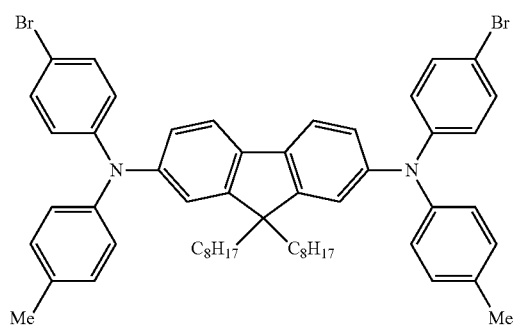
[Chemical Formula 102]
compound M12
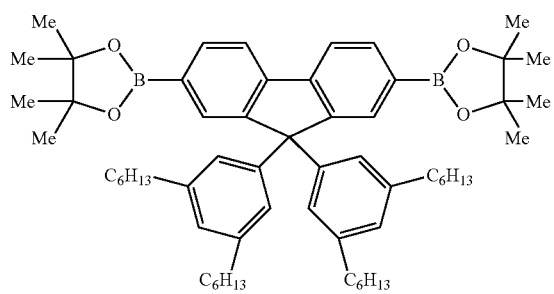
compound M13
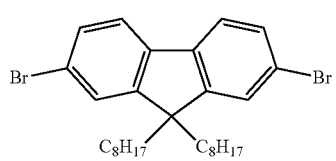
compound M14
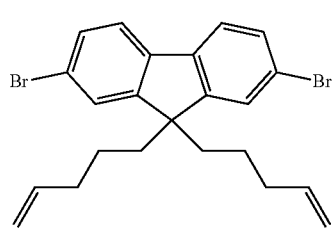
-continued
[Chemical Formula 103]
compound M15
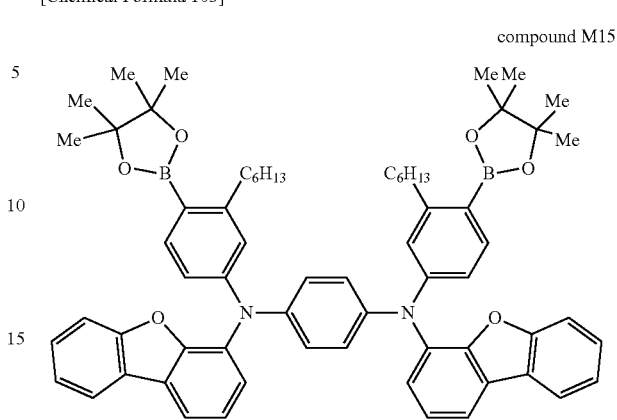
compound M16
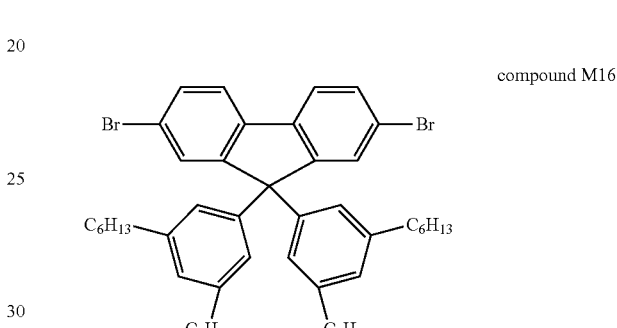
compound M17
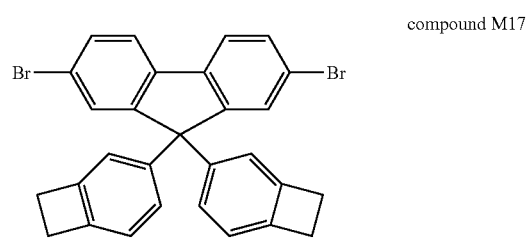
[Chemical Formula 104]
compound M18
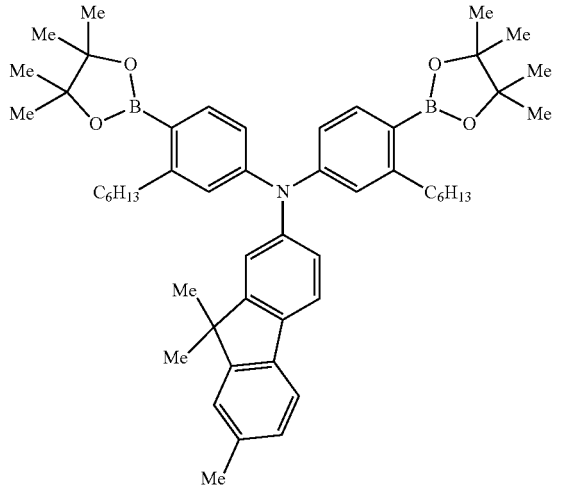

-continued compound M19
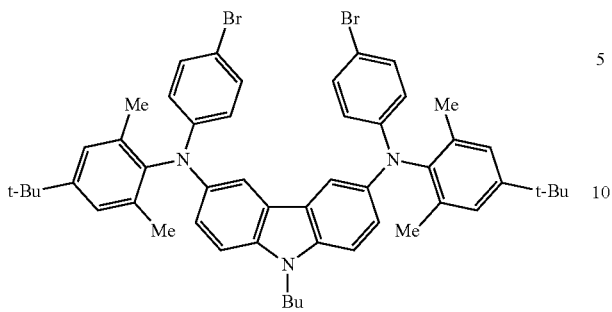

compound M20
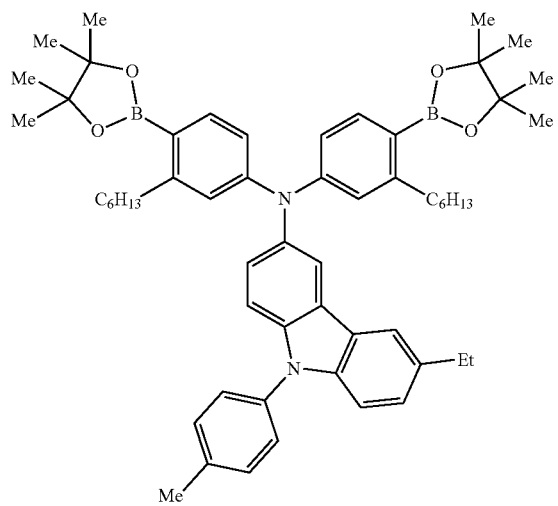

[Chemical Formula 105]

compound M21 compound M22
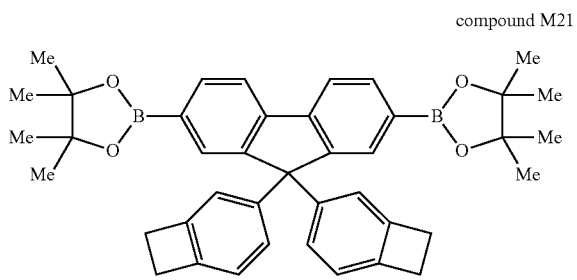

-continued compound M23
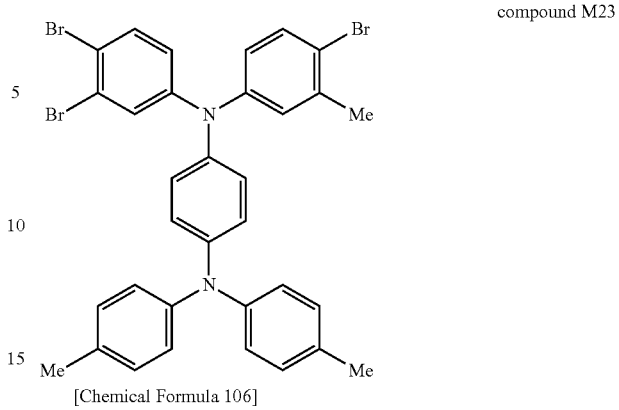

[Chemical Formula 106]

compound M24
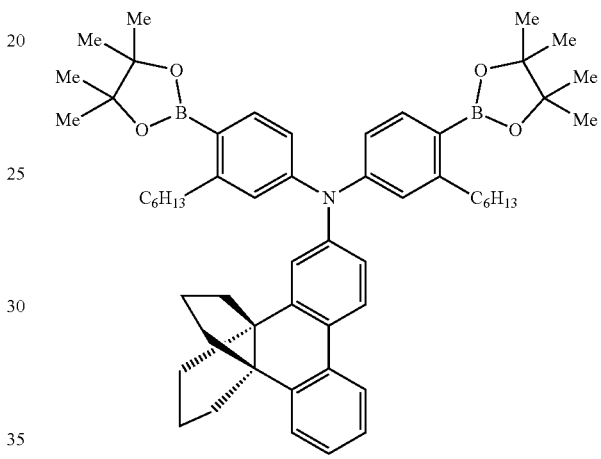

<Synthesis Example HP1> Synthesis of Polymer Compound HP-1

The polymer compound HP-1 was synthesized according to a method described in JP-A No. 2012-036388 using the compound M1, the compound M2 and the compound M3. The polymer compound HP-1 had an Mn of $9.6 \times 10^4$ and an Mw of $2.2 \times 10^5$.

The polymer compound HP-1 is a copolymer constituted of a constitutional unit derived from the compound M1, a constitutional unit derived from the compound M2, a constitutional unit derived from the compound M3 at a molar ratio of 50:40:10 according to the theoretical values determined from the amounts of the charging raw materials.

<Synthesis Example HP2> Synthesis of Polymer Compound HP-2

The polymer compound HP-2 was synthesized according to a method described in International Publication WO2015/008851 using the compound M1, the compound M4 and the compound M5. The polymer compound HP-2 had an Mn of $8.5 \times 10^4$ and an Mw of $2.2 \times 10^5$.

The polymer compound HP-2 is a copolymer constituted of a constitutional unit derived from the compound M1, a constitutional unit derived from the compound M4, a constitutional unit derived from the compound M5 at a molar ratio of 50:26:24 according to the theoretical values determined from the amounts of the charging raw materials.

<Synthesis Example HTL1> Synthesis of Polymer Compound HTL-1

The polymer compound HTL-1 was synthesized according to a method described in JP-A No. 2012-36381 using the compound M6 and the compound M7. The polystyrene-equivalent number-average molecular weight and the polystyrene-equivalent weight-average molecular weight of the polymer compound HTL-1 were Mn=$8.1 \times 10^4$ and Mw=$3.4 \times 10^5$, respectively.

The polymer compound HTL-1 is a copolymer constituted of a constitutional unit derived from the compound M6, a constitutional unit derived from the compound M7 at a molar ratio of 50:50 according to the theoretical values determined from the amounts of the charging raw materials.

<Synthesis Example HTL2> Synthesis of Polymer Compound HTL-2

The polymer compound HTL-2 was synthesized according to a method described in International Publication WO2011/049241 using the compound M6, the compound M7 and the compound M8. The polystyrene-equivalent number-average molecular weight and the polystyrene-equivalent weight-average molecular weight of the polymer compound HTL-2 were Mn=$8.9 \times 10^4$ and Mw=$4.2 \times 10^5$, respectively.

The polymer compound HTL-2 is a copolymer constituted of a constitutional unit derived from the compound M6, a constitutional unit derived from the compound M7, a constitutional unit derived from the compound M8 at a molar ratio of 50:42.5:7.5 according to the theoretical values determined from the amounts of the charging raw materials.

<Synthesis Example HTL3> Synthesis of Polymer Compound HTL-3

The polymer compound HTL-3 was synthesized according to a method described in International Publication WO2015/194448 using the compound M1 and the compound M11. The polystyrene-equivalent number-average molecular weight and the polystyrene-equivalent weight-average molecular weight of the polymer compound HTL-3 were Mn=$4.5 \times 10^4$ and Mw=$1.5 \times 10^5$, respectively.

The polymer compound HTL-3 is a copolymer constituted of a constitutional unit derived from the compound M1, a constitutional unit derived from the compound M11 at a molar ratio of 50:50 according to the theoretical values determined from the amounts of the charging raw materials.

<Synthesis Example HTL4> Synthesis of Polymer Compound HTL-4

The polymer compound HTL-4 was synthesized according to a method described in International Publication WO2013/146806 using the compound M1, the compound M11 and the compound M8. The polymer compound HTL-4 had an Mn of $1.9 \times 10^4$ and an Mw of $9.9 \times 10^4$.

The polymer compound HTL-4 is a copolymer constituted of a constitutional unit derived from the compound M1, a constitutional unit derived from the compound M11, a constitutional unit derived from the compound M8 at a molar ratio of 50:42.5:7.5 according to the theoretical values determined from the amounts of the charging raw materials.

<Synthesis Example HTL5> Synthesis of Polymer Compound HTL-5

The polymer compound HTL-5 was synthesized according to a method described in International Publication WO2015/145871 using the compound M9, the compound M10 and the compound M11. The polystyrene-equivalent number-average molecular weight and the polystyrene-equivalent weight-average molecular weight of the polymer compound HTL-5 were Mn=$2.3 \times 10^4$ and Mw=$1.2 \times 10^5$, respectively.

The polymer compound HTL-5 is a copolymer constituted of a constitutional unit derived from the compound M9, a constitutional unit derived from the compound M10, a constitutional unit derived from the compound M11 at a molar ratio of 45:5:50 according to the theoretical values determined from the amounts of the charging raw materials.

<Synthesis Example HTL6> Synthesis of Polymer Compound HTL-6

The polymer compound HTL-6 was synthesized as well as a method described in JP-A No. 2012-144722 using the compound M12, the compound M11, the compound M13 and the compound M4. The polymer compound HTL-6 had an Mn of $5.0 \times 10^4$ and an Mw of $2.5 \times 10^5$.

The polymer compound HTL-6 is a copolymer constituted of a constitutional unit derived from the compound M12, a constitutional unit derived from the compound M11, a constitutional unit derived from the compound M13, a constitutional unit derived from the compound M14 at a molar ratio of 50:30:12.5:7.5 according to the theoretical values determined from the amounts of the charging raw materials.

<Synthesis Example HTL7> Synthesis of Polymer Compound HTL-7

The polymer compound HTL-7 was synthesized as well as a method described in International Publication WO2016/125560 using the compound M15, the compound M16, the compound M17 and the compound M14. The polymer compound HTL-7 had an Mn of $2.4 \times 10^4$ and an Mw of $1.7 \times 10^5$.

The polymer compound HTL-7 is a copolymer constituted of a constitutional unit derived from the compound M15, a constitutional unit derived from the compound M16, a constitutional unit derived from the compound M17, a constitutional unit derived from the compound M14 at a molar ratio of 50:40:5:5 according to the theoretical values determined from the amounts of the charging raw materials.

<Synthesis Example HTL8> Synthesis of Polymer Compound HTL-8

The polymer compound HTL-8 was synthesized according to a method described in International Publication WO2016/031639 using the compound M18, the compound M16, the compound M17 and the compound M14. The polymer compound HTL-8 had an Mn of $5.3 \times 10^4$ and an Mw of $2.0 \times 10^5$.

The polymer compound HTL-8 is a copolymer constituted of a constitutional unit derived from the compound M18, a constitutional unit derived from the compound M16, a constitutional unit derived from the compound M17, a constitutional unit derived from the compound M14 at a molar ratio of 50:40:5:5 according to the theoretical values determined from the amounts of the charging raw materials.

<Synthesis Example HTL9> Synthesis of Polymer Compound HTL-9

The polymer compound HTL-9 was synthesized as well as a method described in JP-A No. 2014-1328 using the compound M1, the compound M19, the compound M17 and the compound M14. The polymer compound HTL-9 had an Mn of $1.8 \times 10^4$ and an Mw of $1.5 \times 10^5$.

The polymer compound HTL-9 is a copolymer constituted of a constitutional unit derived from the compound M1, a constitutional unit derived from the compound M19, a constitutional unit derived from the compound M17, a constitutional unit derived from the compound M14 at a molar ratio of 50:40:5:5 according to the theoretical values determined from the amounts of the charging raw materials.

<Synthesis Example HTL10> Synthesis of Polymer Compound HTL-10

The polymer compound HTL-10 was synthesized according to a method described in International Publication WO2016/031639 using the compound M20, the compound M16, the compound M17 and the compound M14. The polymer compound HTL-10 had an Mn of $4.2 \times 10^4$ and an Mw of $1.2 \times 10^5$.

The polymer compound HTL-10 is a copolymer constituted of a constitutional unit derived from the compound M20, a constitutional unit derived from the compound M16, a constitutional unit derived from the compound M17, a constitutional unit derived from the compound M14 at a molar ratio of 50:40:5:5 according to the theoretical values determined from the amounts of the charging raw materials.

<Synthesis Example HTL11> Synthesis of Polymer Compound HTL-11

The polymer compound HTL-11 was synthesized according to a method described in International Publication WO2016/031639 using the compound M12, the compound M21, the compound M22 and the compound M23. The polymer compound HTL-11 had an Mn of $5.1 \times 10^4$ and an Mw of $2.0 \times 10^5$.

The polymer compound HTL-11 is a copolymer constituted of a constitutional unit derived from the compound M12, a constitutional unit derived from the compound M21, a constitutional unit derived from the compound M22, a constitutional unit derived from the compound M23 at a molar ratio of 40:5:5:50 according to the theoretical values determined from the amounts of the charging raw materials.

<Synthesis Example HTL12> Synthesis of Polymer Compound HTL-12

The polymer compound HTL-12 was synthesized according to a method described in International Publication WO2016/125560 using the compound M24, the compound M16, the compound M17 and the compound M14. The polymer compound HTL-12 had an Mn of $5.2 \times 10^4$ and an Mw of $2.2 \times 10^5$.

The polymer compound HTL-12 is a copolymer constituted of a constitutional unit derived from the compound M24, a constitutional unit derived from the compound M16, a constitutional unit derived from the compound M17, a constitutional unit derived from the compound M14 at a molar ratio of 50:40:5:5 according to the theoretical values determined from the amounts of the charging raw materials.

<Synthesis Example HTL13> Synthesis of Polymer Compound HTL-13

The polymer compound HTL-13 was synthesized according to a method described in JP-A No. 2012-144722 using the compound M12, the compound M11, the compound M13 and the compound M17. The polymer compound HTL-13 had an Mn of $7.8 \times 10^4$ and an Mw of $2.6 \times 10^5$.

The polymer compound HTL-13 is a copolymer constituted of a constitutional unit derived from the compound M12, a constitutional unit derived from the compound M11, a constitutional unit derived from the compound M13, a constitutional unit derived from the compound M17 at a molar ratio of 50:30:12.5:7.5 according to the theoretical values determined from the amounts of the charging raw materials.

<Example D1> Fabrication and Evaluation of Light Emitting Device D1

(Formation of Anode and Hole Injection Layer)

An ITO film was deposited with a thickness of 45 nm on a glass substrate by a sputtering method to form an anode. On the anode, ND-3202 (manufactured by Nissan Chemical Industries, Ltd.) as a hole injection material was spin-coated to form a film with a thickness of 50 nm. Under an air atmosphere, the film was heated at 50° C. for 3 minutes, and further, heated at 230° C. for 15 minutes, to form a hole injection layer.

(Formation of Second Organic Layer)

The polymer compound HTL-2 was dissolved at a concentration of 0.6% by mass in xylene. The resultant xylene solution was spin-coated on the hole injection layer, to form a film with a thickness of 20 nm, and the film was heated on a hot plate at 200° C. for 30 minutes under a nitrogen gas atmosphere, to form a second organic layer. By this heating, the polymer compound HTL-2 became a crosslinked body.

(Formation of First Organic Layer)

The compound HM-1 and the light emitting material T1 (compound HM-1/light emitting material T1=85% by mass/ 15% by mass) were dissolved at a concentration of 2% by mass in toluene. The resultant toluene solution was spin-coated on the second organic layer to form a film with a thickness of 70 nm, and the film was heated at 130° C. for 10 minutes under a nitrogen gas atmosphere, to form a first organic layer.

(Formation of Cathode)

The substrate carrying the first organic layer formed was placed in a vapor deposition machine, and the pressure in the machine was reduced to $1.0 \times 10^{-4}$ Pa or less, then, sodium fluoride was vapor-deposited with a thickness of about 4 nm on the first organic layer, then, aluminum was vapor-deposited with a thickness of about 80 nm on the sodium fluoride layer, as a cathode. After vapor deposition, sealing with a glass substrate was performed, to fabricate a light emitting device D1.

(Evaluation of Light Emitting Device)

By applying voltage to the light emitting device D1, EL emission having the maximum peak of the light emission spectrum at 505 nm was observed, and this light emission was light emission derived from the light emitting material T1. The driving voltage at 1000 cd/m$^2$ was 10.6 [V]. The driving voltage at 500 cd/m$^2$ was 8.8 [V].

<Example D2> Fabrication and Evaluation of Light Emitting Device D2

A light emitting device D2 was fabricated in the same manner as in Example D1 except that "the polymer compound HP-1 and the light emitting material T1 (polymer compound HP-1/light emitting material T1=85% by mass/

15% by mass) were dissolved at a concentration of 1.8% by mass in xylene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1. By applying voltage to the light emitting device D2, EL emission having the maximum peak of the light emission spectrum at 500 nm was observed, and this light emission was light emission derived from the light emitting material T1. The driving voltage at 1000 cd/m² was 7.6 [V]. The driving voltage at 500 cd/m² was 6.8 [V].

<Example D3> Fabrication and Evaluation of Light Emitting Device D3

A light emitting device D3 was fabricated in the same manner as in Example D1 except that "the polymer compound HP-2 and the light emitting material T1 (polymer compound HP-2/light emitting material T1=85% by mass/15% by mass) were dissolved at a concentration of 1.8% by mass in xylene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1. By applying voltage to the light emitting device D3, EL emission having the maximum peak of the light emission spectrum at 500 nm was observed, and this light emission was light emission derived from the light emitting material T1. The driving voltage at 1000 cd/m² was 9.2 [V]. The driving voltage at 50 cd/m² was 6.5 [V].

<Comparative Example CD1> Fabrication and Evaluation of Light Emitting Device CD1

A light emitting device CD1 was fabricated in the same manner as in Example D1 except that "the polymer compound HTL-1" was used instead of "the polymer compound HTL-2" in (Formation of second organic layer) in Example D1. By applying voltage to the light emitting device CD1, EL emission having the maximum peak of the light emission spectrum at 495 nm was observed, and this light emission was light emission derived from the light emitting material T1. The driving voltage at 1000 cd/m² was 11.5 [V].

<Example D4> Fabrication and Evaluation of Light Emitting Device D4

A light emitting device D5 was fabricated in the same manner as in Example D1 except that "light emitting material T3" was used instead of "light emitting material T1" in (Formation of first organic layer) in Example D1. By applying voltage to the light emitting device D5, EL emission having the maximum peak of the light emission spectrum at 525 nm was observed, and this light emission was light emission derived from the light emitting material T3. The driving voltage at 10000 cd/m² was 10.5 [V].

<Example D5> Fabrication and Evaluation of Light Emitting Device D5

A light emitting device D5 was fabricated in the same manner as in Example D1 except that "the polymer compound HP-1 and the light emitting material T3 (polymer compound HP-1/light emitting material T3=85% by mass/15% by mass) were dissolved at a concentration of 1.8% by mass in xylene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1. By applying voltage to the light emitting device D5, EL emission having the maximum peak of the light emission spectrum at 515 nm was observed, and this light emission was light emission derived from the light emitting material T3. The driving voltage at 10000 cd/m² was 9.2 [V].

<Example D6> Fabrication and Evaluation of Light Emitting Device D6

A light emitting device D6 was fabricated in the same manner as in Example D1 except that "the polymer compound HP-1 and the light emitting material T3 (polymer compound HP-1/light emitting material T3=85% by mass/15% by mass) were dissolved at a concentration of 1.8% by mass in xylene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1 and "the polymer compound HTL-5" was used instead of "the polymer compound HTL-2" in (Formation of second organic layer) in Example D1. By applying voltage to the light emitting device D6, EL emission having the maximum peak of the light emission

TABLE 3

| | light emitting device | second organic layer | first organic layer | | |
|---|---|---|---|---|---|
| | | | composition | composition ratio (% by mass) | driving voltage (V) (1000 cd/m²) |
| Example D1 | D1 | Crosslinked body of HTL-2 | HM-1/T1 | 85/15 | 10.6 |
| Example D2 | D2 | Crosslinked body of HTL-2 | HP-1/T1 | 85/15 | 7.6 |
| Example D3 | D3 | Crosslinked body of HTL-2 | HP-2/T1 | 85/15 | 9.2 |
| Comparative Example CD1 | CD1 | HTL-1 | HM-1/T1 | 85/15 | 11.5 | spectrum at 515 nm was observed, and this light emission was light emission derived from the light emitting material T3. The driving voltage at 10000 cd/m² was 9.4 [V].

<Example D7> Fabrication and Evaluation of Light Emitting Device D7

A light emitting device D7 was fabricated in the same manner as in Example D1 except that "the polymer compound HP-1 and the light emitting material T3 (polymer compound HP-1/light emitting material T3=85% by mass/15% by mass) were dissolved at a concentration of 1.8% by mass in xylene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1, and "the polymer compound HTL-4" was used instead of "the polymer compound HTL-2" in (Formation of second organic layer) in Example D1. By applying voltage to the light emitting device D7, EL emission having the maximum peak of the light emission spectrum at 515 nm was observed, and this light emission was light emission derived from the light emitting material T3. The driving voltage at 10000 cd/m² was 8.9 [V].

<Example D8> Fabrication and Evaluation of Light Emitting Device D8

A light emitting device D5 was fabricated in the same manner as in Example D1 except that "the polymer compound HP-2 and the light emitting material T3 (polymer compound HP-2/light emitting material T3=85% by mass/15% by mass) were dissolved at a concentration of 1.8% by mass in xylene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1. By applying voltage to the light emitting device D5, EL emission having the maximum peak of the light emission spectrum at 510 nm was observed, and this light emission was light emission derived from the light emitting material T3. The driving voltage at 10000 cd/m² was 10.0 [V].

<Comparative Example CD2> Fabrication and Evaluation of Light Emitting Device CD2

A light emitting device CD2 was fabricated in the same manner as in Example D1 except that "light emitting material T3" was used instead of "light emitting material T1" in (Formation of first organic layer) in Example D1, and "the polymer compound HTL-1" was used instead of "the polymer compound HTL-2". By applying voltage to the light emitting device CD2, EL emission having the maximum peak of the light emission spectrum at 520 nm was observed, and this light emission was light emission derived from the light emitting material T3. The driving voltage at 10000 cd/m² was 11.0 [V].

TABLE 4

| | | | first organic layer | | |
| --- | --- | --- | --- | --- | --- |
| | light emitting device | second organic layer | composition | composition ratio (% by mass) | driving voltage (V) (10000 cd/m²) |
| Example D4 | D4 | Crosslinked body of HTL-2 | HM-1/T3 | 85/15 | 10.5 |
| Example D5 | D5 | Crosslinked body of HTL-2 | HP-1/T3 | 85/15 | 9.2 |
| Example D6 | D6 | Crosslinked body of HTL-5 | HP-1/T3 | 85/15 | 9.4 |
| Example D7 | D7 | Crosslinked body of HTL-4 | HP-1/T3 | 85/15 | 8.9 |
| Example D8 | D8 | Crosslinked body of HTL-2 | HP-2/T3 | 85/15 | 10.0 |
| Comparative Example CD2 | CD2 | HTL-1 | HM-1/T3 | 85/15 | 11.0 |

<Example D9> Fabrication and Evaluation of Light Emitting Device D9

A light emitting device D9 was fabricated in the same manner as in Example D1 except that "the compound HM-1 and the light emitting material T2 (compound HM-1/light emitting material T2=85% by mass/15% by mass) were dissolved at a concentration of 1.8% by mass in chlorobenzene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1, and "the polymer compound HTL-5" was used instead of "the polymer compound HTL-2" in (Formation of second organic layer) in Example D1. By applying voltage to the light emitting device D9, EL emission having the maximum peak of the light emission spectrum at 470 nm was observed, and this light emission was light emission derived from the light emitting material T2. The driving voltage at 500 cd/m² was 9.8 [V].

<Example D10> Fabrication and Evaluation of Light Emitting Device D10

A light emitting device D10 was fabricated in the same manner as in Example D1 except that "the compound HM-1 and the light emitting material T2 (compound HM-1/light emitting material T2=85% by mass/15% by mass) were dissolved at a concentration of 1.8% by mass in chlorobenzene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1, and "the polymer compound HTL-4" was used instead of "the polymer compound HTL-2" in (Formation of second organic layer) in Example D1. By applying voltage to the light emitting device D10, EL emission having the maximum peak of the light emission spectrum at 475 nm was observed, and this light emission was light emission derived from the light emitting material T2. The driving voltage at 500 cd/m$^2$ was 9.8 [V].

<Example D11> Fabrication and Evaluation of Light Emitting Device D11

A light emitting device D11 was fabricated in the same manner as in Example D1 except that "the compound HM-1 and the light emitting material T2 (compound HM-1/light emitting material T2=85% by mass/15% by mass) were dissolved at a concentration of 1.8% by mass in chlorobenzene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1. By applying voltage to the light emitting device D10, EL emission having the maximum peak of the light emission spectrum at 470 nm was observed, and this light emission was light emission derived from the light emitting material T2. The driving voltage at 500 cd/m$^2$ was 8.5 [V].

<Example D12> Fabrication and Evaluation of Light Emitting Device D12

A light emitting device D12 was fabricated in the same manner as in Example D1 except that "the polymer compound HP-2 and the light emitting material T2 (polymer compound HP-2/light emitting material T2=85% by mass/15% by mass) were dissolved at a concentration of 1.4% by mass in chlorobenzene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1, and "the polymer compound HTL-4" was used instead of "the polymer compound HTL-2" in (Formation of second organic layer) in Example D1. By applying voltage to the light emitting device D12, EL emission having the maximum peak of the light emission spectrum at 490 nm was observed, and this light emission was light emission derived from the light emitting material T2. The driving voltage at 500 cd/m$^2$ was 8.4 [V].

<Example D13> Fabrication and Evaluation of Light Emitting Device D13

A light emitting device D13 was fabricated in the same manner as in Example D1 except that "the polymer compound HP-2 and the light emitting material T2 (polymer compound HP-2/light emitting material T2=85% by mass/15% by mass) were dissolved at a concentration of 1.4% by mass in chlorobenzene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1. By applying voltage to the light emitting device D13, EL emission having the maximum peak of the light emission spectrum at 485 nm was observed, and this light emission was light emission derived from the light emitting material T2. The driving voltage at 500 cd/m$^2$ was 7.3 [V].

<Comparative Example CD3> Fabrication and Evaluation of Light Emitting Device CD3

A light emitting device CD3 was fabricated in the same manner as in Example D1 except that "the compound HM-1 and the light emitting material T2 (compound HM-1/light emitting material T2=85% by mass/15% by mass) were dissolved at a concentration of 1.8% by mass in chlorobenzene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1, and "the polymer compound HTL-3" was used instead of "the polymer compound HTL-2" in (Formation of second organic layer) in Example D1. By applying voltage to the light emitting device CD3, EL emission having the maximum peak of the light emission spectrum at 490 nm was observed, and this light emission was light emission derived from the light emitting material T2. The driving voltage at 500 cd/m$^2$ was 10.6 [V].

<Comparative Example CD4> Fabrication and Evaluation of Light Emitting Device CD4

A light emitting device CD4 was fabricated in the same manner as in Example D1 except that "the compound HM-1 and the light emitting material T2 (compound HM-1/light emitting material T2=85% by mass/15% by mass) were dissolved at a concentration of 1.8% by mass in chlorobenzene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1, and "the polymer compound HTL-1" was used instead of "the polymer compound HTL-2" in (Formation of second organic layer) in Example D1. By applying voltage to the light emitting device CD4, EL emission having the maximum peak of the light emission spectrum at 445 nm was observed, and this light emission is light emission derived from the polymer compound HTL-1, and the maximum peak of the light emission spectrum derived from the light emitting material T2 was not observed. Voltage was applied to the light emitting device CD4 up to 12 V, however, the emission luminance did not reach 500 cd/m$^2$.

<Comparative Example CD5> Fabrication and Evaluation of Light Emitting Device CD5

A light emitting device CD5 was fabricated in the same manner as in Example D1 except that "the compound HM-1 and the light emitting material T2 (compound HM-1/light emitting material T2=85% by mass/15% by mass) were dissolved at a concentration of 1.8% by mass in chlorobenzene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1, and "the compound HTL-M1" was used instead of "the polymer compound HTL-2" in (Formation of second organic layer) in Example D1. By applying voltage to the light emitting device CD5, EL emission having the maximum peak of the light emission spectrum at 470 nm was observed, and this light emission was light emission derived from the light emitting material T2. The driving voltage at 500 cd/m$^2$ was 10.9 [V].

TABLE 5

| light emitting device | second organic layer | first organic layer composition | first organic layer composition ratio (% by mass) | driving voltage (V) (500 cd/m$^2$) |
|---|---|---|---|---|
| Example D9 | D9 | Crosslinked body of HTL-5 | HM-1/T2 | 85/15 | 9.8 |
| Example D10 | D10 | Crosslinked body of HTL-4 | HM-1/T2 | 85/15 | 9.8 |
| Example D11 | D11 | Crosslinked body of HTL-2 | HM-1/T2 | 85/15 | 8.5 |
| Example D12 | D12 | Crosslinked body of HTL-4 | HP-2/T2 | 85/15 | 8.4 |
| Example D13 | D13 | Crosslinked body of HTL-2 | HP-2/T2 | 85/15 | 7.3 |
| Comparative Example CD3 | CD3 | HTL-3 | HM-1/T2 | 85/15 | 10.6 |
| Comparative Example CD4 | CD4 | HTL-1 | HM-1/T2 | 85/15 | — |
| Comparative Example CD5 | CD5 | Crosslinked body of HTL-M1 | HM-1/T2 | 85/15 | 10.9 |

<Example D14> Fabrication and Evaluation of Light Emitting Device D14

A light emitting device D14 was fabricated in the same manner as in Example D1 except that "the polymer compound HP-1 and the light emitting material T1 (polymer compound HP-1/light emitting material T1=85% by mass/15% by mass) were dissolved at a concentration of 1.8% by mass in xylene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1, and "the polymer compound HTL-5" was used instead of "the polymer compound HTL-2" in (Formation of second organic layer) in Example D1. By applying voltage to the light emitting device D14, EL emission having the maximum peak of the light emission spectrum at 520 nm was observed, and this light emission was light emission derived from the light emitting material T1. The driving voltage at 500 cd/m$^2$ was 6.9 [V].

<Example D15> Fabrication and Evaluation of Light Emitting Device D15

A light emitting device D15 was fabricated in the same manner as in Example D14 except that "the polymer compound HTL-4" was used instead of "the polymer compound HTL-5" in (Formation of second organic layer) in Example D14. By applying voltage to the light emitting device D15, EL emission having the maximum peak of the light emission spectrum at 520 nm was observed, and this light emission was light emission derived from the light emitting material T1. The driving voltage at 500 cd/m$^2$ was 6.7 [V].

<Example D16> Fabrication and Evaluation of Light Emitting Device D16

A light emitting device D16 was fabricated in the same manner as in Example D14 except that "the polymer compound HTL-6" was used instead of "the polymer compound HTL-5" in (Formation of second organic layer) in Example D14. By applying voltage to the light emitting device D16, EL emission having the maximum peak of the light emission spectrum at 520 nm was observed, and this light emission was light emission derived from the light emitting material T1. The driving voltage at 500 cd/m$^2$ was 9.9 [V].

<Example D17> Fabrication and Evaluation of Light Emitting Device D17

A light emitting device D17 was fabricated in the same manner as in Example D1 except that "the polymer compound HP-1 and the light emitting material T5 (polymer compound HP-1/light emitting material T5=85% by mass/15% by mass) were dissolved at a concentration of 1.8% by mass in xylene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1. By applying voltage to the light emitting device D17, EL emission having the maximum peak of the light emission spectrum at 495 nm was observed, and this light emission was light emission derived from the light emitting material T5. The driving voltage at 500 cd/m$^2$ was 7.2 [V].

<Comparative Example CD6> Fabrication and Evaluation of Light Emitting Device CD6

A light emitting device CD6 was fabricated in the same manner as in Example D1 except that "the polymer compound HP-1 and the light emitting material TC2 (polymer compound HP-1/light emitting material TC2=85% by mass/15% by mass) were dissolved at a concentration of 1.8% by mass in xylene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1. By applying voltage to the light emitting device CD6, EL emission having the maximum peak of the light emission spectrum at 515 nm was observed, and this light emission was light emission derived from the light emitting material TC2. The driving voltage at 500 cd/m$^2$ was 11.2 [V].

TABLE 6

| light emitting device | second organic layer | first organic layer composition | composition ratio (% by mass) | driving voltage (V) (500 cd/m$^2$) |
|---|---|---|---|---|
| Example D2 | D2 | Crosslinked body of HTL-2 | HP-1/T1 | 85/15 | 6.8 |
| Example D14 | D14 | Crosslinked body of HTL-5 | HP-1/T1 | 85/15 | 6.9 |
| Example D15 | D15 | Crosslinked body of HTL-4 | HP-1/T1 | 85/15 | 6.7 |
| Example D16 | D16 | Crosslinked body of HTL-6 | HP-1/T1 | 85/15 | 9.9 |
| Example D17 | D17 | Crosslinked body of HTL-2 | HP-1/T5 | 85/15 | 7.2 |
| Comparative Example CD6 | CD6 | Crosslinked body of HTL-2 | HP-1/TC2 | 85/15 | 11.2 |

<Example D18> Fabrication and Evaluation of Light Emitting Device D18

A light emitting device D18 was fabricated in the same manner as in Example D1 except that "the polymer compound HTL-6" was used instead of "the polymer compound HTL-2" in (Formation of second organic layer) in Example D1. By applying voltage to the light emitting device D18, EL emission having the maximum peak of the light emission spectrum at 505 nm was observed, and this light emission was light emission derived from the light emitting material T1. The driving voltage at 500 cd/m$^2$ was 9.6 [V].

<Comparative Example CD7> Fabrication and Evaluation of Light Emitting Device CD7

A light emitting device CD7 was fabricated in the same manner as in Example D1 except that "the compound HTL-M1" was used instead of "the polymer compound HTL-2" in (Formation of second organic layer) in Example D1. By applying voltage to the light emitting device CD7, EL emission having the maximum peak of the light emission spectrum at 485 nm was observed, and this light emission was light emission derived from the light emitting material T1. The driving voltage at 500 cd/m$^2$ was 11.6 [V].

<Example D19> Fabrication and Evaluation of Light Emitting Device D19

A light emitting device D19 was fabricated in the same manner as in Example D1 except that "light emitting material T3" was used instead of "light emitting material T1" in (Formation of first organic layer) in Example D1, and "the polymer compound HTL-7" was used instead of "the polymer compound HTL-2" in (Formation of second organic layer) in Example D1. By applying voltage to the light emitting device D19, EL emission having the maximum peak of the light emission spectrum at 515 nm was observed, and this light emission was light emission derived from the light emitting material T3. The driving voltage at 5000 cd/m$^2$ was 9.0 [V].

<Example D20> Fabrication and Evaluation of Light Emitting Device D20

A light emitting device D20 was fabricated in the same manner as in Example D19 except that "the polymer compound HTL-8" was used instead of "the polymer compound HTL-7" in (Formation of second organic layer) in Example D19. By applying voltage to the light emitting device D20, EL emission having the maximum peak of the light emission spectrum at 515 nm was observed, and this light emission

TABLE 7

| light emitting device | second organic layer | first organic layer composition | composition ratio (% by mass) | driving voltage (V) (500 cd/m$^2$) |
|---|---|---|---|---|
| Example D1 | D1 | Crosslinked body of HTL-2 | HM-1/T1 | 85/15 | 8.8 |
| Example D18 | D18 | Crosslinked body of HTL-6 | HM-1/T1 | 85/15 | 9.6 |
| Comparative Example CD7 | CD7 | Crosslinked body of HTL-M1 | HM-1/T1 | 85/15 | 11.6 |

<Example D21> Fabrication and Evaluation of Light Emitting Device D21

A light emitting device D21 was fabricated in the same manner as in Example D19 except that "the polymer compound HTL-9" was used instead of "the polymer compound HTL-7" in (Formation of second organic layer) in Example D19. By applying voltage to the light emitting device D21, EL emission having the maximum peak of the light emission spectrum at 515 nm was observed, and this light emission was light emission derived from the light emitting material T3. The driving voltage at 5000 cd/m$^2$ was 9.0 [V].

<Example D22> Fabrication and Evaluation of Light Emitting Device D22

A light emitting device D22 was fabricated in the same manner as in Example D19 except that "the polymer compound HTL-10" was used instead of "the polymer compound HTL-7" in (Formation of second organic layer) in Example D19. By applying voltage to the light emitting device D22, EL emission having the maximum peak of the light emission spectrum at 515 nm was observed, and this light emission was light emission derived from the light emitting material T3. The driving voltage at 5000 cd/m$^2$ was 8.8 [V].

<Example D23> Fabrication and Evaluation of Light Emitting Device D23

A light emitting device D23 was fabricated in the same manner as in Example D19 except that "the polymer compound HTL-11" was used instead of "the polymer compound HTL-7" in (Formation of second organic layer) in Example D19. By applying voltage to the light emitting device D23, EL emission having the maximum peak of the light emission spectrum at 515 nm was observed, and this light emission was light emission derived from the light emitting material T3. The driving voltage at 5000 cd/m$^2$ was 9.9 [V].

<Example D24> Fabrication and Evaluation of Light Emitting Device D24

A light emitting device D24 was fabricated in the same manner as in Example D19 except that "the polymer compound HTL-12" was used instead of "the polymer compound HTL-7" in (Formation of second organic layer) in Example D19. By applying voltage to the light emitting device D24, EL emission having the maximum peak of the light emission spectrum at 515 nm was observed, and this light emission was light emission derived from the light emitting material T3. The driving voltage at 5000 cd/m$^2$ was 9.3 [V].

<Example D25> Fabrication and Evaluation of Light Emitting Device D25

A light emitting device D25 was fabricated in the same manner as in Example D19 except that "the polymer compound HTL-13" was used instead of "the polymer compound HTL-7" in (Formation of second organic layer) in Example D19. By applying voltage to the light emitting device D25, EL emission having the maximum peak of the light emission spectrum at 520 nm was observed, and this light emission was light emission derived from the light emitting material T3. The driving voltage at 5000 cd/m$^2$ was 9.4 [V].

<Example D26> Fabrication and Evaluation of Light Emitting Device D26

A light emitting device D26 was fabricated in the same manner as in Example D19 except that "the polymer compound HTL-4" was used instead of "the polymer compound HTL-7" in (Formation of second organic layer) in Example D19. By applying voltage to the light emitting device D26, EL emission having the maximum peak of the light emission spectrum at 515 nm was observed, and this light emission was light emission derived from the light emitting material T3. The driving voltage at 5000 cd/m$^2$ was 9.0 [V].

<Example D27> Fabrication and Evaluation of Light Emitting Device D27

A light emitting device D27 was fabricated in the same manner as in Example D19 except that "the polymer compound HTL-5" was used instead of "the polymer compound HTL-7" in (Formation of second organic layer) in Example D19. By applying voltage to the light emitting device D27, EL emission having the maximum peak of the light emission spectrum at 515 nm was observed, and this light emission was light emission derived from the light emitting material T3. The driving voltage at 5000 cd/m$^2$ was 9.4 [V].

<Comparative Example CD8> Fabrication and Evaluation of Light Emitting Device CD8

A light emitting device CD8 was fabricated in the same manner as in Example D19 except that "the polymer compound HTL-3" was used instead of "the polymer compound HTL-7" in (Formation of second organic layer) in Example D19. By applying voltage to the light emitting device CD8, EL emission having the maximum peak of the light emission spectrum at 520 nm was observed, and this light emission was light emission derived from the light emitting material T3. The driving voltage at 5000 cd/m$^2$ was 10.7 [V].

<Comparative Example CD9> Fabrication and Evaluation of Light Emitting Device CD9

A light emitting device CD9 was fabricated in the same manner as in Example D19 except that "the compound HTL-M1" was used instead of "the polymer compound HTL-7" in (Formation of second organic layer) in Example D19. By applying voltage to the light emitting device CD9, EL emission having the maximum peak of the light emission spectrum at 525 nm was observed, and this light emission was light emission derived from the light emitting material T3. The driving voltage at 5000 cd/m$^2$ was 11.8 [V].

TABLE 8

| light emitting device | second organic layer | first organic layer composition | first organic layer composition ratio (% by mass) | driving voltage (V) (5000 cd/m²) |
|---|---|---|---|---|
| Example D19 | D19 | Crosslinked body of HTL-7 | HM-1/T3 | 85/15 | 9.0 |
| Example D20 | D20 | Crosslinked body of HTL-8 | HM-1/T3 | 85/15 | 9.8 |
| Example D21 | D21 | Crosslinked body of HTL-9 | HM-1/T3 | 85/15 | 9.0 |
| Example D22 | D22 | Crosslinked body of HTL-10 | HM-1/T3 | 85/15 | 8.8 |
| Example D23 | D23 | Crosslinked body of HTL-11 | HM-1/T3 | 85/15 | 9.9 |
| Example D24 | D24 | Crosslinked body of HTL-12 | HM-1/T3 | 85/15 | 9.3 |
| Example D25 | D25 | Crosslinked body of HTL-13 | HM-1/T3 | 85/15 | 9.4 |
| Example D26 | D26 | Crosslinked body of HTL-4 | HM-1/T3 | 85/15 | 9.0 |
| Example D27 | D27 | Crosslinked body of HTL-5 | HM-1/T3 | 85/15 | 9.4 |
| Comparative Example CD8 | CD8 | HTL-3 | HM-1/T3 | 85/15 | 10.7 |
| Comparative Example CD9 | CD9 | Crosslinked body of HTL-M1 | HM-1/T3 | 85/15 | 11.8 |

<Example D28> Fabrication and Evaluation of Light Emitting Device D28

A light emitting device D28 was fabricated in the same manner as in Example D1 except that "the polymer compound HP-2 and the light emitting material T1 (polymer compound HP-2/light emitting material T1=85% by mass/15% by mass) were dissolved at a concentration of 1.8% by mass in xylene." instead of "the compound HM-1 and the light emitting material T1 (compound HM-1/light emitting material T1=85% by mass/15% by mass) were dissolved at a concentration of 2% by mass in toluene." in (Formation of first organic layer) in Example D1, and "the polymer compound HTL-4" was used instead of "the polymer compound HTL-2" in (Formation of second organic layer) in Example D1. By applying voltage to the light emitting device D28, EL emission having the maximum peak of the light emission spectrum at 515 nm was observed, and this light emission was light emission derived from the light emitting material T1. The driving voltage at 50 cd/m² was 5.0 [V].

<Example D29> Fabrication and Evaluation of Light Emitting Device D29

A light emitting device D29 was fabricated in the same manner as in Example D28 except that "the polymer compound HTL-5" was used instead of "the polymer compound HTL-4" in (Formation of second organic layer) in Example D28. By applying voltage to the light emitting device D29, EL emission having the maximum peak of the light emission spectrum at 510 nm was observed, and this light emission was light emission derived from the light emitting material T1. The driving voltage at 50 cd/m² was 5.9 [V].

<Example D30> Fabrication and Evaluation of Light Emitting Device D30

A light emitting device D30 was fabricated in the same manner as in Example D28 except that "light emitting material T3" was used instead of "light emitting material T1" in (Formation of first organic layer) in Example D28. By applying voltage to the light emitting device D30, EL emission having the maximum peak of the light emission spectrum at 510 nm was observed, and this light emission was light emission derived from the light emitting material T3. The driving voltage at 50 cd/m² was 3.8 [V].

<Example D31> Fabrication and Evaluation of Light Emitting Device D31

A light emitting device D31 was fabricated in the same manner as in Example D28 except that "light emitting material T3" was used instead of "light emitting material T1" in (Formation of first organic layer) in Example D28, and "the polymer compound HTL-5" was used instead of "the polymer compound HTL-4" in (Formation of second organic layer) in Example D28. By applying voltage to the light emitting device D31, EL emission having the maximum peak of the light emission spectrum at 510 nm was observed, and this light emission was light emission derived from the light emitting material T3. The driving voltage at 50 cd/m² was 4.3 [V].

<Example D32> Fabrication and Evaluation of
Light Emitting Device D32

A light emitting device D32 was fabricated in the same manner as in Example D28 except that "light emitting material T6" was used instead of "light emitting material T1" in (Formation of first organic layer) in Example D28. By applying voltage to the light emitting device D32, EL emission having the maximum peak of the light emission spectrum at 480 nm was observed, and this light emission was light emission derived from the light emitting material T6. The driving voltage at 50 cd/m$^2$ was 7.5 [V].

<Example D33> Fabrication and Evaluation of
Light Emitting Device D33

A light emitting device D33 was fabricated in the same manner as in Example D28 except that "light emitting material T6" was used instead of "light emitting material T1" in (Formation of first organic layer) in Example D28, and "the polymer compound HTL-2" was used instead of "the polymer compound HTL-4" in (Formation of second organic layer) in Example D28. By applying voltage to the light emitting device D33, EL emission having the maximum peak of the light emission spectrum at 480 nm was observed, and this light emission was light emission derived from the light emitting material T6. The driving voltage at 50 cd/m$^2$ was 7.0 [V].

<Example D34> Fabrication and Evaluation of
Light Emitting Device D34

A light emitting device D34 was fabricated in the same manner as in Example D28 except that "light emitting material T4" was used instead of "light emitting material T1" in (Formation of first organic layer) in Example D28, and "the polymer compound HTL-2" was used instead of "the polymer compound HTL-4" in (Formation of second organic layer) in Example D28. By applying voltage to the light emitting device D34, EL emission having the maximum peak of the light emission spectrum at 490 nm was observed, and this light emission was light emission derived from the light emitting material T4. The driving voltage at 50 cd/m$^2$ was 8.3 [V].

<Comparative Example CD10> Fabrication and
Evaluation of Light Emitting Device CD10

A light emitting device CD10 was fabricated in the same manner as in Example D28 except that "light emitting material TC1" was used instead of "light emitting material T1" in (Formation of first organic layer) in Example D28, and "the polymer compound HTL-2" was used instead of "the polymer compound HTL-4" in (Formation of second organic layer) in Example D28. By applying voltage to the light emitting device CD10, EL emission having the maximum peak of the light emission spectrum at 490 nm was observed, and this light emission was light emission derived from the light emitting material TC1. The driving voltage at 50 cd/m$^2$ was 11.0 [V].

TABLE 9

|  | light emitting device | second organic layer | first organic layer composition | composition ratio (% by mass) | driving voltage (V) (50 cd/m$^2$) |
| --- | --- | --- | --- | --- | --- |
| Example D28 | D28 | Crosslinked body of HTL-4 | HP-2/T1 | 85/15 | 5.0 |
| Example D29 | D29 | Crosslinked body of HTL-5 | HP-2/T1 | 85/15 | 5.9 |
| Example D30 | D30 | Crosslinked body of HTL-4 | HP-2/T3 | 85/15 | 3.8 |
| Example D31 | D31 | Crosslinked body of HTL-5 | HP-2/T3 | 85/15 | 4.3 |
| Example D32 | D32 | Crosslinked body of HTL-4 | HP-2/T6 | 85/15 | 7.5 |
| Example D33 | D33 | crosslinked body of HTL-2 | HP-2/T6 | 85/15 | 7.0 |
| Example D3 | D3 | crosslinked body of HTL-2 | HP-2/T1 | 85/15 | 6.5 |
| Example D34 | D34 | crosslinked body of HTL-2 | HP-2/T4 | 85/15 | 8.3 |
| Comparative Example CD10 | CD10 | crosslinked body of HTL-2 | HP-2/TC1 | 85/15 | 11.0 |

INDUSTRIAL APPLICABILITY

According to the present invention, it is possible to provide a light emitting device showing low driving voltage.

The invention claimed is:

1. A light emitting device having an anode, a cathode, a first organic layer disposed between the anode and the cathode and a second organic layer disposed between the anode and the cathode, wherein said first organic layer is a layer containing a light emitting material represented by the formula (T), said first organic layer is a layer not containing a phosphorescent metal complex, and said second organic layer is a layer containing a crosslinked body of a polymer compound containing a crosslink constitutional unit:

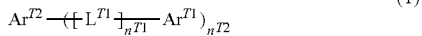 (T)

wherein, $n^{T1}$ represents an integer of 0 or more and 5 or less, when a plurality of $n^{T1}$ are present, they may be the same or different, $n^{T2}$ represents an integer of 1 or more and 10 or less, $Ar^{T1}$ is a single-ring or condensed-ring monovalent hetero ring group containing a nitrogen atom having no double bond as a ring constituent atom and not containing a nitrogen atom having a double bond as a ring constituent atom, and the group optionally has a substituent, when a plurality of such substituents are present, they may be combined together to form a ring together with atoms to which they are attached, when a plurality of $Ar^{T1}$ are present, they may be the same or different, $L^{T1}$ represents an alkylene group, a cycloalkylene group, an arylene group, a divalent hetero ring group, a group represented by —N($R^{T1'}$)—, an oxygen atom or a sulfur atom, and these groups optionally have a substituent, $R^{T1'}$ represents a hydrogen atom, an alkyl group, a cycloalkyl group, an aryl group or a monovalent hetero ring group, and these groups optionally have a substituent, when a plurality of $L^{T1}$ are present, they may be the same or different, $Ar^{T2}$ is a single-ring or condensed-ring hetero ring group containing a nitrogen atom having a double bond as a ring constituent atom, and the group optionally has a substituent, and when a plurality of such substituents are present, they may be combined together to form a ring together with atoms to which they are attached, wherein said crosslink constitutional unit is a constitutional unit having at least one crosslink group represented by formula (XL-17):

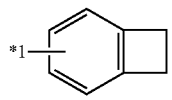 (XL-17)

wherein *1 represents a binding position, and this crosslink group optionally has a substituent.

2. The light emitting device according to claim 1, wherein said crosslink constitutional unit is a constitutional unit represented by the formula (2) or a constitutional unit represented by the formula (2'):

wherein said crosslink constitutional unit is a constitutional unit represented by the formula (2) or a constitutional unit represented by the formula (2'):

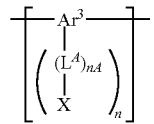 (2)

wherein, nA represents an integer of 0 to 5, and n represents 1 or 2, when a plurality of nA are present, they may be the same or different, $Ar^3$ represents an aromatic hydrocarbon group or a hetero ring group, and these groups optionally have a substituent, $L^A$ represents an alkylene group, a cycloalkylene group, an arylene group, a divalent hetero ring group, a group represented by —N(R')—, an oxygen atom or a sulfur atom, and these groups optionally have a substituent, R' represents a hydrogen atom, an alkyl group, a cycloalkyl group, an aryl group or a monovalent hetero ring group, and these groups optionally have a substituent, when a plurality of $L^A$ are present, they may be the same or different, X represents the crosslink group represented by the formula (XL-17),

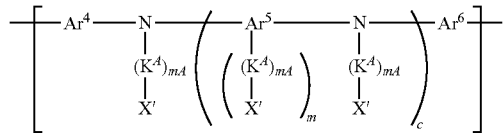 (2')

wherein, mA represents an integer of 0 to 5, m represents an integer of 1 to 4, and c represents an integer of 0 or 1, when a plurality of mA are present, they may be the same or different, $Ar^5$ represents an aromatic hydrocarbon group, a hetero ring group or a group in which at least one aromatic hydrocarbon ring and at least one hetero ring are bonded directly, and these groups optionally have a substituent, $Ar^4$ and $Ar^6$ each independently represent an arylene group or a divalent hetero ring group, and these groups optionally have a substituent, $Ar^4$, $Ar^5$ and $Ar^6$ each may be bonded directly or bonded via an oxygen atom or a sulfur atom to a group other than this group, bonded to a nitrogen atom to which the group is attached, to form a ring, $K^A$ represents an alkylene group, a cycloalkylene group, an arylene group, a divalent hetero ring group, a group represented by —N(R')—, an oxygen atom or a sulfur atom, and these groups optionally have a substituent, R' represents a hydrogen atom, an alkyl group, a cycloalkyl group, an aryl group or a monovalent hetero ring group, and these groups optionally have a substituent, when a plurality of $K^A$ are present, they may be the same or different, X' represents the crosslink group represented by the formula (XL-17), a hydrogen atom, an alkyl group, a cycloalkyl group, an aryl group or a monovalent hetero ring group, and these groups optionally have a substituent, when a plurality of X' are present, they may be the same or different, however, at least one X' is the crosslink group represented by the formula (XL-17).

3. The light emitting device according to claim 1, wherein said $Ar^{T1}$ is a group represented by the formula (T1-1):

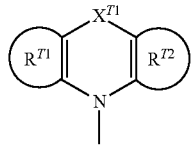

(T1-1)

wherein,
the ring $R^{T1}$ and the ring $R^{T2}$ each independently represent an aromatic hydrocarbon ring or a hetero ring not containing a nitrogen atom having a double bond as a ring constituent atom, and these rings optionally have a substituent, when a plurality of such substituents are present, they may be combined together to form a ring together with atoms to which they are attached, $X^{T1}$ represents a single bond, an oxygen atom, a sulfur atom, a group represented by —N($R^{XT1}$)— or a group represented by —C($R^{XT1'}$)$_2$—, $R^{XT1}$ and $R^{XT1'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent, a plurality of $R^{XT1'}$ may be the same or different and may be combined together to form a ring together with carbon atoms to which they are attached, $R^{XT1}$ and a substituent which the ring $R^{T1}$ optionally has, $R^{XT1}$ and a substituent which the ring $R^{T2}$ optionally has, $R^{XT1'}$ and a substituent which the ring $R^{T1}$ optionally has, and $R^{XT1'}$ and a substituent which the ring $R^{T2}$ optionally has each may be combined together to form a ring together with atoms to which they are attached.

4. The light emitting device according to claim 3, wherein said group represented by the formula (T1-1) is a group represented by the formula (T1-1A), a group represented by the formula (T1-1B), a group represented by the formula (T1-1C) or a group represented by the formula (T1-1D):

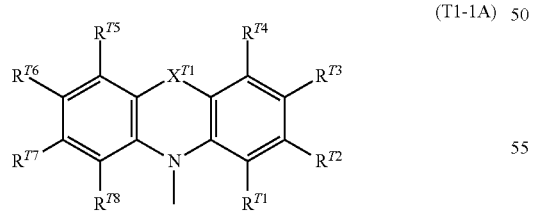

(T1-1A)

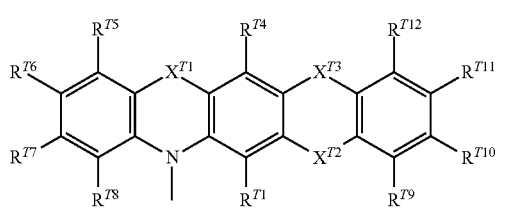

(T1-1B)

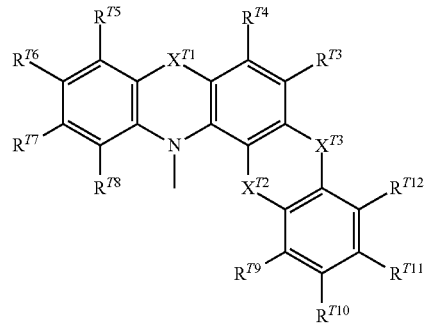

(T1-1C)

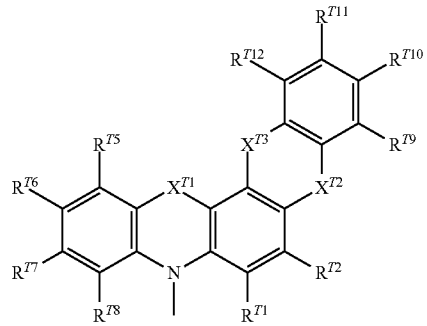

(T1-1D)

wherein,
$X^{T1}$ represents the same meaning as described above,
$X^{T2}$ and $X^{T3}$ each independently represent a single bond, an oxygen atom, a sulfur atom, a group represented by —N($R^{XT2}$)— or a group represented by —C($R^{XT2'}$)$_2$—, $R^{XT2}$ and $R^{XT2'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent, a plurality of $R^{XT2'}$ may be the same or different and may be combined together to form a ring together with carbon atoms to which they are attached, $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent, $R^{T1}$ and $R^{T2}$, $R^{T2}$ and $R^{T3}$, $R^{T3}$ and $R^{T4}$, $R^{T5}$ and $R^{T6}$, $R^{T6}$ and $R^{T7}$, $R^{T7}$ and $R^{T8}$, $R^{T9}$ and $R^{T10}$, $R^{T10}$ and $R^{T11}$, and $R^{T11}$ and $R^{T12}$ each may be combined togthether to form a ring together with carbon atoms to which they are attached.

5. The light emitting device according to claim 1, wherein said $Ar^{T2}$ is a group obtained by removing from a diazole ring, a triazole ring, an oxadiazole ring, a thiadiazole ring, a thiazole ring, an oxazole ring, an isothiazole ring, an isooxazole ring, a benzodiazole ring, a benzotriazole ring, a benzooxadiazole ring, a benzothiadiazole ring, a benzothiazole ring, a benzooxazole ring, an azacarbazole ring, a diazacarbazole ring, a pyridine ring, a diazabenzene ring, a triazine ring, an azanaphthalene ring, a diazanaphthalene ring, a triazanaphthalene ring, a tetraazanaphthalene ring, an azaanthracene ring, a diazaanthracene ring, a triazaanthracene ring, a tetraazaanthracene ring, an azaphenanthrene ring, a diazaphenanthrene ring, a triazaphenanthrene ring or a tetraazaphenanthrene ring at least one hydrogen atom bonding directly to a carbon atom or a hetero atom constituting the ring; the group having optionally a substituent.

6. The light emitting device according to claim 1, wherein the absolute value of the difference between the energy level at the lowest triplet excited state and the energy level at the lowest singlet excited state in said light emitting material represented by the formula (T) is 0.20 eV or less.

7. The light emitting device according to claim 1, wherein said first organic layer further contains at least one selected from the group consisting of a host material, a hole transporting material, a hole injection material, an electron transporting material, an electron injection material, a light emitting material and an antioxidant.

8. The light emitting device according to claim 1, wherein said first organic layer and said second organic layer are adjacent.

9. The light emitting device according to claim 1, wherein said second organic layer is a layer disposed between said anode and said first organic layer.

* * * * *